(12) United States Patent
Chen

(10) Patent No.: US 9,276,009 B2
(45) Date of Patent: Mar. 1, 2016

(54) NAND-CONNECTED STRING OF TRANSISTORS HAVING THE ELECTRICAL CHANNEL IN A DIRECTION PERPENDICULAR TO A SURFACE OF THE SUBSTRATE

(71) Applicant: MACRONIX INTERNATIONAL CO., LTD., Hsinchu (TW)

(72) Inventor: Shih-Hung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/716,722

(22) Filed: May 19, 2015

(65) Prior Publication Data

US 2015/0255468 A1 Sep. 10, 2015

Related U.S. Application Data

(60) Division of application No. 14/325,069, filed on Jul. 7, 2014, now Pat. No. 9,070,447, which is a continuation-in-part of application No. 14/038,526, filed on Sep. 26, 2013, now Pat. No. 8,970,040.

(51) Int. Cl.
*H01L 29/76* (2006.01)
*H01L 27/115* (2006.01)
(Continued)

(52) U.S. Cl.
CPC ...... *H01L 27/1157* (2013.01); *H01L 21/76805* (2013.01); *H01L 21/76816* (2013.01);
(Continued)

(58) Field of Classification Search
CPC .............. H01L 29/788; H01L 29/7841; H01L 27/10802; H01L 27/11517; H01L 29/42324; H01L 29/42328; H01L 29/66825
See application file for complete search history.

(56) References Cited

U.S. PATENT DOCUMENTS

| 5,218,471 A | 6/1993 | Swanson et al. |
|---|---|---|
| 6,034,882 A | 3/2000 | Johnson et al. |

(Continued)

FOREIGN PATENT DOCUMENTS

| EP | 1936681 A1 | 6/2008 |
|---|---|---|
| EP | 2048709 A2 | 4/2009 |

(Continued)

OTHER PUBLICATIONS

Chen et al., "A Highly Pitch Scalable 3D Vertical Gate (VG) NAND Flash Decoded by a Novel Self-Aligned Independently Controlled Double Gate (IDG) StringSelect Transistor (SSL)," 2012 Symp. on VLSI Technology (VLSIT), Jun. 12-14, 2012, pp. 91-92.

(Continued)

*Primary Examiner* — Hoai V Pham
(74) *Attorney, Agent, or Firm* — Haynes Beffel & Wolfeld LLP

(57) ABSTRACT

Vias are formed within a stack of alternating active and insulating layers by forming a first sub stack, a second sub stack over the first sub stack, a first buffer layer therebetween and a second buffer layer under the first sub stack. An upper layer of the first sub stack is exposed through a set of vias by first and second etching processes. The first etching process forms a first set of etch vias through the second sub stack and stops at or in the first buffer layer. The second etching process etches through the first buffer layer to the upper layer of the first sub stack. A third etching process etches through the first set of etch vias, through the first sub stack and stops at or in the second buffer layer. A fourth etching process and etches through the second buffer layer.

18 Claims, 61 Drawing Sheets

(51) Int. Cl.
*H01L 23/522* (2006.01)
*H01L 21/768* (2006.01)
*G11C 16/04* (2006.01)

(52) U.S. Cl.
CPC ...... *H01L23/5226* (2013.01); *H01L 27/11548* (2013.01); *H01L 27/11575* (2013.01); *H01L 27/11582* (2013.01); *G11C 16/0483* (2013.01); *H01L 2924/0002* (2013.01)

(56) References Cited

U.S. PATENT DOCUMENTS

| | | |
|---|---|---|
| 6,323,117 B1 | 11/2001 | Noguchi |
| 6,906,361 B2 | 6/2005 | Zhang |
| 6,906,940 B1 | 6/2005 | Lue |
| 7,018,783 B2 | 3/2006 | Iwasaki et al. |
| 7,081,377 B2 | 7/2006 | Cleeves |
| 7,129,538 B2 | 10/2006 | Lee et al. |
| 7,177,169 B2 | 2/2007 | Scheuerlein |
| 7,274,594 B2 | 9/2007 | Pascucci et al. |
| 7,315,474 B2 | 1/2008 | Lue |
| 7,382,647 B1 | 6/2008 | Gopalakrishnan |
| 7,420,242 B2 | 9/2008 | Lung |
| 7,696,559 B2 | 4/2010 | Arai et al. |
| 7,851,849 B2 | 12/2010 | Kiyotoshi |
| 7,855,457 B2 | 12/2010 | Mizukami et al. |
| 8,363,476 B2 | 1/2013 | Lue et al. |
| 8,383,512 B2 | 2/2013 | Chen et al. |
| 8,467,219 B2 | 6/2013 | Lue |
| 8,503,213 B2 | 8/2013 | Chen et al. |
| 8,541,882 B2 | 9/2013 | Chen et al. |
| 8,598,032 B2 | 12/2013 | Chen et al. |
| 8,633,099 B1 | 1/2014 | Shih et al. |
| 8,736,069 B2 | 5/2014 | Chiu et al. |
| 8,759,217 B1 | 6/2014 | Chen |
| 8,759,899 B1 | 6/2014 | Lue et al. |
| 8,836,137 B2 | 9/2014 | Chen |
| 9,070,447 B2 | 6/2015 | Chen |
| 2002/0106823 A1 | 8/2002 | Hwang et al. |
| 2003/0064295 A1 | 4/2003 | Yasuyuki et al. |
| 2004/0023499 A1 | 2/2004 | Hellig et al. |
| 2004/0188822 A1 | 9/2004 | Nara |
| 2005/0280061 A1 | 12/2005 | Lee |
| 2007/0045708 A1 | 3/2007 | Lung |
| 2007/0090434 A1 | 4/2007 | Davies et al. |
| 2007/0140001 A1 | 6/2007 | Motoi et al. |
| 2007/0231750 A1 | 10/2007 | Parikh |
| 2007/0252201 A1 | 11/2007 | Kito et al. |
| 2008/0073635 A1 | 3/2008 | Kiyotoshi et al. |
| 2008/0096327 A1 | 4/2008 | Lee et al. |
| 2008/0101109 A1 | 5/2008 | Haring-Bolivar et al. |
| 2008/0175032 A1 | 7/2008 | Tanaka et al. |
| 2008/0180994 A1 | 7/2008 | Katsumata et al. |
| 2008/0247230 A1 | 10/2008 | Lee et al. |
| 2008/0285350 A1 | 11/2008 | Yeh |
| 2009/0001530 A1 | 1/2009 | Goto |
| 2009/0032966 A1 | 2/2009 | Lee et al. |
| 2009/0097321 A1 | 4/2009 | Kim et al. |
| 2009/0184360 A1 | 7/2009 | Jin et al. |
| 2009/0310415 A1 | 12/2009 | Jin et al. |
| 2010/0007001 A1 | 1/2010 | Wang et al. |
| 2010/0054015 A1 | 3/2010 | Lee et al. |
| 2010/0109164 A1 | 5/2010 | Kang et al. |
| 2010/0133645 A1 | 6/2010 | Dunne |
| 2010/0182041 A1 | 7/2010 | Feng et al. |
| 2010/0225000 A1 | 9/2010 | Sugizaki et al. |
| 2010/0270593 A1 | 10/2010 | Lung et al. |
| 2011/0018051 A1 | 1/2011 | Kim et al. |
| 2011/0031630 A1 | 2/2011 | Hashimoto |
| 2011/0057321 A1 | 3/2011 | Wang et al. |
| 2011/0115010 A1 | 5/2011 | Shim et al. |
| 2011/0116309 A1 | 5/2011 | Lung |
| 2011/0235408 A1 | 9/2011 | Minemura et al. |
| 2012/0068241 A1 | 3/2012 | Sakuma et al. |
| 2012/0119283 A1 | 5/2012 | Lee et al. |
| 2012/0182806 A1 | 7/2012 | Chen et al. |
| 2013/0069118 A1* | 3/2013 | Mori ............... H01L 27/11582 257/202 |
| 2013/0082341 A1 | 4/2013 | Shimizu et al. |
| 2013/0341797 A1 | 12/2013 | Lim |
| 2014/0191388 A1 | 7/2014 | Chen |
| 2014/0264925 A1 | 9/2014 | Chen |

FOREIGN PATENT DOCUMENTS

| | | |
|---|---|---|
| EP | 2192612 A2 | 6/2010 |
| TW | 1308374 B | 4/2009 |
| TW | 201123266 A | 7/2011 |

OTHER PUBLICATIONS

Choi et al., "3D approaches for non-volatile memory", 2011 Symposium on VLSI Technology, Digest of Technical Papers, pp. 178-179, Jun. 14-16, 2011.

Choi et al., "Performance Breakthrough in Nor Flash Memory With Dopant-Segregated Schottky-Barrier (DSSB) SONOS Devices," Jun. 2009 Symposium on VLSI Technology Digest of Technical Papers, pp. 222-223.

Extended European Search Report for EP 12170759, dated Feb. 5, 2013, 12 pages.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hu J. et al., "Reducing Write Activities on Non-volatile Memories in Embedded CMPs via Data Migration and Recomputation," Proc. of the IEEE/ACM DAC, Jun. 13-18, 2010, pp. 350-355.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp.35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

(56) References Cited

OTHER PUBLICATIONS

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Nowak et al., "Intrinsic fluctuations in Vertical NAND flash memories," 2012 Symposium on VLSI Technology, Digest of Technical Papers, pp. 21-22, Jun. 12-14, 2012.

Paul et al., "Impact of a Process Variation on Nanowire and Nanotube Device Performance," IEEE Trans. on Electron Devices, vol. 54, No. 9, Sep. 2007, pp. 2369-2376.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

\* cited by examiner

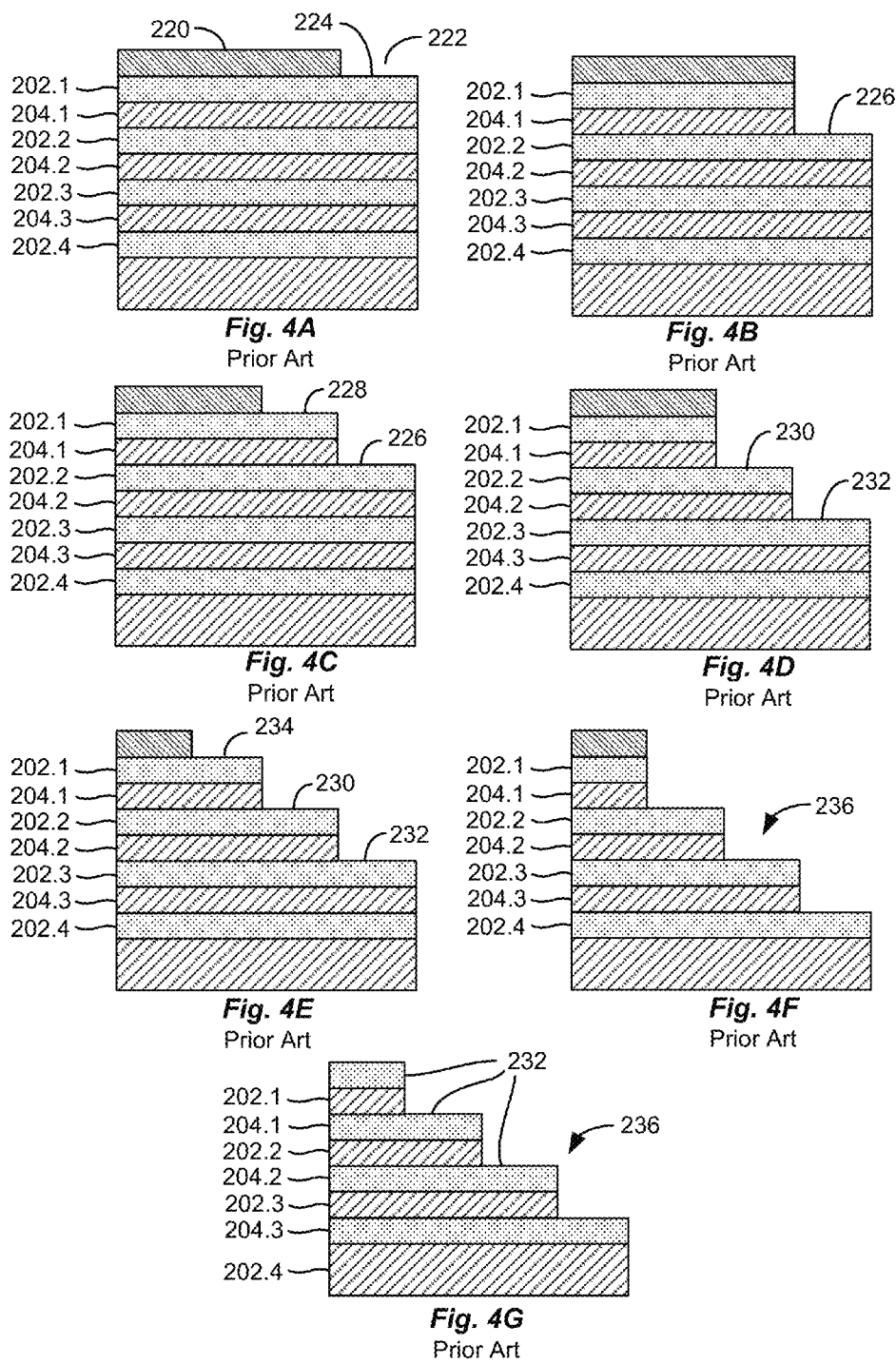

NAND-CONNECTED STRING OF TRANSISTORS HAVING THE ELECTRICAL CHANNEL IN A DIRECTION PERPENDICULAR TO A SURFACE OF THE SUBSTRATE

CROSS-REFERENCE TO OTHER APPLICATIONS

This application is a divisional of U.S. patent application Ser. No. 14/325,069, filed 7 Jul. 2014, now U.S. Pat. No. 9,070,447, entitled Contact Structure and Forming Method; which application is a continuation-in-part of Applicant's U.S. patent application Ser. No. 14/038,526, filed 26 Sep. 2013, now U.S. Pat. No. 8,970,040, also entitled Contact Structure and Forming Method.

BACKGROUND

The present invention relates to high density devices. In particular, embodiments of the present invention provide methods for forming contact structure in which conductors connected to multiple active layers in a three-dimensional high density semiconductor device, such as memory device.

Three dimensional (3D) semiconductor devices are characterized by multiple layers forming a stack of alternating active layers and insulating layers. In a memory device, each of the layers can include a planar array of memory cells. For certain three-dimensionally stacked memory devices, active layers can comprise active strips of materials configured as bit lines or word lines for memory cells stacked in spaced-apart ridge-like structures. The active layers can be made from a doped (p-type or n-type) or undoped semiconductor material. In such 3D memory, memory cells can be disposed at the cross-points of the stacked bit lines or word lines and the crossing word lines or bit lines, forming a 3D memory array.

One way of connecting interlayer conductors to the active layers in the stack can be referred to as a multiple lithographic-etch process, disclosed in commonly owned U.S. Pat. No. 8,383,512, entitled Method for Making Multilayer Connection Structure, the disclosure of which is incorporated by reference. Another way of doing so, which can be referred to as a trim-etch process, is disclosed in commonly owned U.S. patent application Ser. No. 13/735,922, filed 7 Jan. 2013, entitled Method for Forming Interlayer Conductors to a Stack of Conductor Layers, the disclosure of which is incorporated by reference.

SUMMARY

A method for forming vias within a stack of layers can be carried out as follows. A stack of alternating active layers and insulating layers are formed by forming first and second sub stacks and first and second buffer layers. The first sub stack comprises N active layers separated by insulating layers. The second sub stack is formed over the first sub stack and comprises M active layers separated by insulating layers. The first buffer layer is formed between the first and second sub stacks and the second buffer layer is formed under the first sub stack. An upper layer of the first sub stack is exposed through a set of vias by first and second etching processes. The first etching process forms a first set of etch vias through the second sub stack and stops at or in the first buffer layer. The second etching process etches through the first buffer layer to the upper layer of the first sub stack. Etching through the first sub stack is carried out by third and fourth etching processes. The third etching process etches through the first set of etch vias through the first sub stack and stops at or in the second buffer layer. And then the fourth etching process etches through the second buffer layer.

The method for forming vias can include one or more the following. A stairstep structure of landing areas on the active layers of the first sub stack and the second sub stack can be created by etching through the vias, and interlayer conductors can be formed to extend to the landing areas. The etching to create a stairstep structure can use a single etching process to create landing areas on an integer multiple of N layers, the integer multiple being at least 2. The first buffer layer can have an etching time greater than the etching time of an insulating layer of the second sub stack for their respective second and first etching processes. The first buffer layer (1) can be made of the same material as the insulating layers of the first sub stack but have a different thickness than an insulating layer of the first sub stack, or (2) can have a different material composition than the insulating layers of the first sub stack, or (3), both (1) and (2). The first buffer layer can have a thickness at least 1.5 times greater than the thickness of an active layer in the first sub stack. The first sub stack can be characterized by a first spatial period N1, and the second sub stack is characterized by a second spatial period N2, where N1 is equal to N2. An etch mask can be created over the second sub stack, the etch mask having etch mask openings, and upper layer exposing step can be carried out through the etch mask openings. The first and second sub stack forming steps can be carried out so that the upper layer of each is thicker than at least one of the active and insulating layers of the corresponding sub stack.

A stairstep contact structure includes a stack of alternating active layers and insulating layers having non-simple spatial periods, a stairstep structure of landing areas on the active layers, and interlayer conductors extending to the landing areas, the interlayer conductors separated from one another by insulating material. The stack of alternating active layers and insulating layers comprises first and second sub stacks and a buffer layer between the first and second sub stacks. The first sub stack has N active layers separated by insulating layers, the N active layers comprising an upper boundary active layer. The second sub stack is over the first sub stack and has M active layers separated by insulating layers, the M active layers comprising an upper boundary active layer. The first buffer layer has an etching time greater than the etching time of an insulating layer of the second sub stack for a given etching process.

The stairstep contact structure can include one or more the following. The first buffer layer (1) can be made of the same material as an insulating layer of the first sub stack but have a different thickness, or (2) can have a different material composition than an insulating layer of the first sub stack, or (3) both (1) and (2). The stack can include a third sub stack, with a second buffer layer between the second and third sub stacks, and second buffer layer can have an etching time greater than the etching time of an insulating layer of the third sub stack for the given etching process. The upper boundary layer of each of the first and second sub stacks can be thicker than at least one of the active and insulating layers of the corresponding sub stack.

A first example of a circuit comprises a substrate and a NAND-connected string of transistors on the substrate. The NAND-connected string of transistors includes first plurality of nonvolatile memory cells having a first gate length, and a second plurality of nonvolatile memory cells having a second gate length greater than the first gate length. An electrical channel through the NAND-connected string has an orientation perpendicular to the substrate. In some examples, the first example of a circuit can include one or more the following.

The first example of the circuit can include one or more the following. Circuitry can control the NAND-connected string, the circuitry applying different pass voltages to the plurality of nonvolatile memory cells and the plurality of transistors. The circuit can include circuitry controlling the NAND-connected string, wherein the first gate length is less than 1 micron and the second gate length is greater than 1 micron. The NAND-connected string can comprise a GSL transistor and an SSL transistor.

A second example of a circuit comprises a substrate, a plurality of stacks of semiconductor strips on the substrate, and a plurality of word lines. The semiconductor strips in the plurality of stacks include at least a first semiconductor strip having a first height and a second semiconductor strip having a second height, the first height and the second height being different. The plurality of word lines are arranged orthogonally over, and have surfaces conformal with, the plurality of stacks, such that a 3D array of memory elements is established at cross-points between surfaces of the plurality of stacks and the plurality of word lines, and such that a plurality of NAND-connected strings of transistors are formed along the semiconductor strips in the plurality of stacks. The NAND-connected strings of transistors include a first NAND-connected string of nonvolatile memory cells having the first height, and a second NAND-connected string of nonvolatile memory cells having the second height.

The second example of the circuit can include one or more the following. The different first height and the second height can result in a first set of electrical characteristics for the NAND-connected strings in the first semiconductor strip having the first height, and a second set of electrical characteristics for the NAND-connected strings in the second semiconductor strip having the second height, the first and second sets of electrical characteristics being different. The circuit can include first and second sense amplifiers and circuitry controlling the first sense amplifier to take electrical measurements according to the first set of electrical characteristics and the second sense amplifier to take electrical measurements according to the second set of electrical characteristics. The circuit can also include circuitry performing memory operations on the plurality of NAND-connected strings of transistors to store first data on the first NAND-connected string, and to use the second NAND-connected string to correct at least one error in the first data.

Other aspects and advantages of the technology are described with reference to the drawing in the detailed description and claims which follow.

BRIEF DESCRIPTION OF THE DRAWINGS

FIGS. 4A, 4B, 4C, 4D, 4E, 4F and 4G are simplified views of the process steps performed for an example of a trim-etch process when the stack has a simple period.

FIG. 7 shows a stack of active and insulating layers.

FIG. 8 shows the structure of FIG. 7 with a first etch mask.

FIG. 9 shows the structure of FIG. 8 after etching.

FIG. 10 shows the structure of FIG. 9 after removal of the first etch mask.

FIG. 11 shows the structure of FIG. 10 with a second etch mask.

FIG. 12 shows the structure of FIG. 11 after etching.

FIG. 13 shows the structure of FIG. 12 after removal of the second etch mask.

FIG. 14 shows the structure of FIG. 13 with a third etch mask.

FIG. 15 shows the structure of FIG. 14 after etching.

FIG. 16 shows the structure of FIG. 15 after removal of the third etch mask.

FIG. 17 shows the structure of FIG. 16 with a fourth etch mask.

FIG. 18 shows the structure of FIG. 17 after etching.

FIG. 19 shows the structure of FIG. 18 after removal of the fourth etch mask.

FIG. 20 shows the structure of FIG. 19 with a fifth etch mask.

FIG. 21 shows the structure of FIG. 20 after etching.

FIG. 22 shows the structure of FIG. 21 after removal of the fifth etch mask and showing vias formed in the stack.

FIG. 23 shows the structure of FIG. 22 after deposition of an insulating layer.

FIG. 24 shows the structure of FIG. 23 after removal of portions of the insulating layer leaving sidewall insulation within the vias.

FIG. 25 shows the structure of FIG. 24 with interconnect conductors creating the contact structure of FIG. 6.

FIG. 26 shows a stack of alternating active and insulating layers with a first etch mask.

FIG. 27 shows the structure of FIG. 26 after etching.

FIG. 28 shows the structure of FIG. 27 after replacing the first etch mask with a second etch mask.

FIG. 29 shows the structure of FIG. 28 after etching.

FIG. 30 shows the structure of FIG. 29 after removal of the second etch mask.

FIG. 31 shows the structure of FIG. 30 with a third etch mask.

FIG. 32 shows the structure of FIG. 31 after etching.

FIG. 33 shows the structure of FIG. 32 after a first trimming the third etch mask.

FIG. 34 shows the structure of FIG. 33 after etching.

FIG. 35 show the structure of FIG. 34 after a second trimming of the third etch mask.

FIG. 36 shows the structure of FIG. 35 after etching.

FIG. 37 shows the structure of FIG. 36 after removal of the trimmed third etch mask.

FIG. 38 shows the structure of FIG. 37 after depositing an insulating/stopping layer.

FIG. 39 shows the structure of FIG. 38 after depositing an insulating material.

FIG. 40 shows the structure of FIG. 38 with a fourth etch mask.

FIG. 41 shows the structure of FIG. 40 after etching.

FIG. 42 shows the structure of FIG. 41 after removal of the fourth etch mask and showing the vias formed in the structure.

FIG. 43 shows the structure of FIG. 42 with interlayer conductors within the vias.

FIG. 48 illustrates how etching through openings in an etch mask can result in etched openings having different depths.

FIG. 49 shows the result of an over etch process on the structure of FIG. 48 so that the etch openings extend completely through the active layer but also part way at different depths into the underlying insulating layer.

FIG. 50 illustrates an example of the consequence of the lack of uniformity of the layers and/or the etching processes resulting in etched openings extending to different layers instead of the same layer.

FIG. 51 shows a stack of active and insulating layers with an etch mask over an upper insulating layer similar to the structure shown in FIG. 8.

FIG. 52 shows the structure of FIG. 51 after etching through the first, uppermost sub stack and partially into the first, uppermost buffer layer.

FIG. 53 shows the structure of FIG. 52 after etching through the first buffer layer.

FIG. 54 shows the structure of FIG. 53 after etching through the second sub stack and partially into the second buffer layer.

FIG. 55 shows the structure of FIG. 54 after etching through the second buffer layer.

FIG. 56 shows a structure of FIG. 55 after etching through the third sub stack and partially into the third buffer layer.

FIG. 57 shows a structure of FIG. 56 after etching through the third buffer layer.

FIG. 58 shows the structure of FIG. 57 after etching through the fourth, lowermost sub stack and partially into the fourth, lowermost buffer layer.

FIG. 59 shows the structure of FIG. 58 after etching through the fourth, lowermost buffer layer.

FIG. 60 illustrates structure similar to that of FIG. 16 in which etched openings have been formed through the stack to the active, upper boundary layer of each sub stack in preparation for the accessing the active layers of each of the sub stacks to create, for example, a stairstep structure of landing areas on the active layers of the sub stacks such as described in FIGS. 17-25.

FIG. 61 is a view similar to that of FIG. 52 but in which an upper boundary layer adjacent to an overlying buffer layer is made thicker than in the example of FIG. 52 to enlarge the processing window.

FIG. 62 shows the structure of FIG. 61 after etching through the overlying buffer layer with the etched openings passing completely through the overlying buffer layer and into the upper boundary layer, the extra thickness of the upper boundary layer accommodating such over etching thus enlarging the processing window.

FIG. 63 is a flowchart of an example of a method for forming a stairstep contact structure.

DETAILED DESCRIPTION

Figure 1:
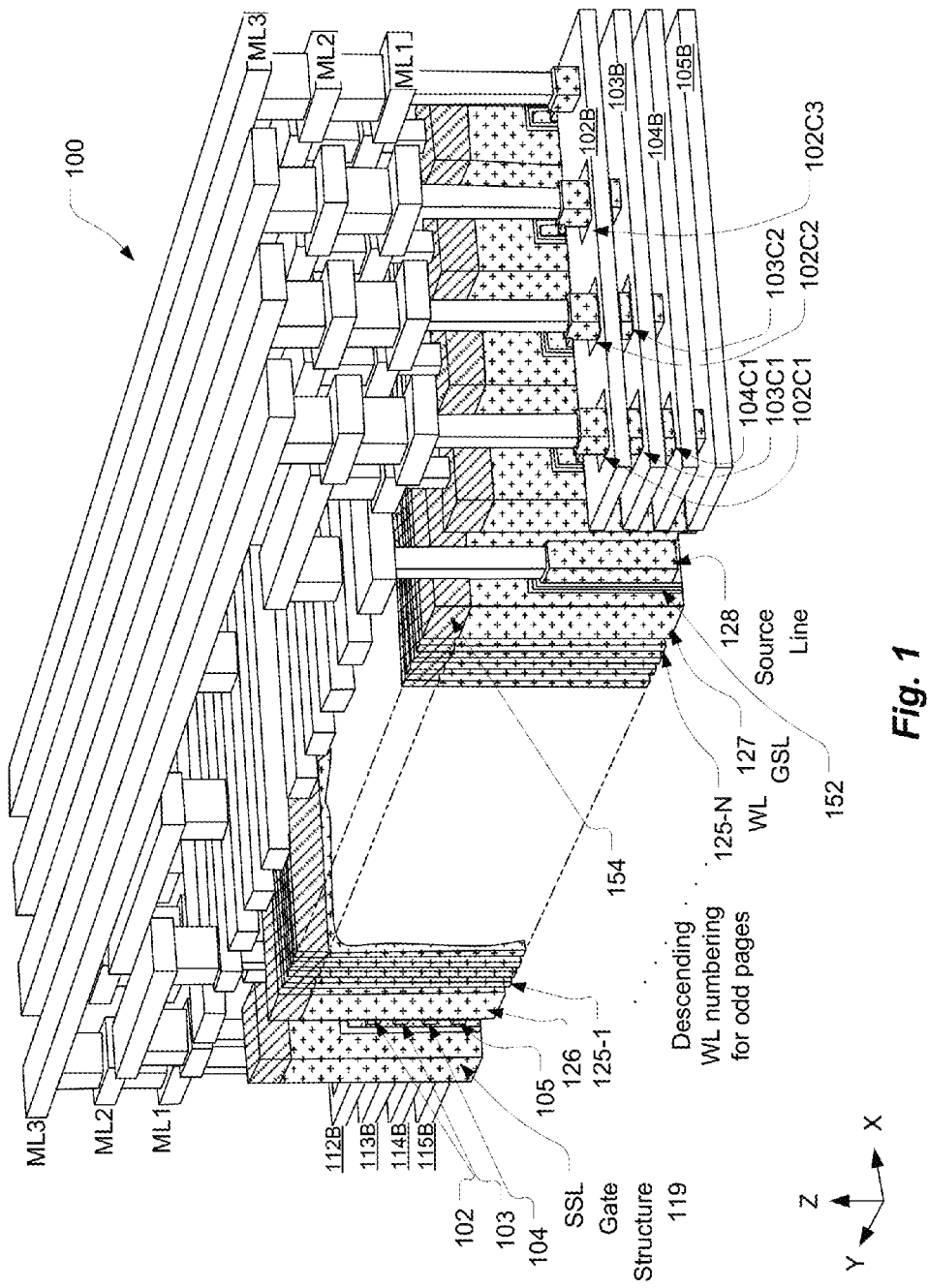
FIG. 1 is a perspective drawing of a semiconductor device including semiconductor pads for interlayer conductors.

A detailed description of various embodiments is described with reference to the figures. The following description will typically be with reference to specific structural embodiments and methods. It is to be understood that there is no intention to limit the invention to the specifically disclosed embodiments and methods, but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Unless otherwise stated, in this application, specified relationships, such as parallel to, aligned with, having uniform characteristics, or in the same plane as, mean that the specified relationships are within limitations of manufacturing processes and within manufacturing variations. When components are described as being coupled, connected, being in contact or contacting one another, they need not be physically directly touching one another unless specifically described as such. Like elements in various embodiments are commonly referred to with like reference numerals.

FIG. 1 is a perspective view of an example of a 3D semiconductor device (for example, a memory device) 100 as described in commonly owned U.S. Patent Publication No. 2012/0182806, filed Apr. 1, 2011, entitled Memory Architecture of 3D Array With Alternating Memory String Orientation and String Select Structures. Various insulating materials are formed but not shown to better illustrate active layers, including semiconductor strips and semiconductor pads for connecting to interlayer conductors, and others. 3D semiconductor device 100 is formed overlying a substrate (not shown) having an insulating layer (not shown) formed thereon. The substrate can include one or more integrated circuits and other structures. Four semiconductor pads 102B, 103B, 104B, and 105B on a proximal end of a stack of active layers and four semiconductor pads 112B, 113B, 114B, and 115B on a distal end of the stack, are shown, but the number of active layers and the corresponding semiconductor pads can be extended to any number of layers N, where N is an integer having a value greater than one. As shown, the 3D semiconductor device 100 includes stacks of active strips (e.g. 102, 103, 104, 105) separated by insulating material. Semiconductor pads (e.g. 102B, 103B, 104B, and 105B) terminate the strips in corresponding active layers. As illustrated, the semiconductor pads 102B, 103B, 104B, and 105B are electrically coupled to the active layers for connection to decoding circuitry to select layers within the array. Semiconductor pads 102B, 103B, 104B, and 105B can be patterned concurrently as the active layers are patterned, with the possible exception of vias for the interlayer conductors. Each of the active strips includes a semiconductor material suitable to act as a channel region in the illustrated embodiment. The strips are ridge-shaped extending on the Y-axis as illustrated, so that the active strips 102, 103, 104, 105 can be configured as bodies including channel regions of flash memory cell strings, for example, in horizontal NAND string configurations. As illustrated, a layer 152 of memory material coats the plurality of stacks of active strips in this example, and at least on the side walls of the active strips in other examples. In other embodiments, the active strips can be configured as word lines for vertical NAND string configurations. See, for example, commonly owned U.S. Pat. No. 8,363,476, filed 19 Jan. 2011, entitled Memory Device, Manufacturing Method and Operating Method of the Same.

Each stack of active strips is terminated at one end by semiconductor pads and the other end by a source line. Therefore, active strips 102, 103, 104, 105 terminate on the proximal end by semiconductor pads 102B, 103B, 104B, and 105B and a source line terminal 119 on the distal end of the strips passing through gate select line 127. Active strips 112, 113, 114, 115 terminate on the distal end by semiconductor pads 112B, 113B, 114B, and 115B and a source line terminal (for example, source line 128) passing through gate select line 126 near the proximal end of the strips.

In the embodiment of FIG. 1, a plurality of conductors 125-1 through 125-N is arranged orthogonally over the plurality of stacks of active strips. The conductors 125-1 through 125-N, have surfaces conformal with the plurality of stacks of active strips, within the trenches defined by the plurality of stacks, and defining a multilayer array of interface regions at cross-points between side surfaces of the active strips 102, 103, 104, 105 on the stacks and conductors 125-1 through 125-N (for example, word lines or source select lines). As shown, a layer of silicide (e.g. tungsten silicide, cobalt silicide, titanium silicide or nickel silicide) 154 can be formed over the top surfaces of conductors (for example, word lines or source select lines).

Depending upon the implementation, layer 152 of memory material can comprise multilayer dielectric charge storage structures. For example, a multilayer dielectric charge storage structure includes a tunneling layer comprising a silicon oxide, a charge trapping layer comprising a silicon nitride, and a blocking layer comprising a silicon oxide. In some examples, the tunneling layer in the dielectric charge storage layer can comprise a first layer of silicon oxide less than about 2 nanometers thick, a layer of silicon nitride less than about 3 nanometers thick and a second layer of silicon oxide less than about 3 nanometers thick. In other implementations, layer 152 of memory material can comprise only a charge trapping layer without the tunneling layer or the blocking layer.

In the alternative, an anti-fuse material such as a silicon dioxide, silicon oxynitride or other silicon oxides, for example, having a thickness on the order of 1 to 5 nanometers, can be utilized. Other anti-fuse materials may be used, such as silicon nitride. For anti-fuse embodiments, active strips 102, 103, 104, 105 can be a semiconductor material with a first conductivity type (e.g. p-type). Conductors (for example, word lines or source select lines) 125-N can be a semiconductor material with a second conductivity type (e.g. n-type). For example, the active strips 102, 103, 104, 105 can be made using p-type polysilicon while the conductors 125-N can be made using relatively heavily doped n+-type polysilicon. For anti-fuse embodiments, the width of the active strips should be enough to provide room for a depletion region to support the diode operation. As a result, memory cells comprising a rectifier formed by the p-n junction with a programmable anti-fuse layer in between the anode and cathode are formed in the 3D array of cross-points between the polysilicon strips and conductor lines.

In other embodiments, different programmable resistance memory materials can be used as the memory material, including metal oxides like tungsten oxide on tungsten or doped metal oxide, and others. Some of such materials can form devices that can be programmed and erased at multiple voltages or currents, and can be implemented for operations for storing multiple bits per cell.

As can be seen in FIG. 1, the semiconductor pads 102B, 103B, 104B, and 105B are coupled on one side to active strips in the corresponding layer of the device, such as by being formed of a continuous patterned layer of semiconductor. In some embodiments, the pad can be coupled on two sides to active strips in the corresponding layer. In other embodiments, the pads can be connected to the active strips using other materials and structures that allow for electrical communication of the voltages and currents needed for operation of the device. Also, an overlying insulator layer (not shown) and semiconductor pads 102B, 103B, 104B, 105B, except the lowermost pad, include openings 102C1, 102C2, 102C3, 103C1, 103C2, 104C1, that expose landing areas on underlying pads forming a stairstep structure in this example.

One way of connecting interlayer conductors to the active layers in the stack can be referred to as a multiple lithographic-etch process, disclosed in commonly owned U.S. Pat. No. 8,383,512, entitled Method for Making Multilayer Connection Structure, the disclosure of which is incorporated by reference. Another way of doing so, which can be referred to as a trim-etch process, is disclosed in commonly owned U.S. patent application Ser. No. 13/735,922, filed 7 Jan. 2013, entitled Method for Forming Interlayer Conductors to a Stack of Conductor Layers, the disclosure of which is incorporated by reference.

Figure 2A:
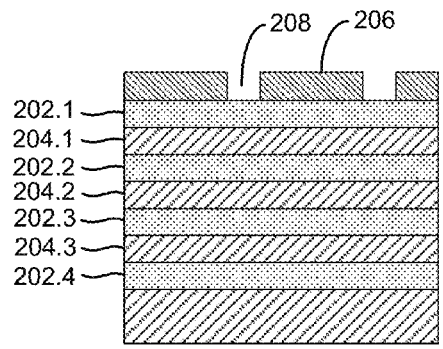
FIGS. 2A, 2B, 2C, 2D, 2E and 2F are simplified views of the process steps performed for an example of a multiple lithographic-etch process when the stack has a simple period.
Figure 2B:
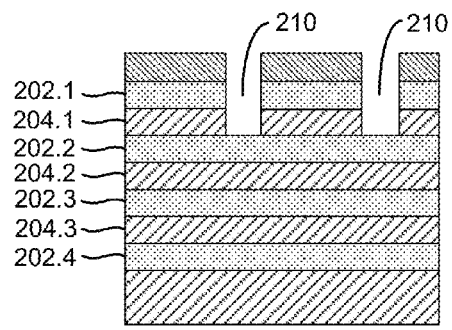
Figure 2C:
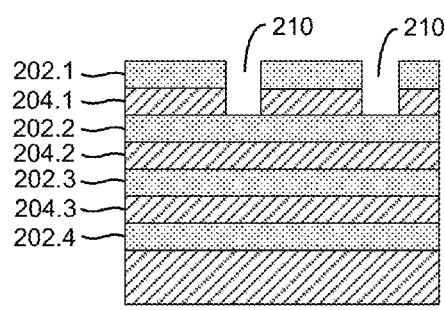
Figure 2D:
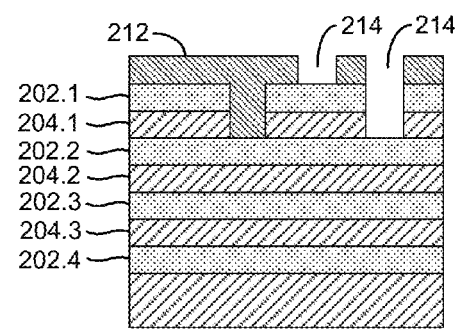
Figure 2E:
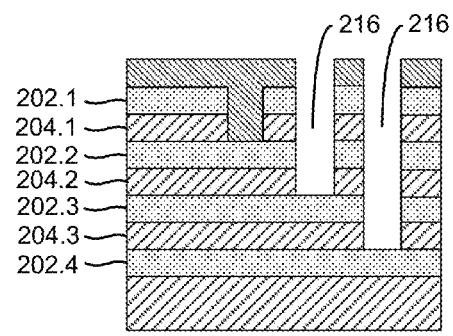
Figure 2F:
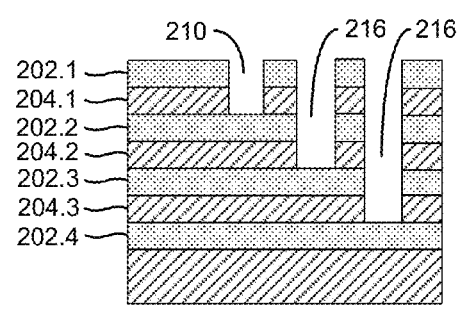
Figure 3A:
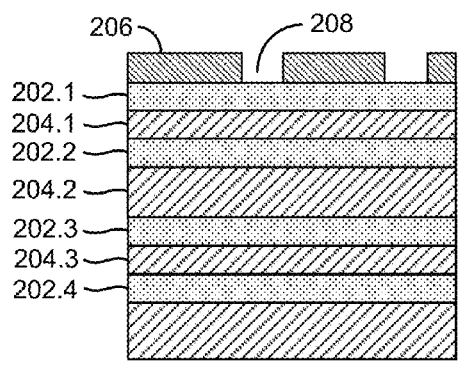
FIGS. 3A, 3B, 3C, 3D and 3E are simplified views a multiple lithographic-etch process when the stack has a non-simple period illustrating etching depth problems created during the process.
Figure 3B:
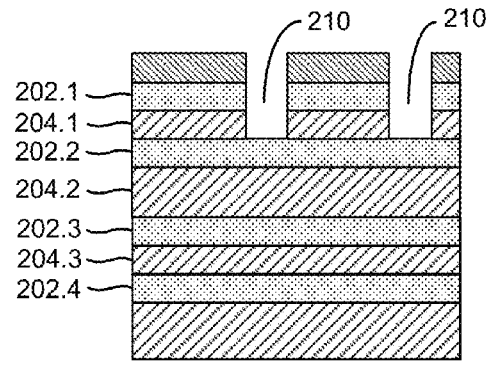
Figure 3C:
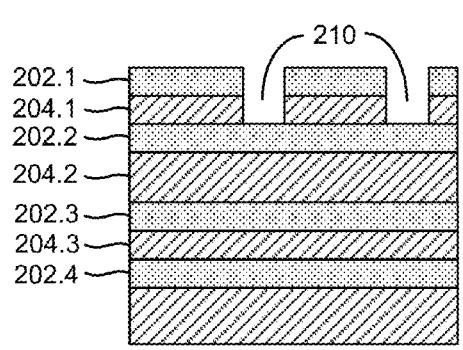
Figure 3D:
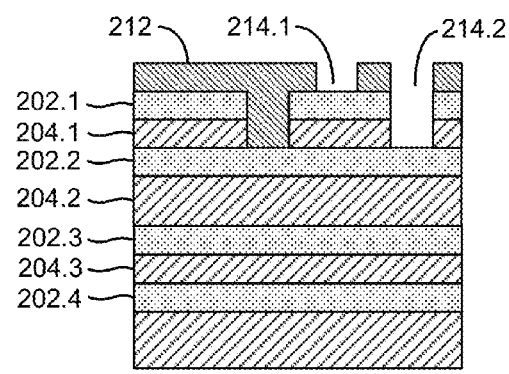
Figure 3E:
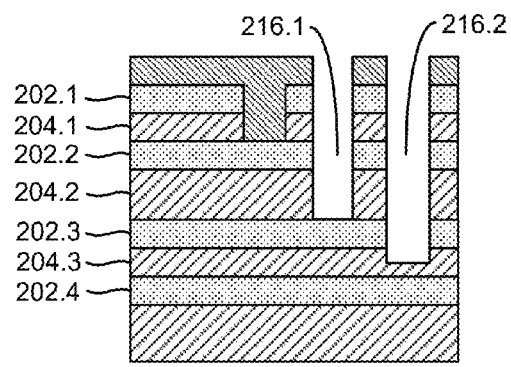

FIGS. 2A-2F illustrate a simplified example of a multiple lithographic-etch process used to make a contact structure. FIG. 2A shows a stack 200 of alternating active layers 202 and insulating layers 204 with a first etch mask 206 formed on the uppermost active layer 202.1. First etch mask 206 has first etch masks openings 208. Active layers 202 can be made of different types of conductive materials such as doped semiconductors, metals and combinations thereof. FIG. 2B shows the structure of FIG. 2A after etching through one level, that is one active layer 202 and one insulating layer 204. This first etching takes place at the first etch mask openings 208 to create first etch openings 210. After stripping of first etch mask 206, see FIG. 2C, a second etch mask 212 is formed over the stack 200, see FIG. 2D. Second etch mask to 12 has second etch mask openings 214, one being aligned with a first etch masks opening 208 and the other not. Next, as shown in FIG. 2E, a second etching takes place through two levels. The result is formation of vias and extending to the second, third and fourth active layers 202.2, 202.3 and 202.4 with the first active layer 202.1 being exposed by the removal of second etch mask 212 as illustrated in FIG. 2F.

Stack 200 is made of active layers 202 having common etching characteristics and insulating layers 204 having common etching characteristics. In this example, active layers 202 are made of the same conductive material and have the same nominal thickness. Likewise, insulating layers 204 are made of the same insulating material with the same nominal thickness. Therefore each pair of insulating layer and active layer will have a uniform etch time for a given etch process. This arrangement of the pairs of insulating and active layers can be referred to as stacked layers with a simple period.

FIGS. 3A-3D illustrate an example similar to that of FIGS. 2A-2F in which the stacked layers do not have a simple period. In this case, the third insulating layer 204.3 is thicker than either of insulating layers 204.1 or 204.2 above it. Therefore, the time it would take to etch through first, upper boundary active layer 202.1, first insulating layer 204.1, second active layer 202.4 and second insulating layer 204.2 at second etch masks opening 214.1 would only be sufficient to etch part way through third insulating layer 204.3 at second etch masks opening 214.2.

As described herein, structures are provided that have non-simple periods, in which the active and/or insulating layers have different etch times, typically because the active and/or insulating layers are made of different materials with different etching characteristics, or different thicknesses, or a combination of different materials and different thicknesses for the active and/or insulating layers.

FIGS. 4A-4G illustrate a simplified example of a trim-etch process. An etch mask 220 is formed on the uppermost active layer 202.1 with an etch masks opening 222 exposing a portion 224 of the uppermost active layer. A first etching step etches through active layer 202.1 and insulating layer 204.1 to expose a portion 226 of active layer 202.2 as shown in FIG. 4B. Next, during a first trim step, a portion of etch mask 220 is removed to expose another portion 228 of active layer 202.1. The next etching step, shown in FIG. 4D, etches through one active layer 202 and one insulating layer 204 to expose a portion 230 of active layer 202.2 and a portion 232 of active layer 202.3. Next, during a second trim step, see FIG. 4E, a portion of etch mask 220 is removed exposing a portion 234 of active layer 202.1. This is followed by another etch step, see FIG. 4F, through one active layer and one insulating layer at each of portions 234, 230 and 232 to create the structure of FIG. 4F. FIG. 4G shows the structure of FIG. 4F after stripping the remainder of etch mask 220 to create a stairstep structure 236 having a number of landing areas 238 at the different active layers 202.1-202.4 for connection with interlayer conductors.

Figure 5A:
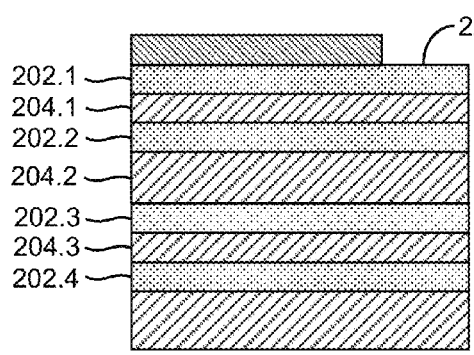
FIGS. 5A, 5B, 5C and 5D are simplified views of a trim-etch process when the stack has the non-simple period illustrating etching depth problems created during the process.
Figure 5B:
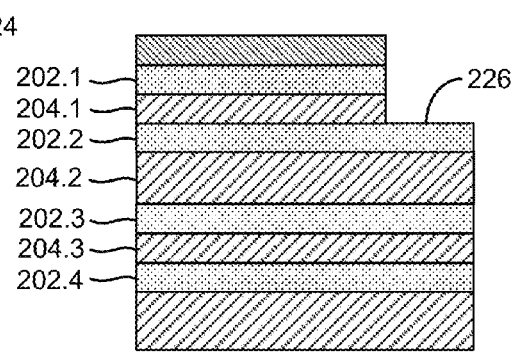
Figure 5C:
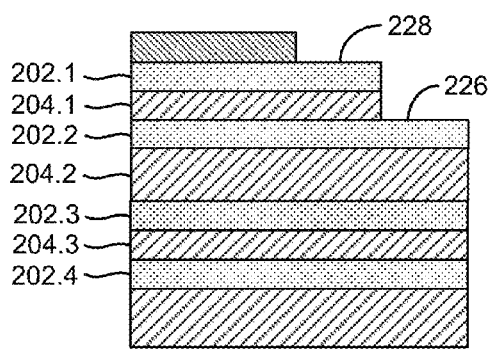
Figure 5D:
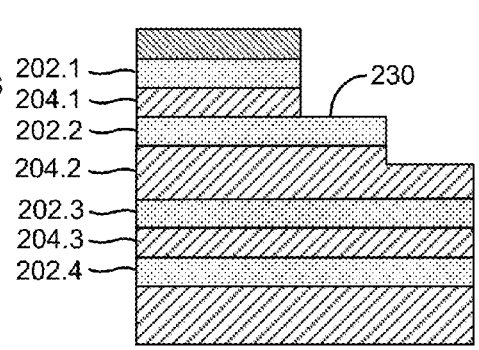

FIGS. 5A-5D illustrate an example similar to that of FIGS. 4A-4G in which the stacked layers do not have a simple period. In this example, the second insulating layer 204.2 is much thicker than either of insulating layers below or above it. During the etching step of FIG. 5D, which corresponds to the etching step of FIG. 4D, etching is sufficient to etch portion 228 of active layer 202.1 and is the portion of underlying insulating layer 204.1 to expose portion 230 of active layer 202.2. However, as illustrated in FIG. 5D, such etching is only sufficient to etch part way through the second insulating layer 204.2 because it is greater thickness takes longer to etch through. Therefore, unlike FIG. 4D, the third active layer 202.3 is not exposed by the second etching step. However, continuing the second etching step to etch through second insulating layer 204.2 until third active layer 202.3 is exposed can damage or destroy expose portion 230 of active layer 202.2.

Figure 6:
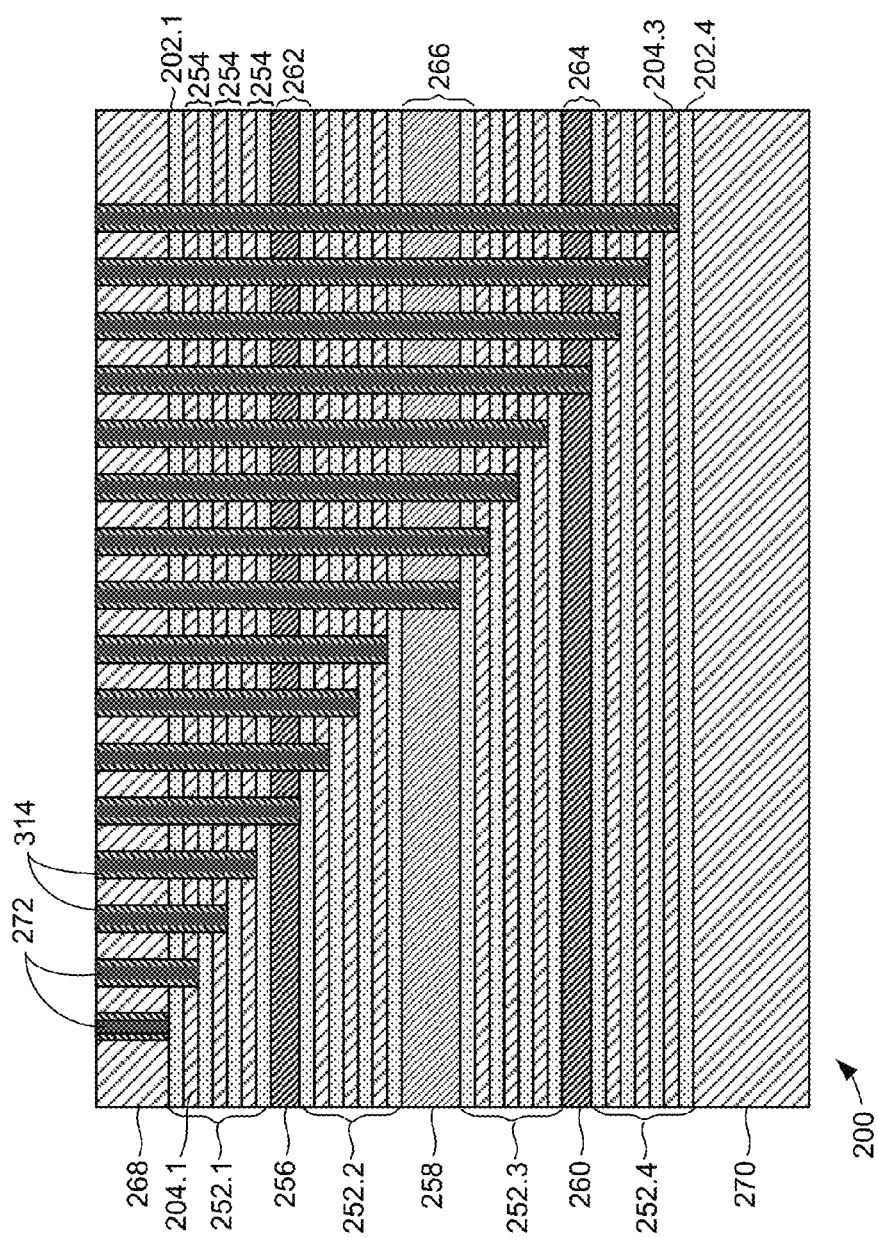
FIG. 6 is an example of a contact structure including a stack of alternating active and insulating layers which do not have a simple period.

With that as a background, an example of a contact structure 250 in which the stack of active and insulating layers do not have a simple period is shown in FIG. 6. Contact structure 250 includes a stack 200 of alternating active layers 202 and insulating layers 204. Stack 200 also includes sub stacks 252 having upper boundary active layers 202.1. The sub stacks 252 also include the first layer pairs 254 of insulating and active layers 202, 204 below each upper boundary active layer 202.1. In the example of FIG. 6, there are four sub stacks 252 labeled 252.1 through 252.4. Pairs 254 of insulating and active layers 202, 204 have uniform, first etch times for a given etch process. Stack 200 also includes sub stack insulating layers 256, 258 and 260 between the sub stacks 252. In this example, the composition of insulating layers 256, 258 and 260 is the same, typically silicon dioxide SiO2 while the composition of sub stack insulating layer 258 is different, such as silicon nitride SiN. Thickness and composition of sub stack insulating layers 256 and 260 are substantially the same so that each has substantially the same etching characteristics. However, the thickness of insulating layers 256 and 260 is greater than the thickness of insulating layers 204 so that the time to etch through insulating layers 256 and 260 is greater than the time it takes to etch through an insulating layer 204 for a given etch process.

Sub stack insulating layer 256 and the underlying, adjacent active layer 202.1 constitute a second layer pair 262 having a second etch time for the given etch process. Sub stack insulating layer 260 and the underlying, adjacent active layer 202.1 constitute a third layer pair 264, also having the second etch time for the given etch process. Sub stack insulating layer 258 and the underlying, adjacent active layer 202.1 constitute a fourth layer pair 266 having a fourth etch time different from any of the first through third etch times. Etch times for the different layer pairs 254, 262, 264, 266 can be made the same or different using a wide range of different materials having different etch rates together with the same or different thickness of the insulating and active layers.

Contact structure 250 also includes an upper insulating layer 268 overlying active layer 202.1 of stack 252.1 and a lower insulating layer 270 underlying active layer 202.4 of sub stack 252.4; both can made of silicon dioxide. A set of interlayer conductors 272 extend through upper insulating layer 268 to make contact with each active layer 202 of each sub stack 252 in a stairstep fashion. Each interlayer conductor 272 is surrounded by sidewall insulation 274, which can be made of silicon nitride.

FIGS. 7-25 will be discussed showing one example of steps for making the contact structure 250 of FIG. 6 using a multi-lithographic etching process, such as discussed with regard to FIGS. 2A-2F.

Figure 7:
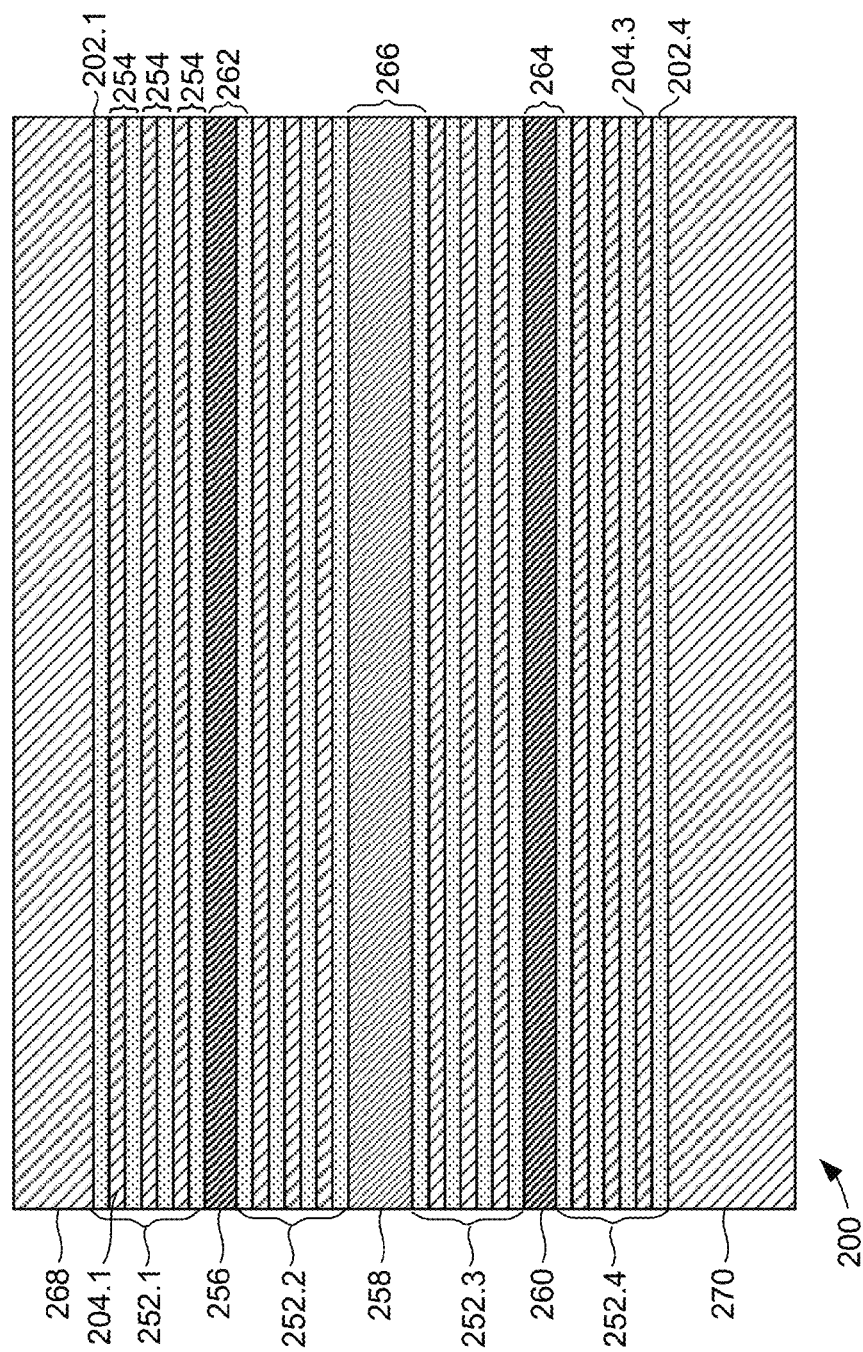
FIGS. 7-25 show an example for making the contact structure of FIG. 6 using a multi-lithographic etching process.
Figure 8:
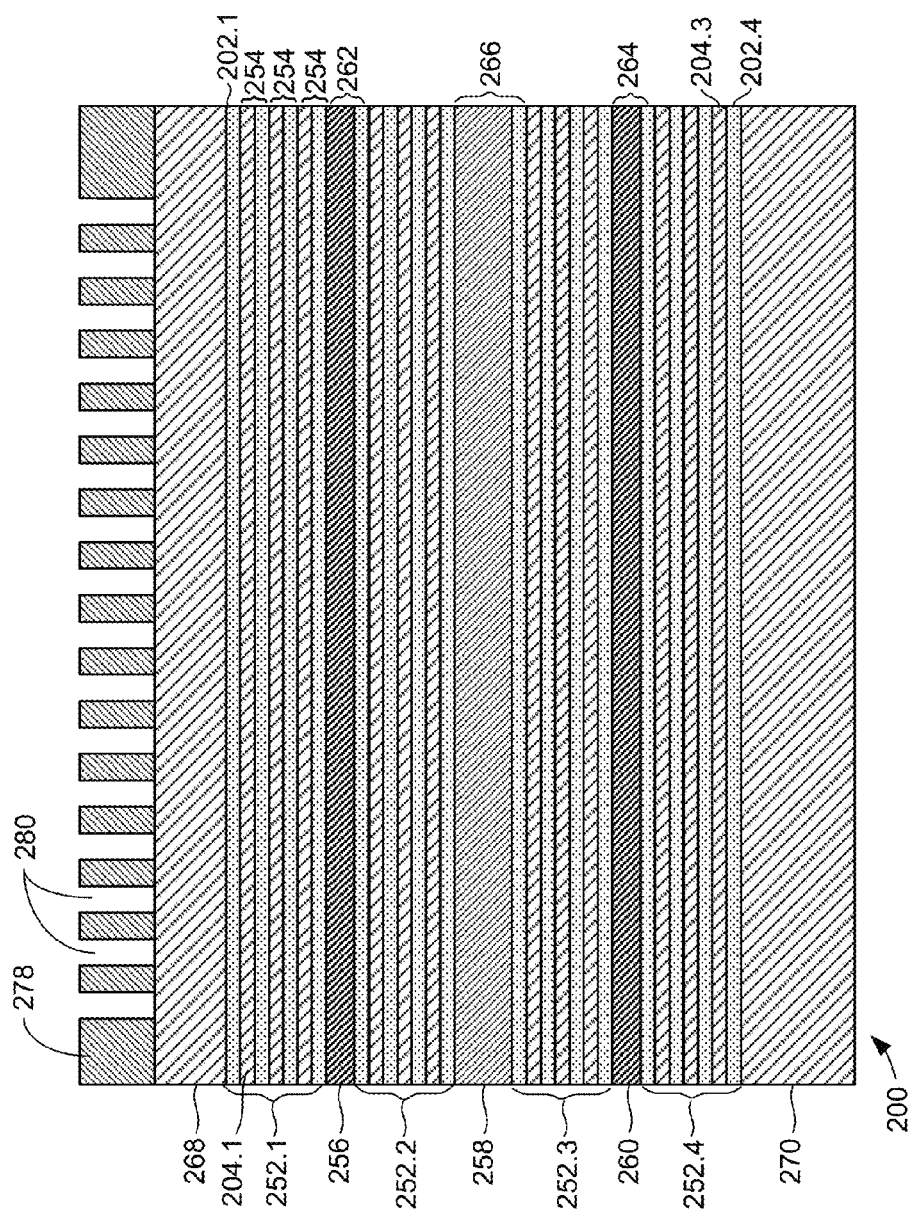
Figure 9:
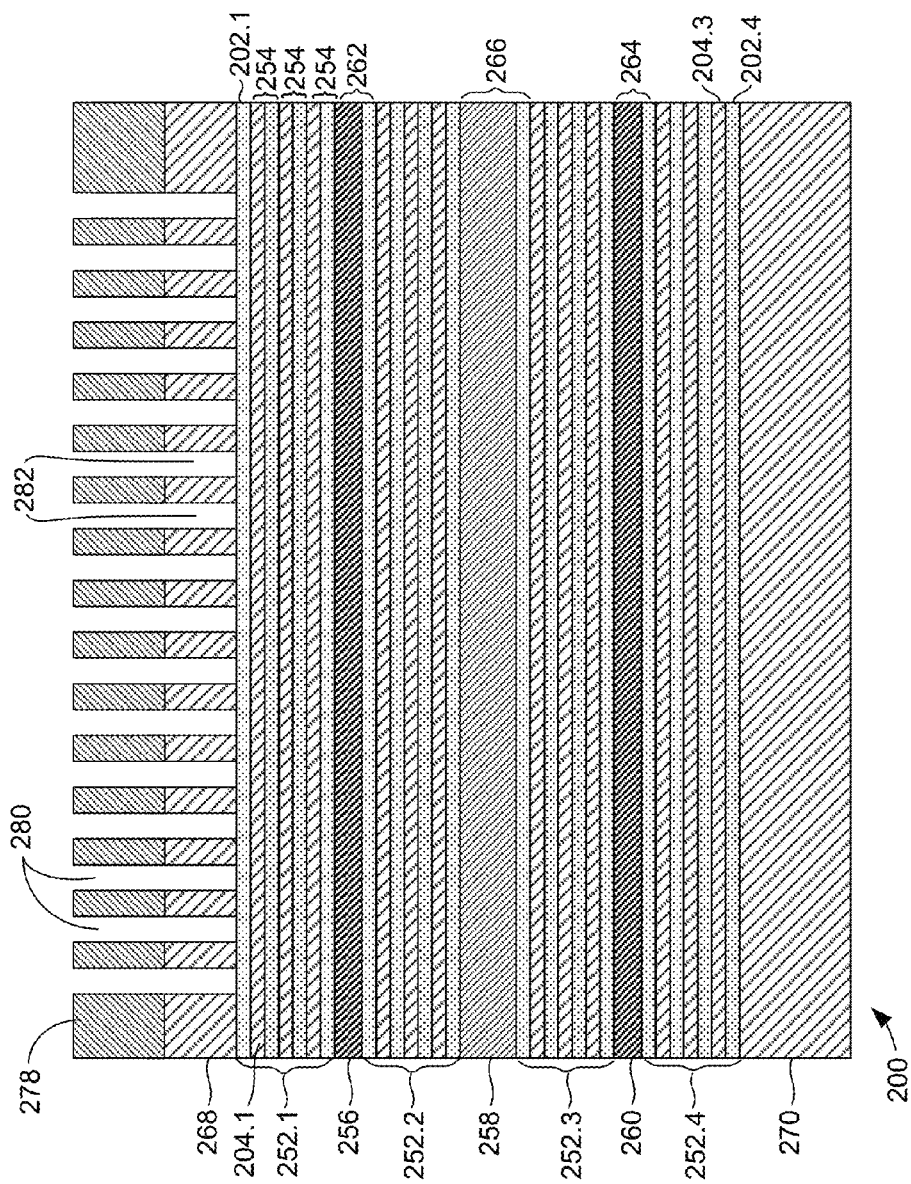
Figure 10:
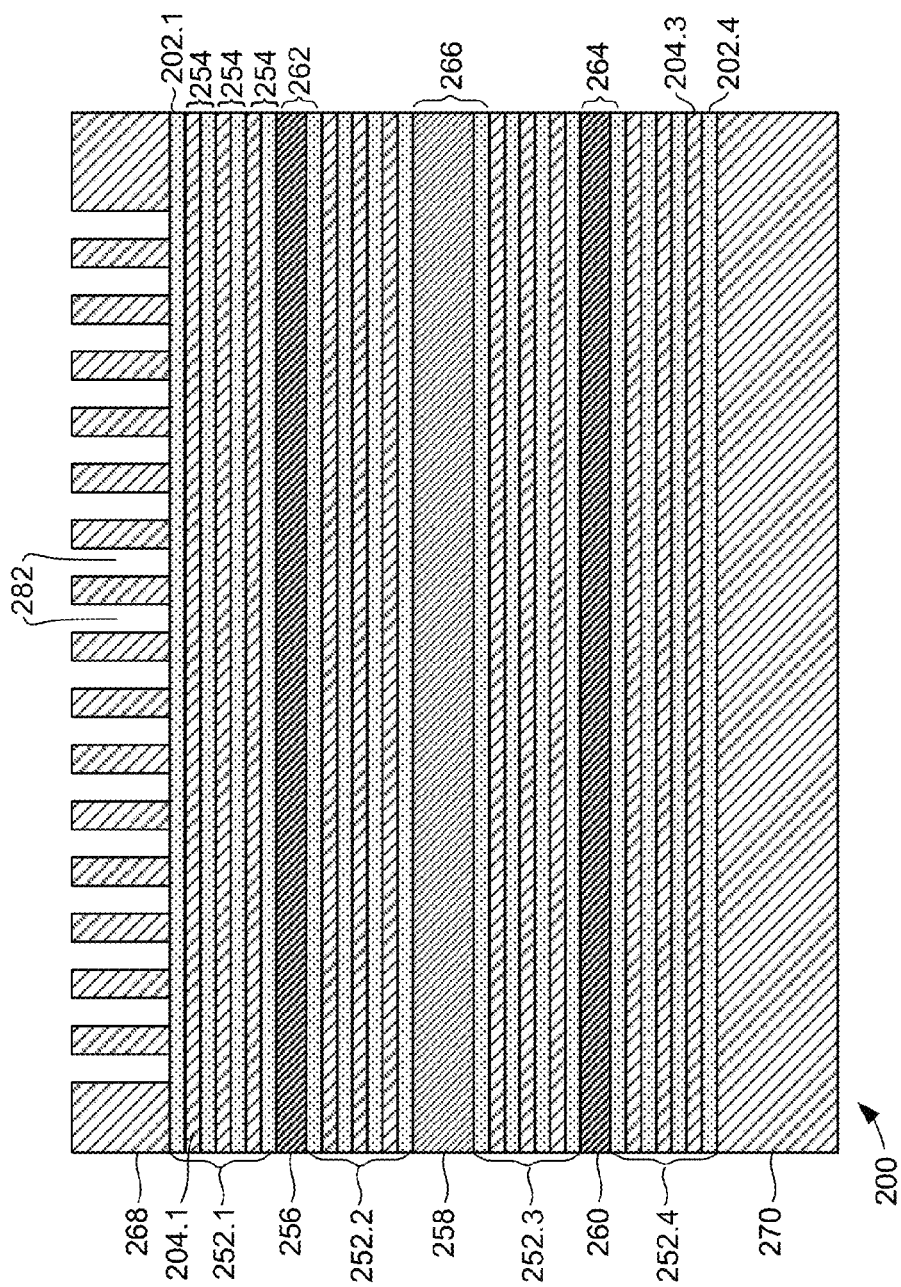

FIG. 7 shows stack 200 including sub stacks 252.1-252.4 between upper insulating layer 268 and lower insulating layer 270, the sub stacks separated by sub stack insulating layers 256, 258, 260. FIG. 8 shows the structure of FIG. 7 with a first etch mask 278 with first etch mask openings 280 formed therein. FIG. 9 shows a result of etching the structure of FIG. 8 at openings 280 through upper insulating layer 268 to create first etched openings 282 within layer 268 down to the upper boundary active layer 202.1 of sub stack 252.1. FIG. 10 shows the structure of FIG. 9 after first etch mask 278 has been stripped.

Figure 11:
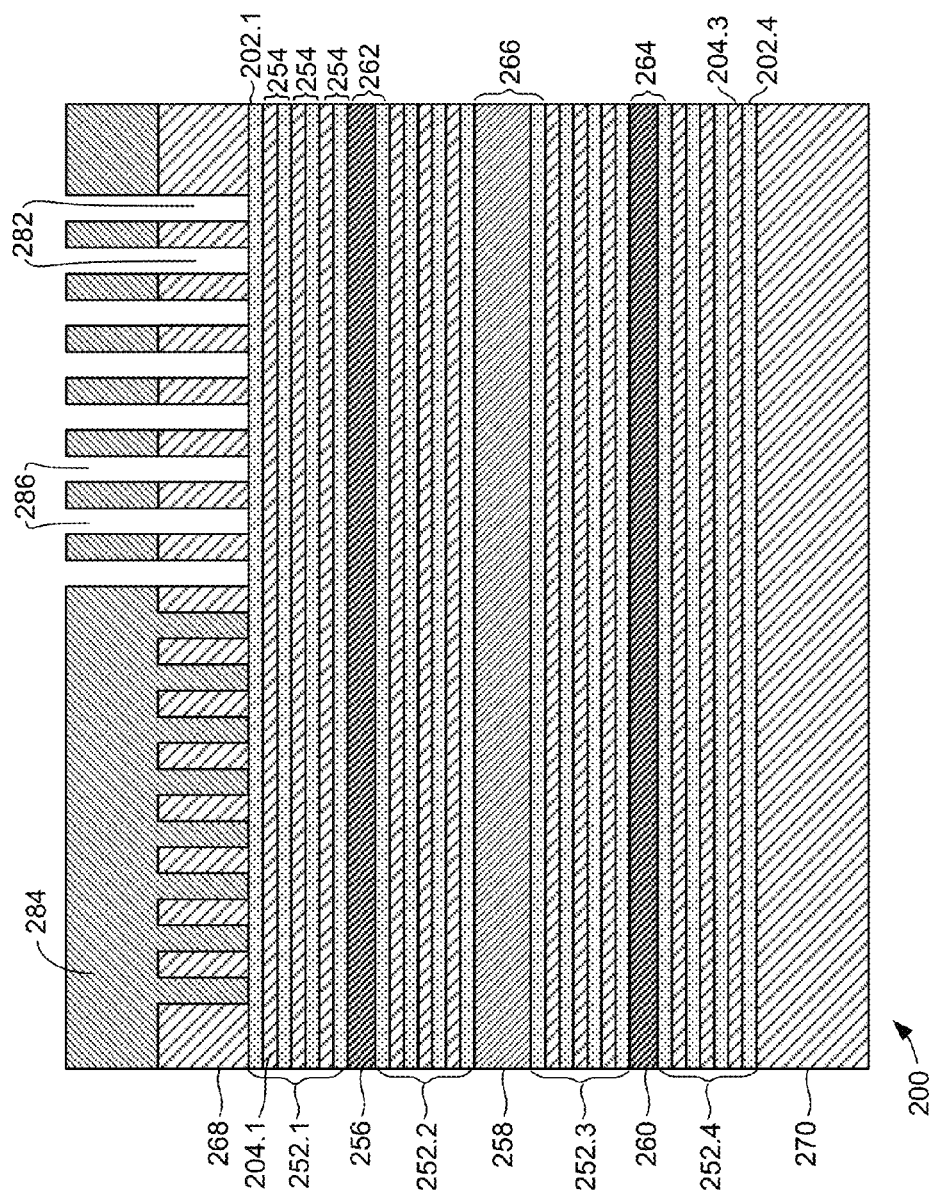
Figure 12:
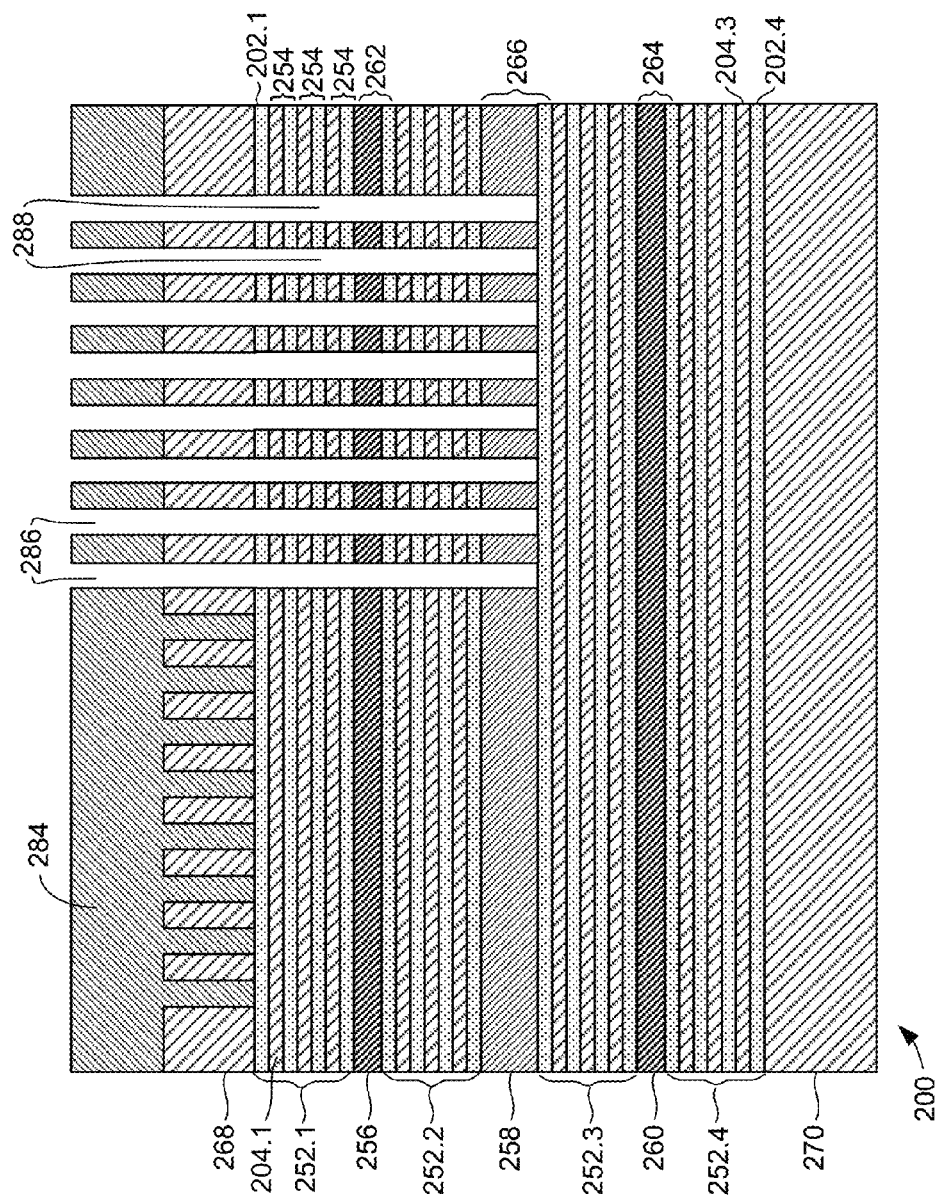
Figure 13:
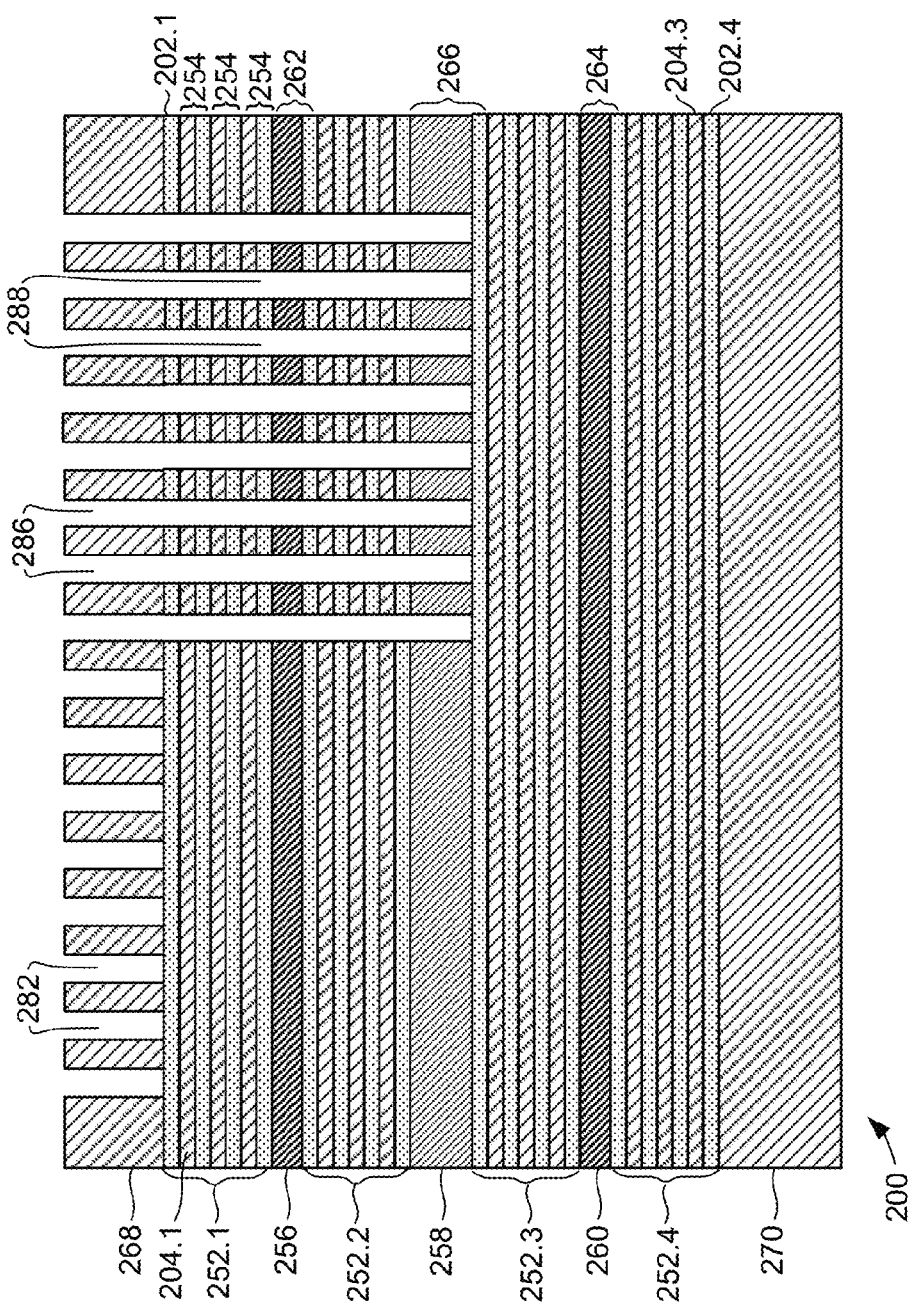

FIG. 11 shows the structure of FIG. 10 after forming a second etch mask 284 covering half of the first etched openings 282 and having second etch mask openings 286 aligned with the other half of etched openings 282. In FIG. 12, the structure of FIG. 11 is etched through openings 286 to create second etched openings 288 down to an upper boundary active layer 202.1 of sub stack 252.3. In FIG. 13, second etch mask 284 has been stripped exposing first etched openings 282.

Figure 14:
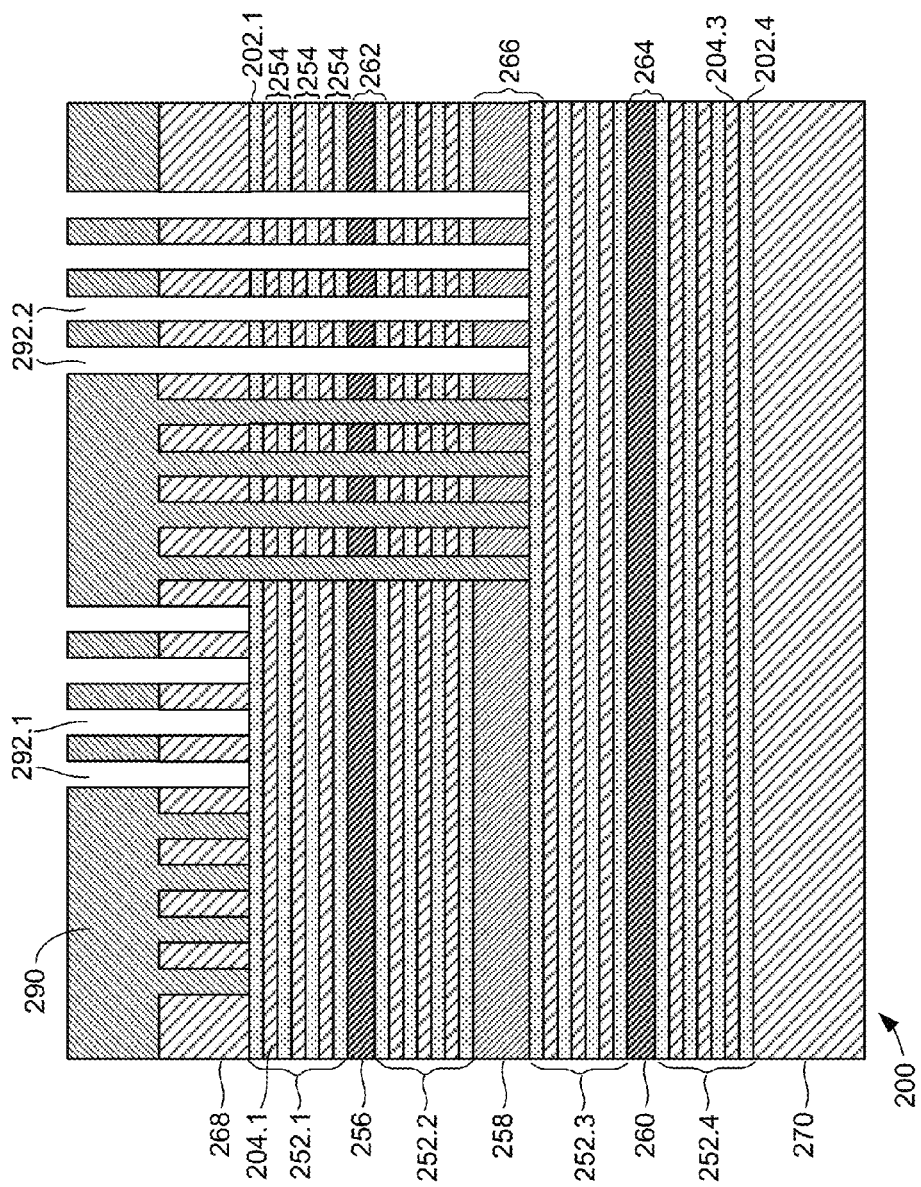
Figure 15:
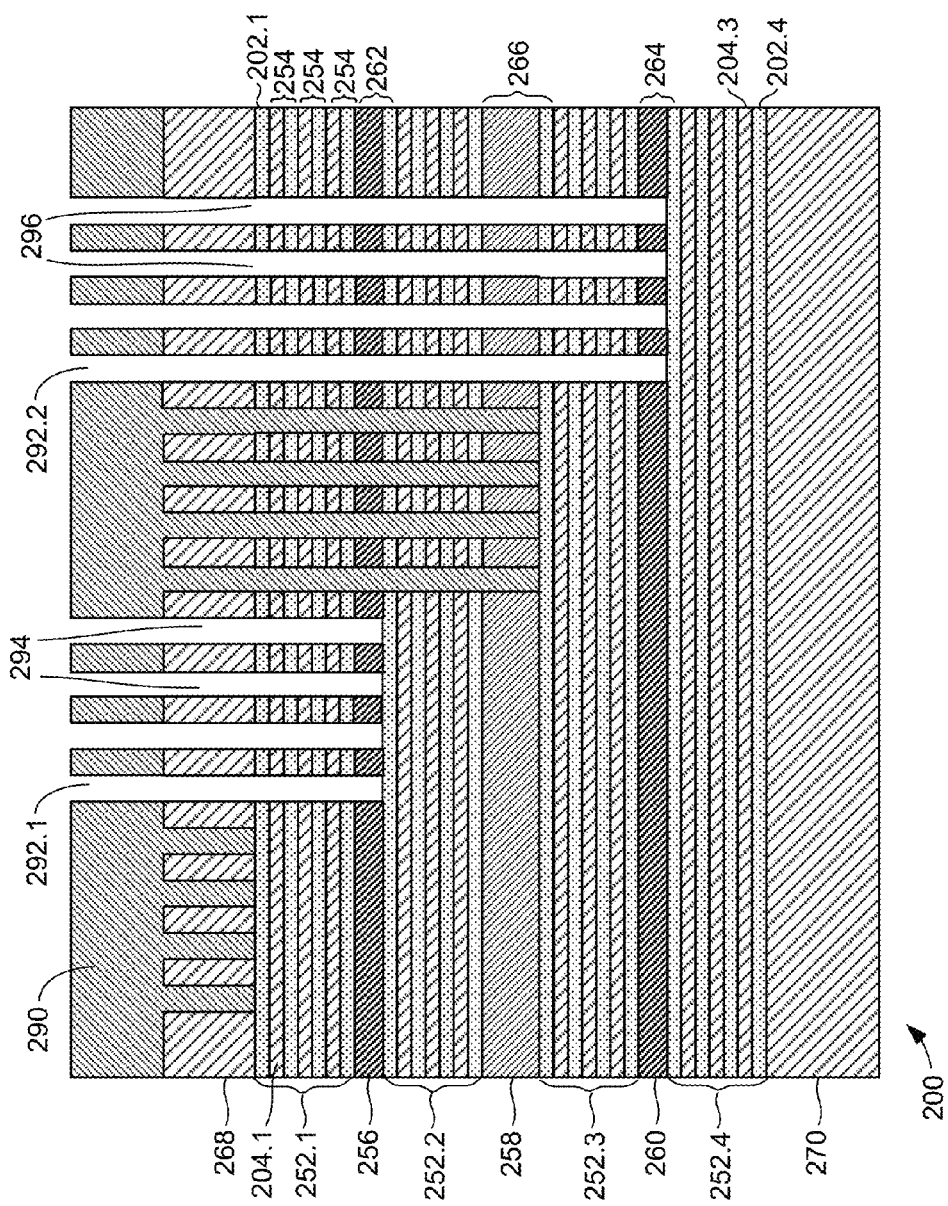
Figure 16:
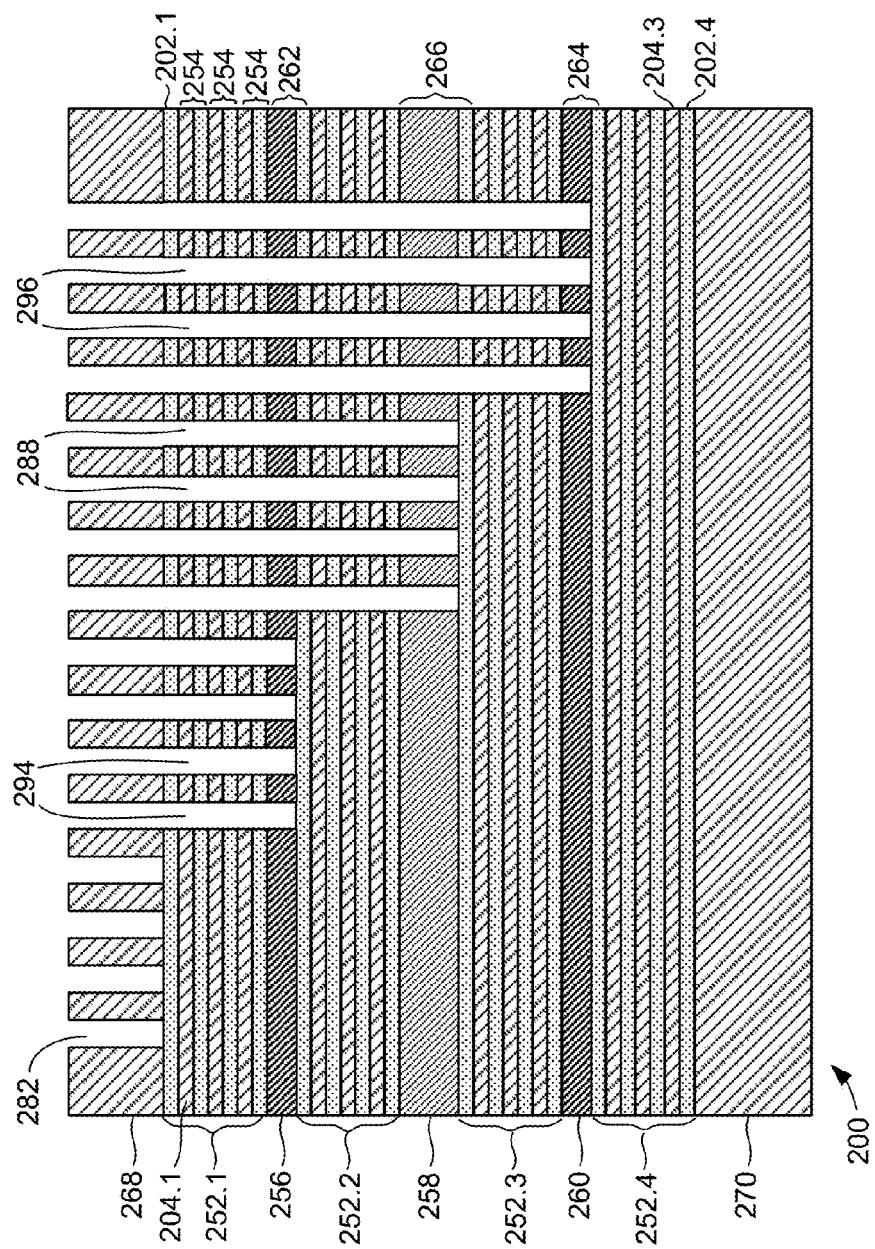

FIG. 14 shows the structure of FIG. 13 after forming a third etch mask 290 having third etch mask openings 292.1 exposing half of first etched openings 282 and third etch mask openings 292.2 exposing half of the second etched openings 288. FIG. 15 shows the structure of FIG. 14 after etching through first sub stack 252.1 and sub stack insulating layer 256 at third etch mask openings 292.1. FIG. 15 also shows a result of etching through third sub stack 252.3 and sub stack insulating layer 260 at third etch mask openings 292.2. Doing so creates third etched openings 294 and fourth etched openings 296. FIG. 16 shows the structure of FIG. 15 after third etch mask 290 has been stripped.

Figure 17:
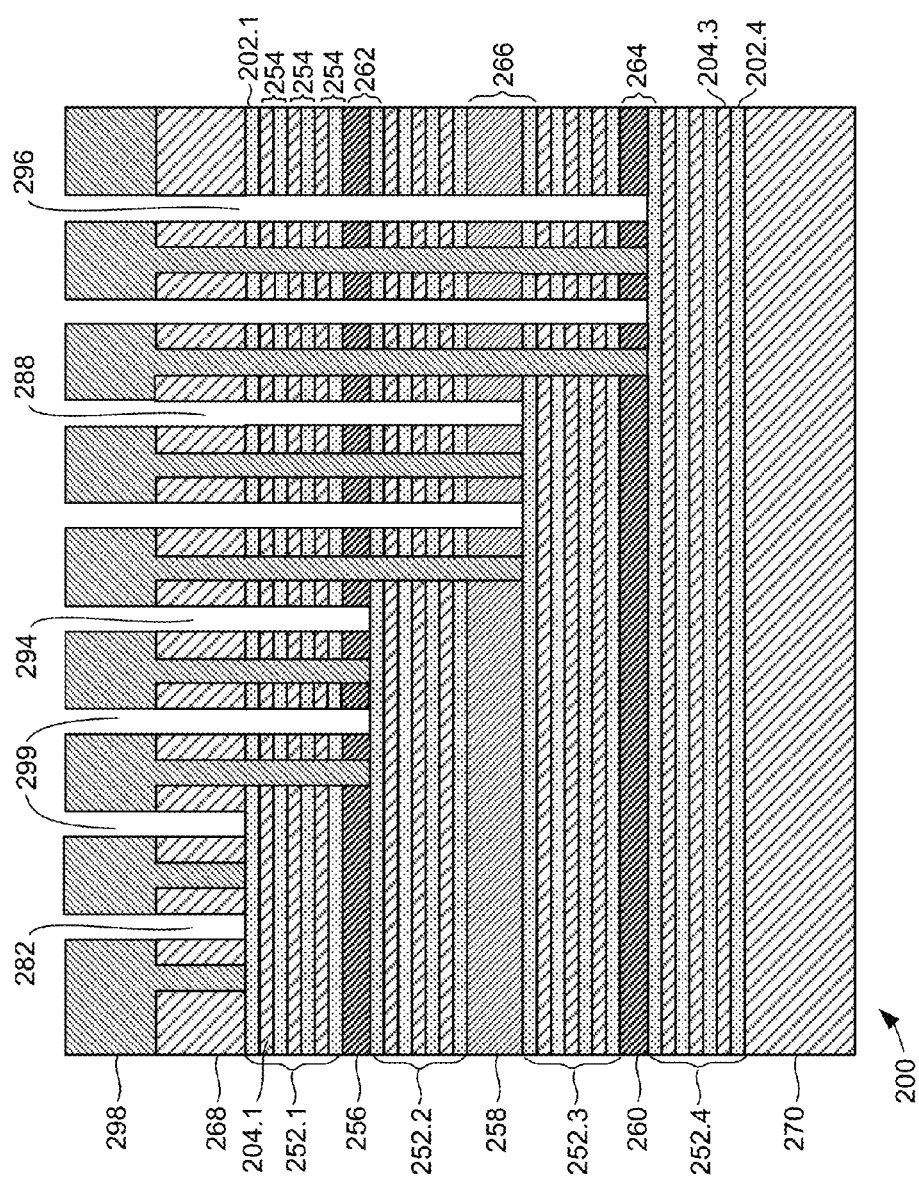
Figure 18:
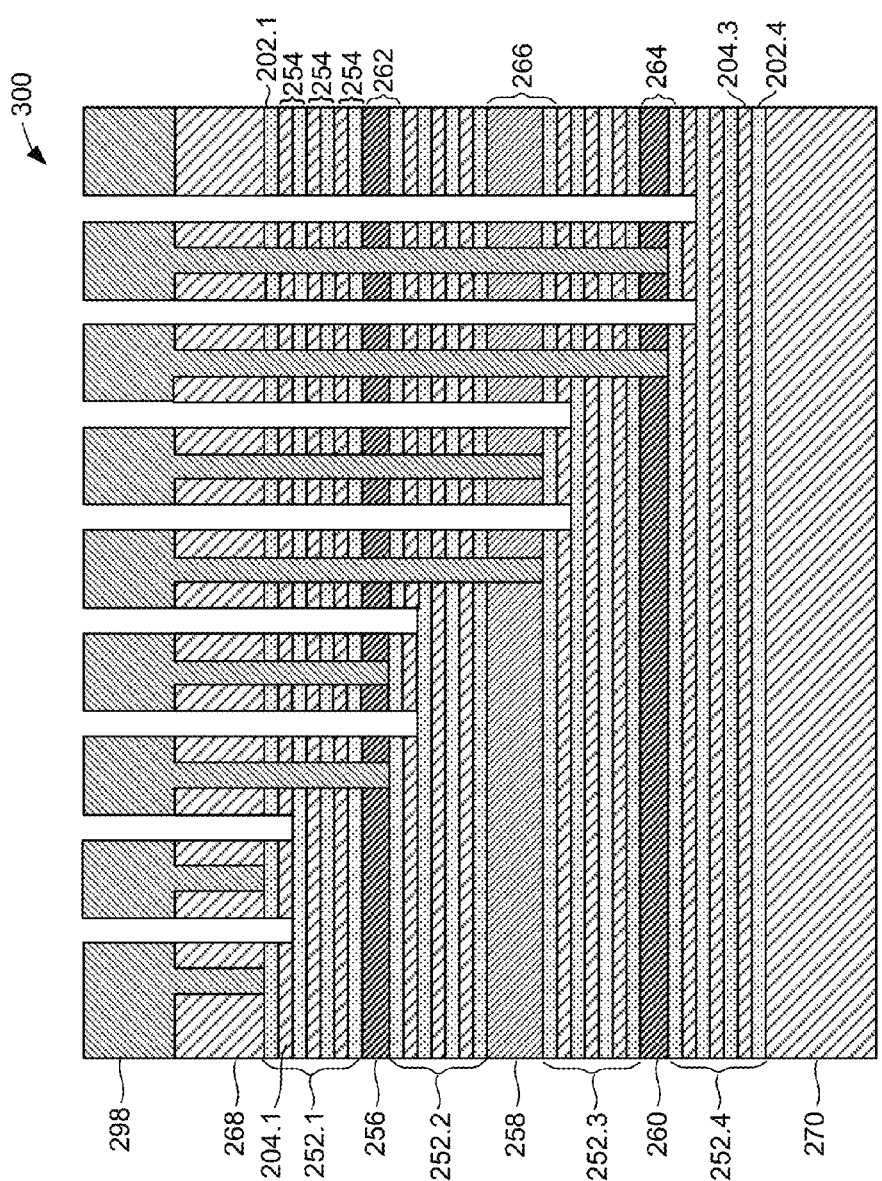
Figure 19:
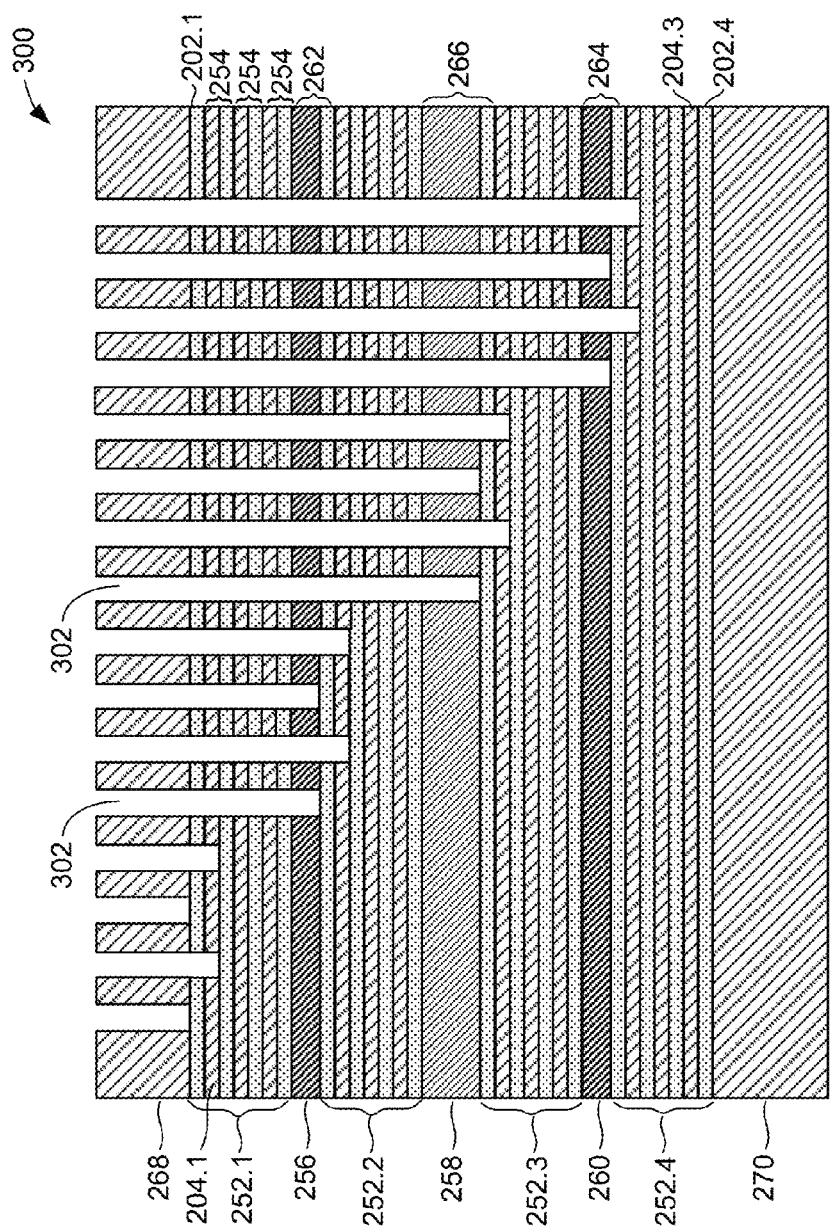
Figure 20:
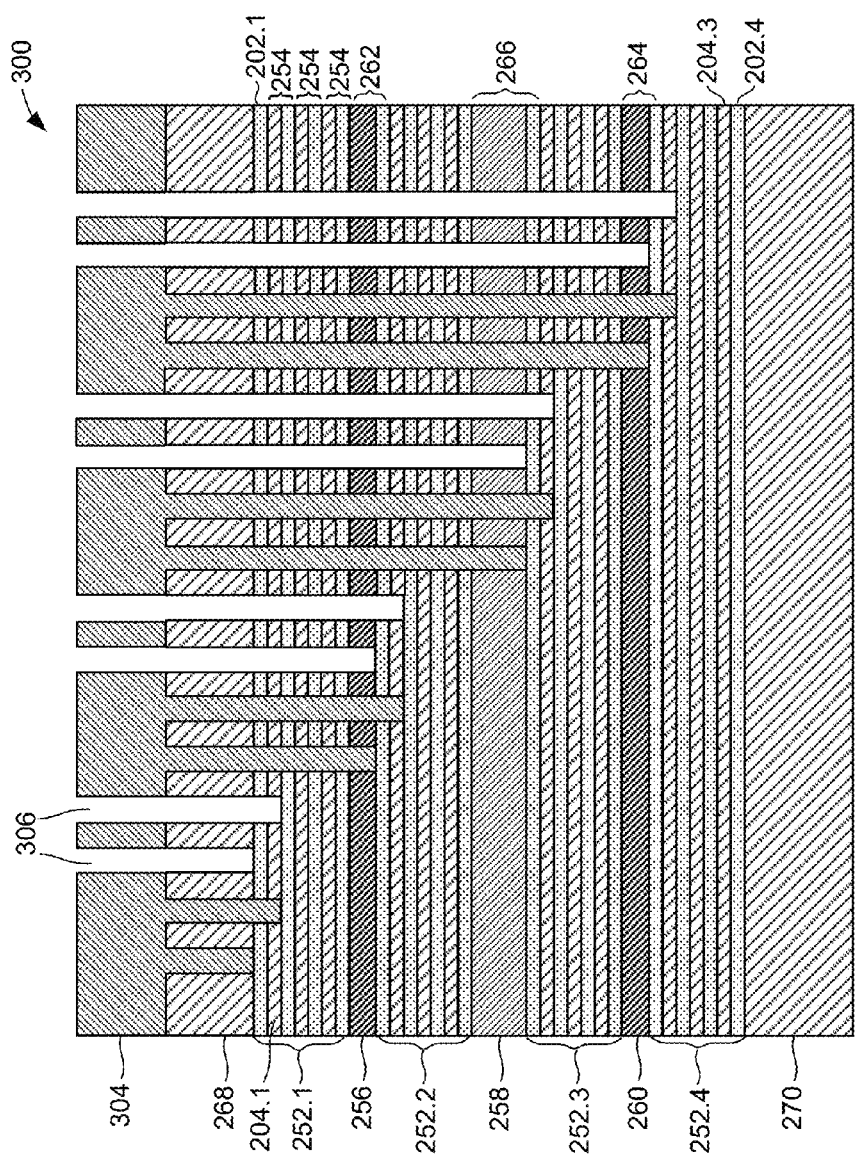
Figure 21:
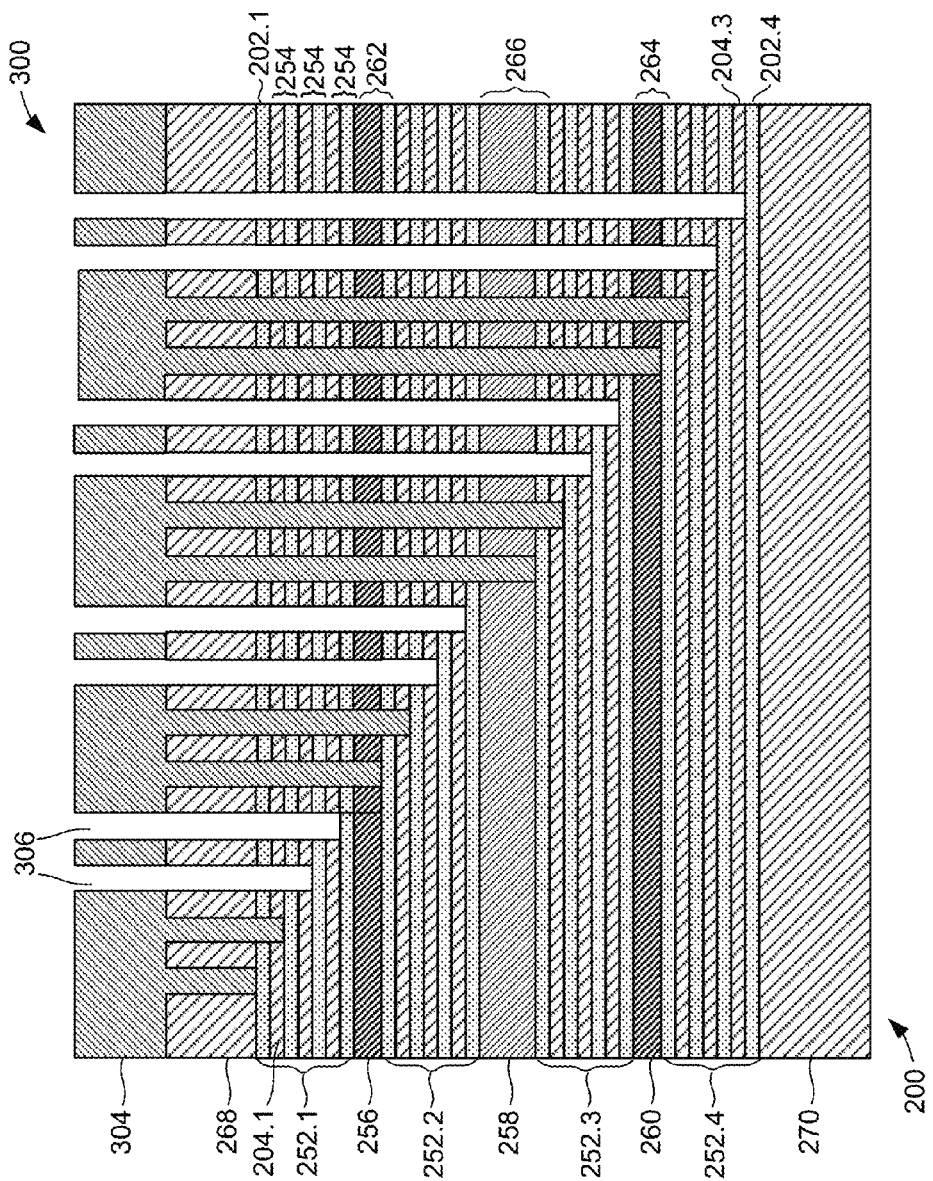

FIG. 17 shows the structure of FIG. 16 with a fourth etch mask 298 having openings 299 exposing every other first etched opening 282, second etched opening 288, third etched opening 294 and fourth etched opening 296. FIG. 18 shows a result of etching through the upper boundary active layer 202.1 and underlying insulation layer 204.1 for each of sub stacks 252.1, 252.2, 252.3 and 252.4. This creates a partially etched structure 300, shown with fourth etch mask 298 removed in FIG. 19. Partially etched structure 300 has openings 302 extending to different levels within stack 200. FIG. 20 shows the structure of FIG. 19 with a fifth etch mask 304 alternatingly covering and exposing two openings 302. Fifth etch mask 304 has openings 306 overlying the exposed openings 302 of FIG. 19. FIG. 21 shows a result of a second etching procedure in which two active layers 202 and two insulating layers 204 are etched through each opening 306.

Figure 22:
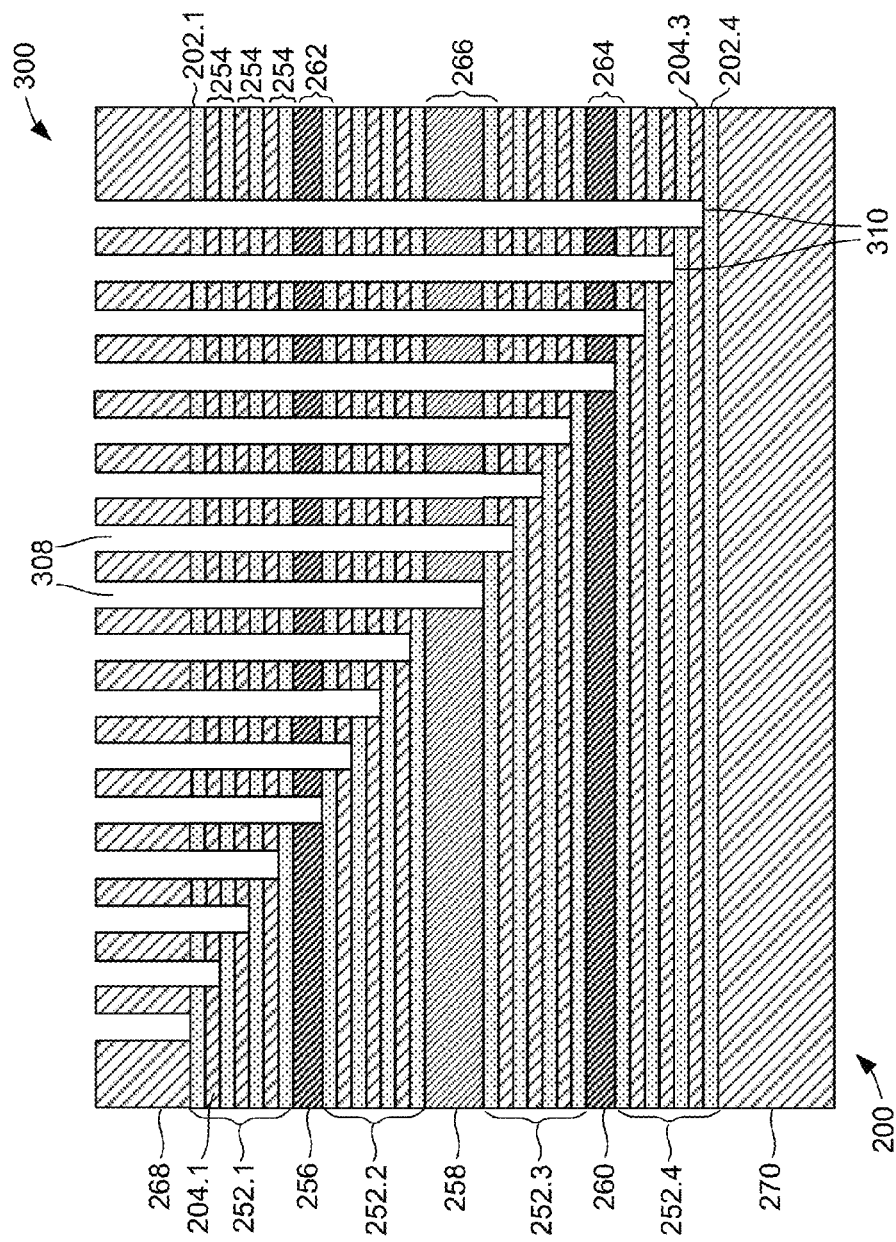
Figure 23:
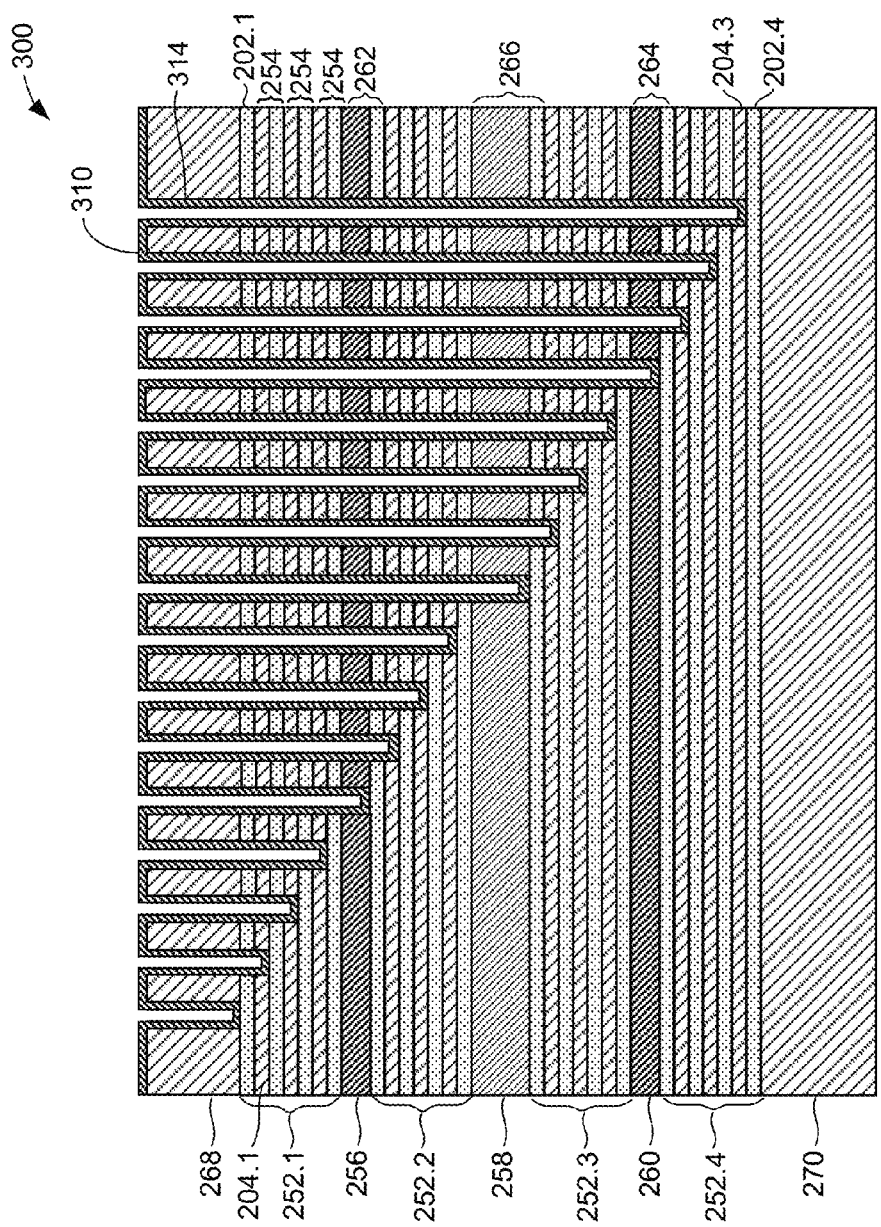
Figure 24:
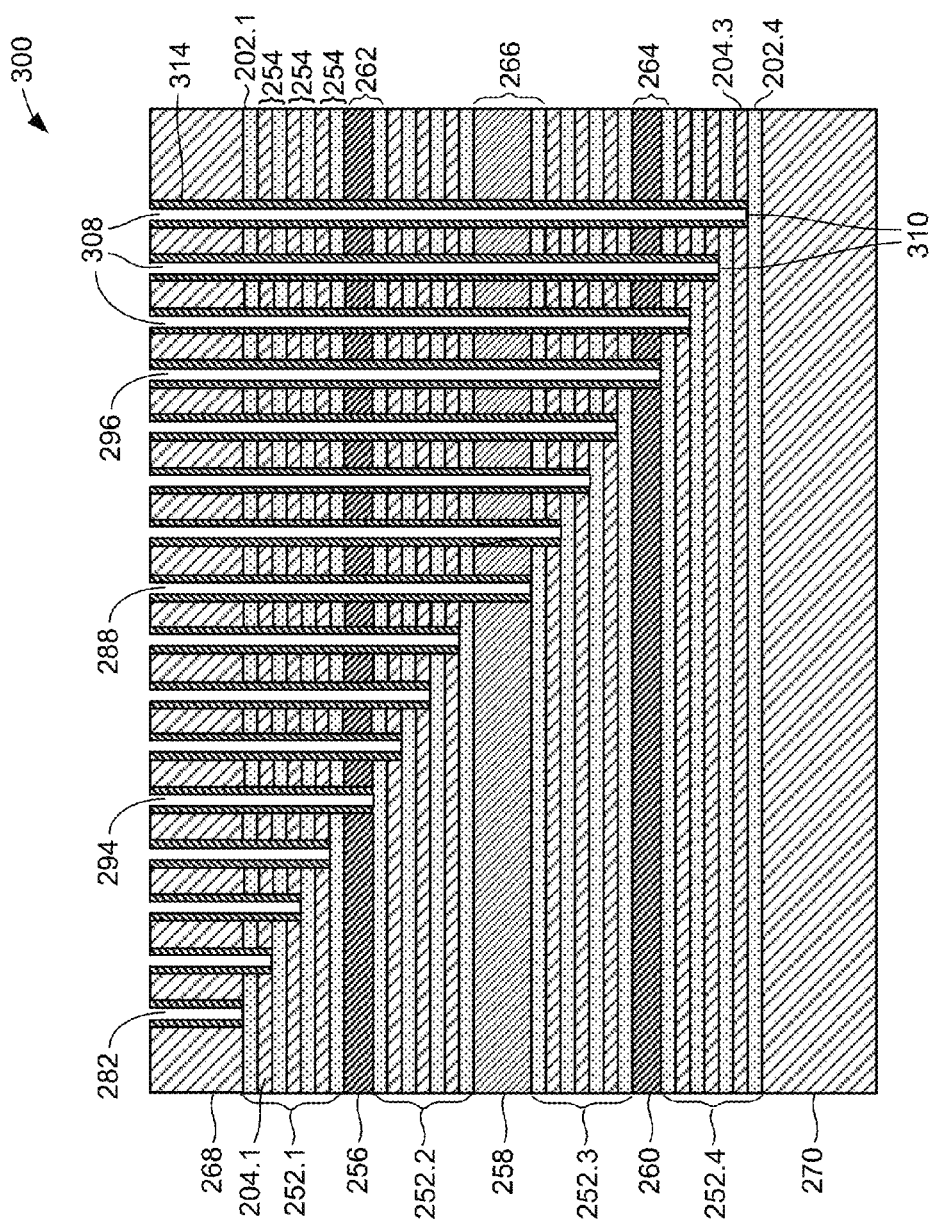
Figure 25:
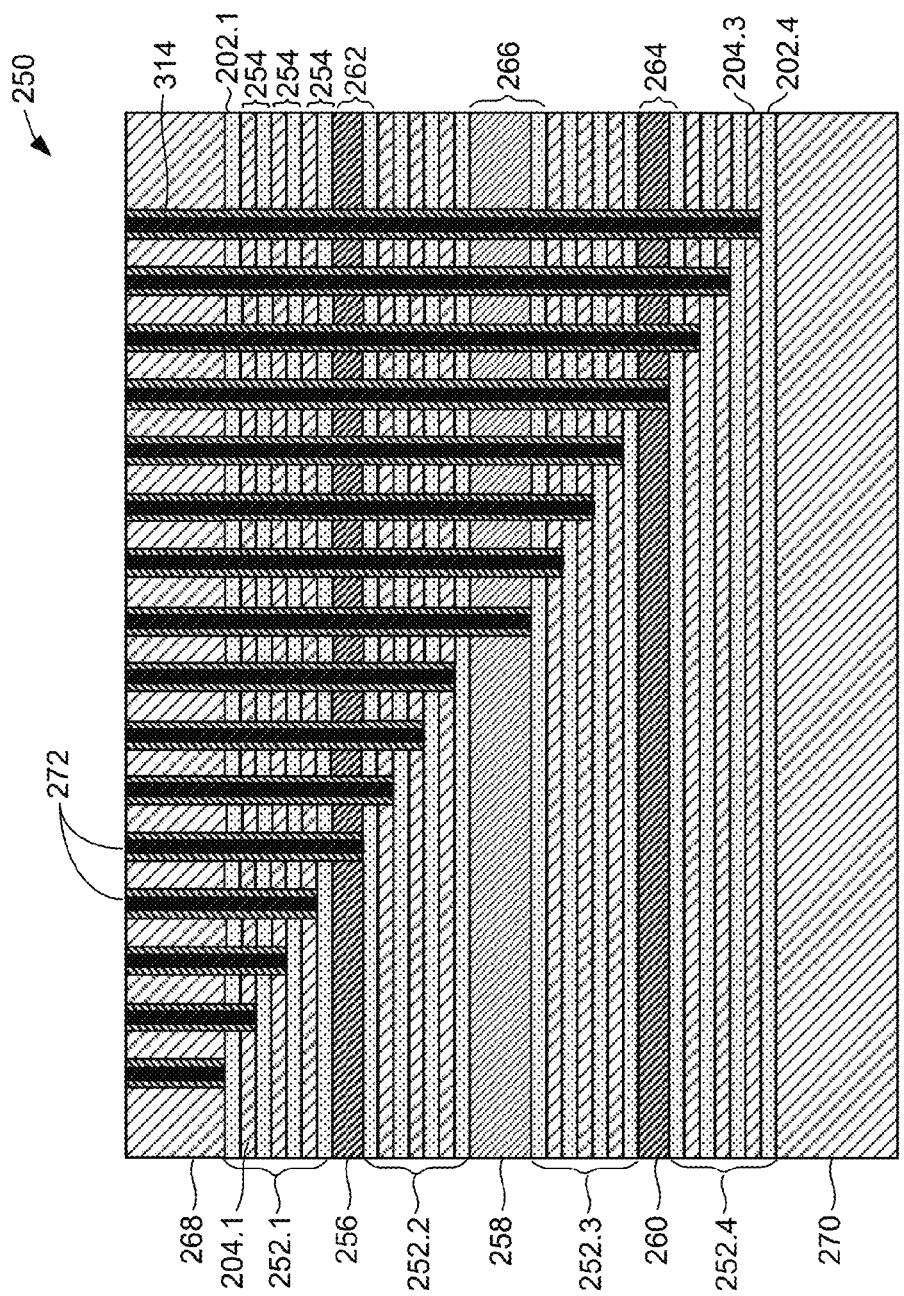

FIG. 22 shows the result of stripping off fifth etch mask 304 from the structure of FIG. 21 showing vias 308 extending down to landing areas 310 of active layers 202. The structure of FIG. 22 has a stairstep arrangement of landing areas 310. FIG. 23 shows an insulating layer 312, such as silicon nitride SiN, deposited over the structure of FIG. 22 thus creating a layer of sidewall insulation 314 lining each via 308. In FIG. 24, insulation layer 312 overlying upper insulating layer 268 and at the bottom of each via 308 has been removed to expose landing areas 310. FIG. 25 shows the structure of FIG. 24 after filling vias 308 with a conductor, such as tungsten W, to create interlayer conductors 272 extending from the upper surface 318 of the upper insulating layer 268 to landing areas 310 at each active layer 202, thus creating the contact structure 250 of FIG. 6.

FIGS. 26-43 will be discussed showing one example of steps for making a contact structure using a trim-etch process, a simplified example of which is discussed above with regard to FIGS. 4A-4G.

Figure 26:
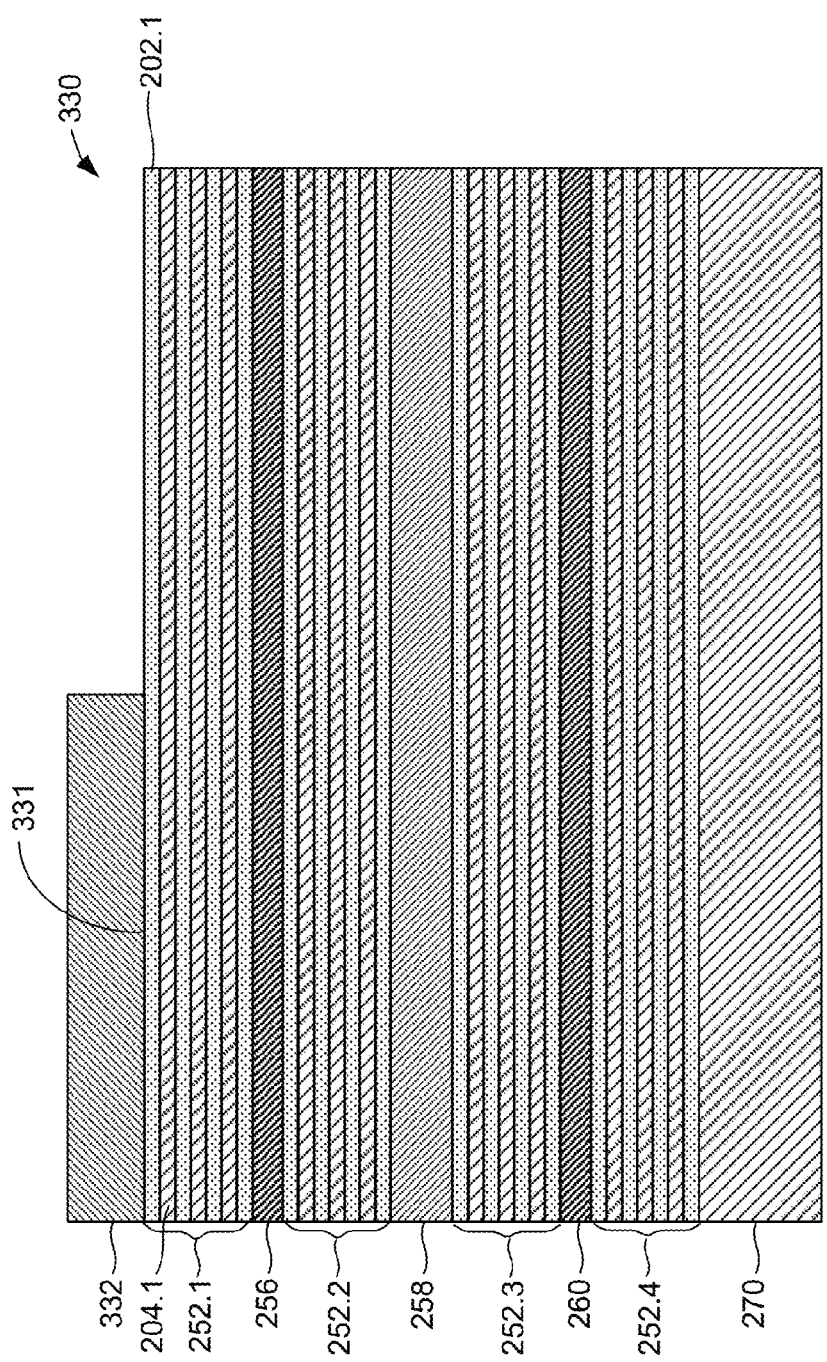
FIGS. 26-43 show an example of making a contact structure using a trim-etch process.

FIG. 26 illustrates a stack 330 identical to stack 200 of FIG. 7 except for the absence of upper insulating layer 268. A first etch mask 332 is formed over stack 330 covering a portion 331 of active layer 202.1 of first substrate 252.1 and exposing about half of the active layer. During the first etching step, the result of which is shown in FIG. 27, stack 330 is etched at the exposed portion of active layer 202.1 through half of the sub stacks, that is through first sub stack 252.1, sub stack insulating layer 256, second sub stack 252.2 and sub stack insulating layer 258, thereby exposing a portion 334 of upper boundary active layer 202.1 of third sub stack 252.3.

Figure 27:
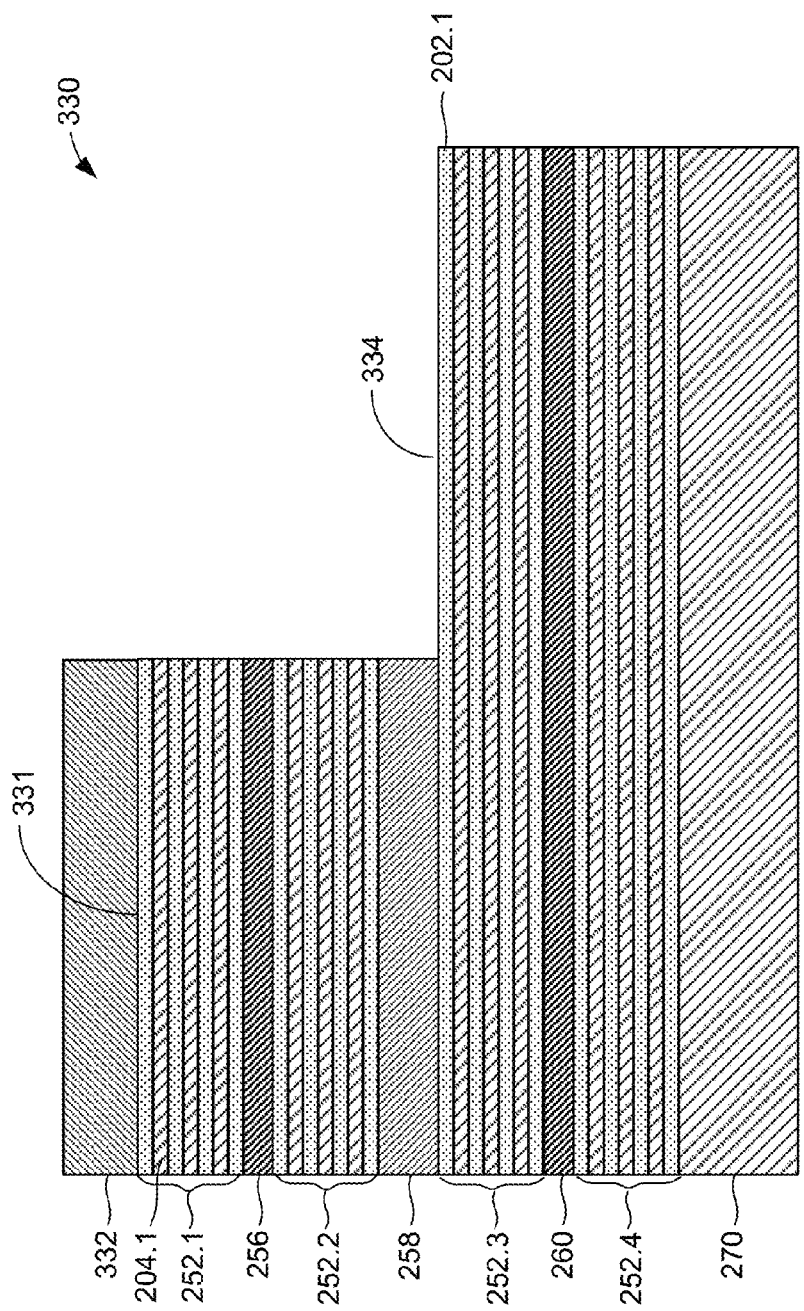
Figure 28:
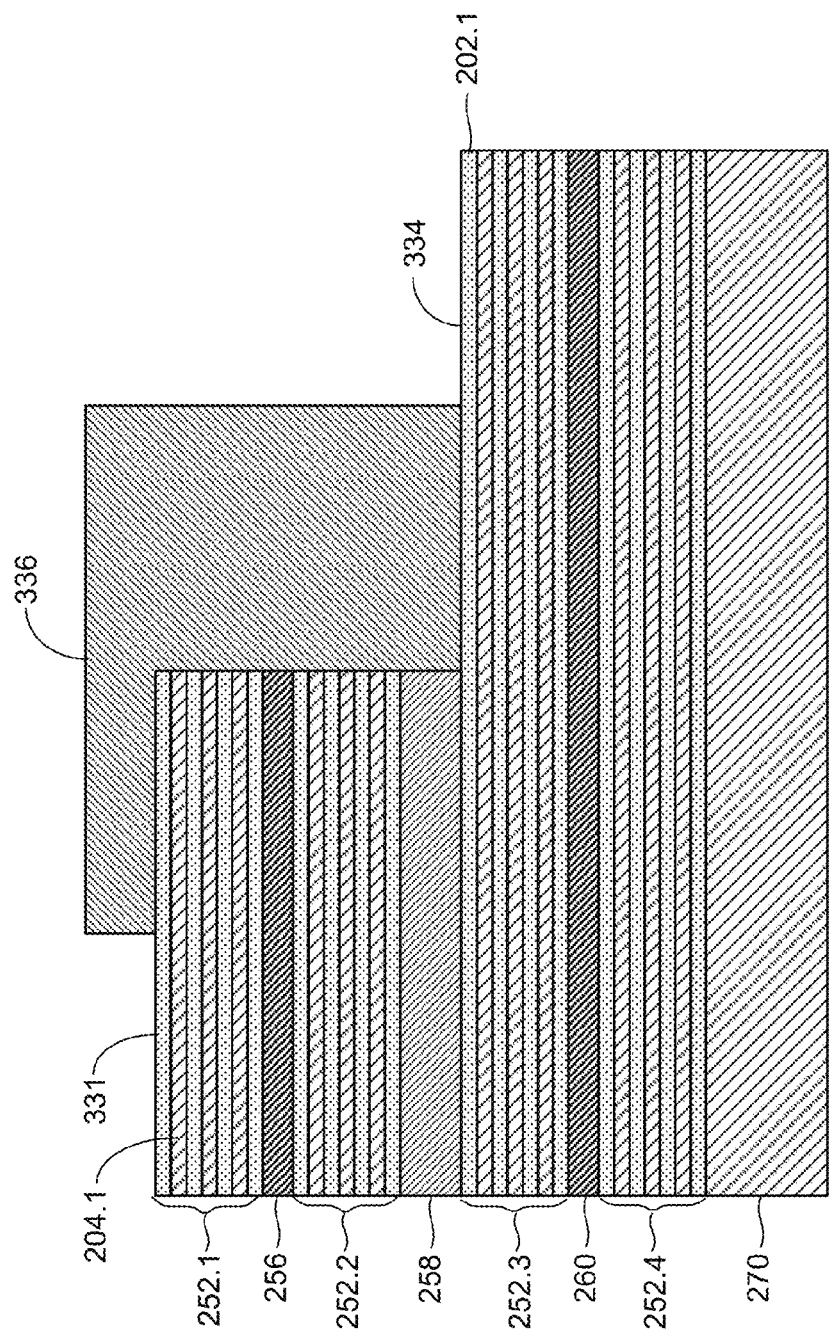
Figure 29:
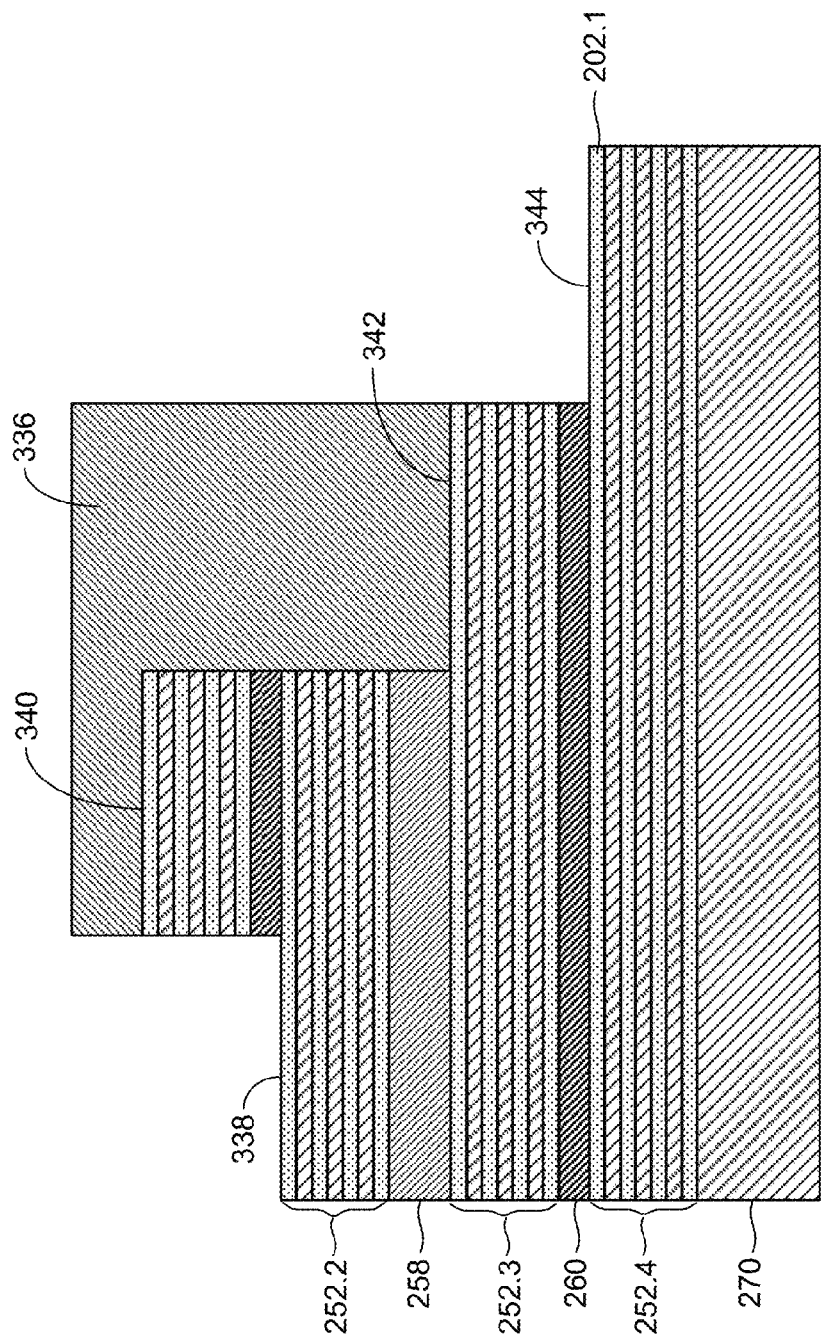
Figure 30:
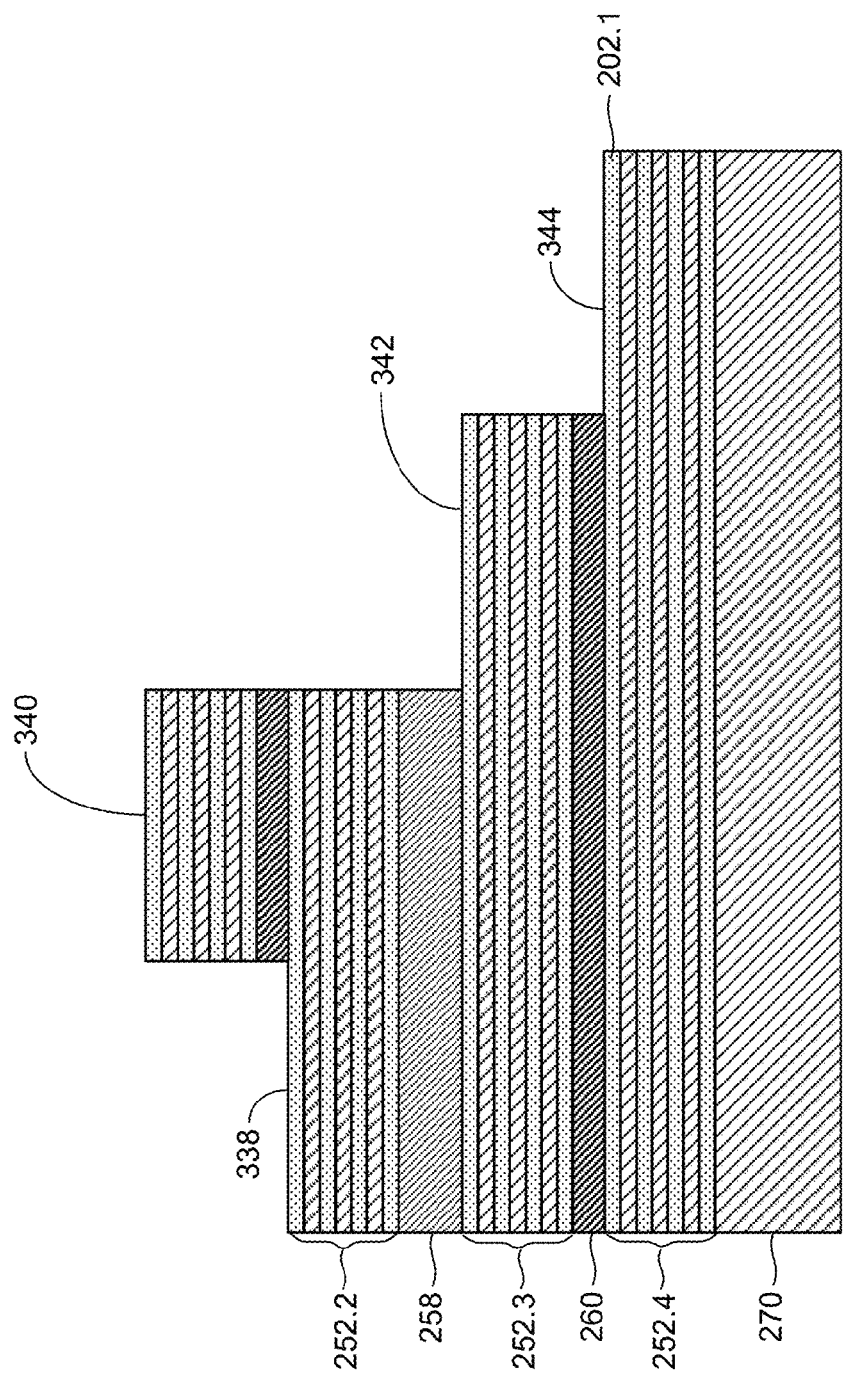

FIG. 28 shows the structure of FIG. 27 with a second etch mask 336 covering about one half of portion 331 and about one half of portion 334. The exposed region of portion 331 is then etched through sub stack 252.1 and sub stack insulating layer 256. The exposed region of portion 334 is etched through sub stack 252.3 and sub stack insulating layer 260. Doing so creates the structure of FIG. 29 with the surface areas 338, 340, 342 and 344. In FIG. 30, second etch mask 336 has been removed from the structure of FIG. 29.

Figure 31:
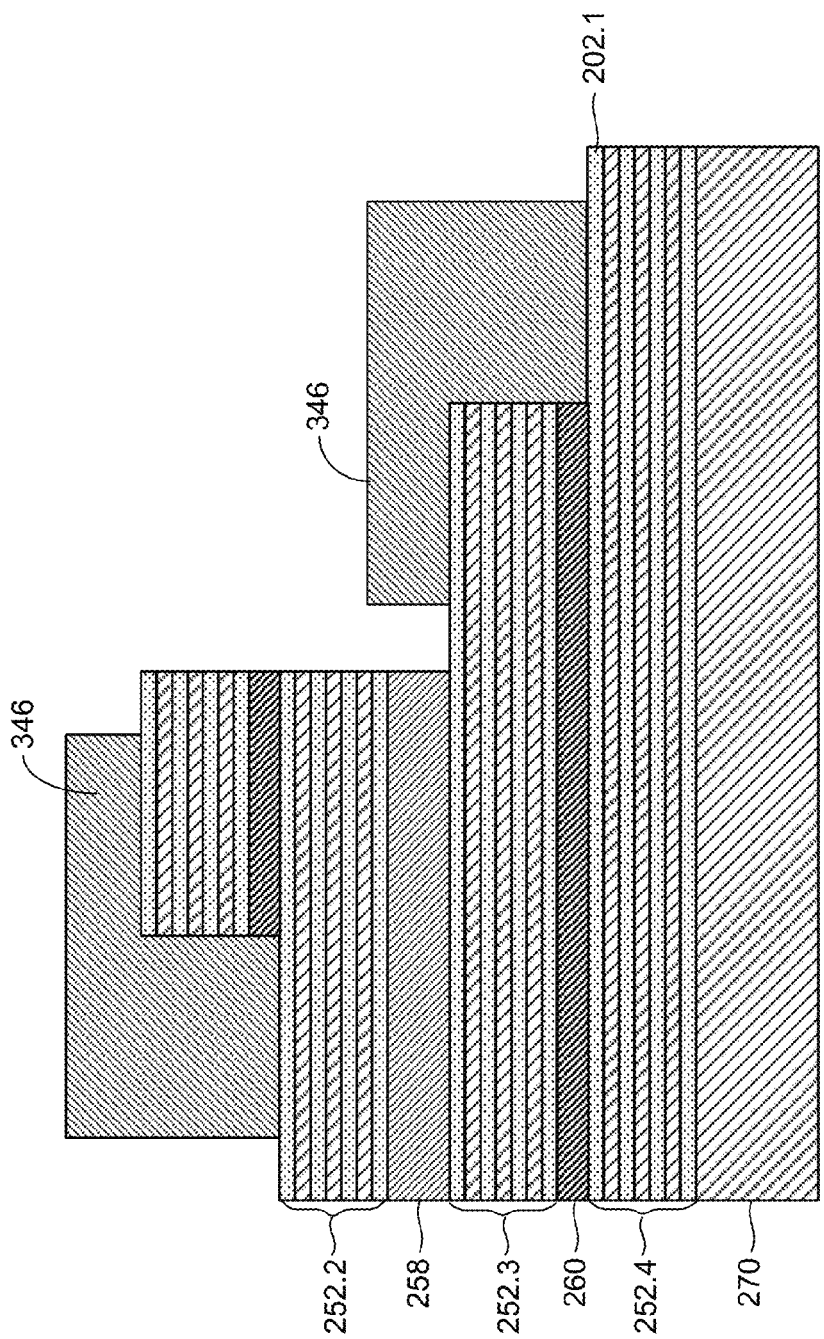
Figure 32:
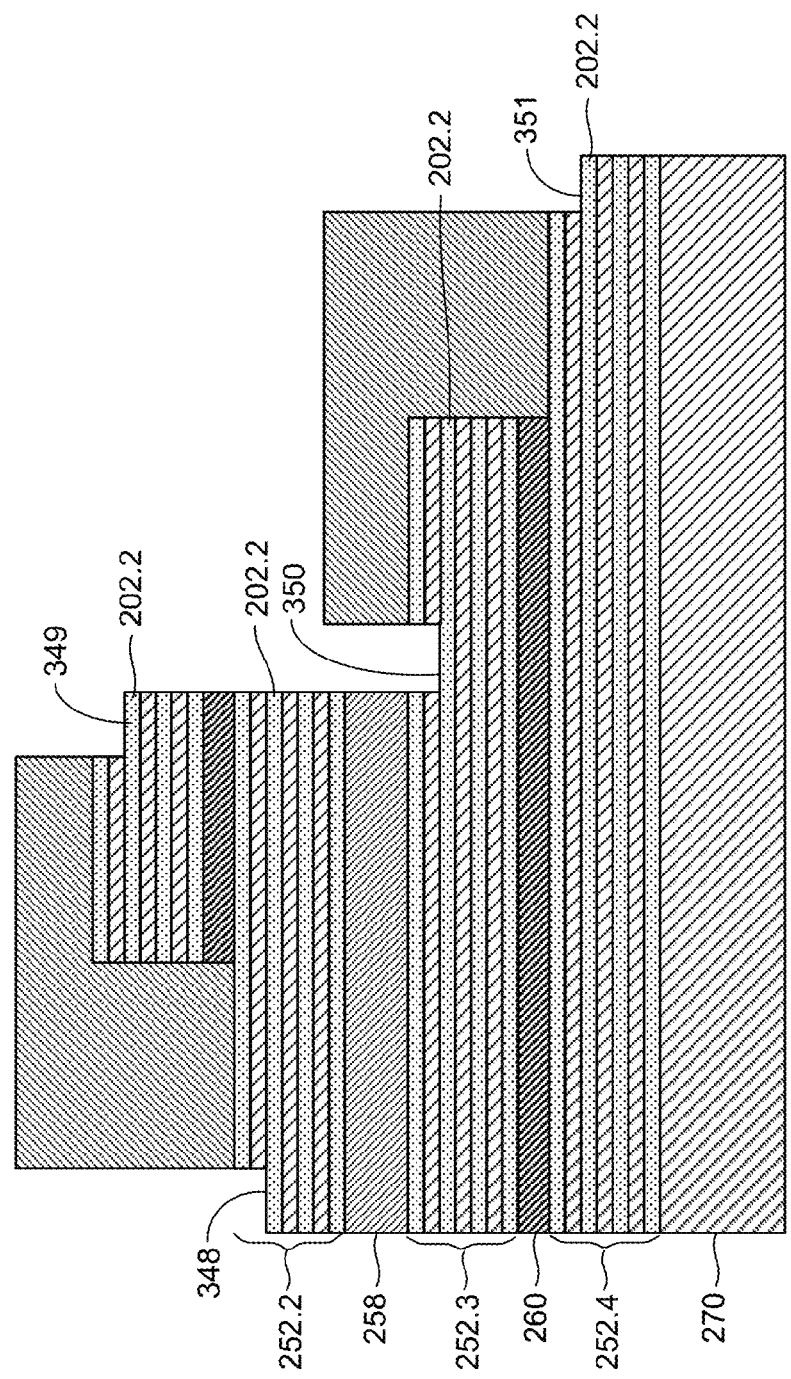
Figure 33:
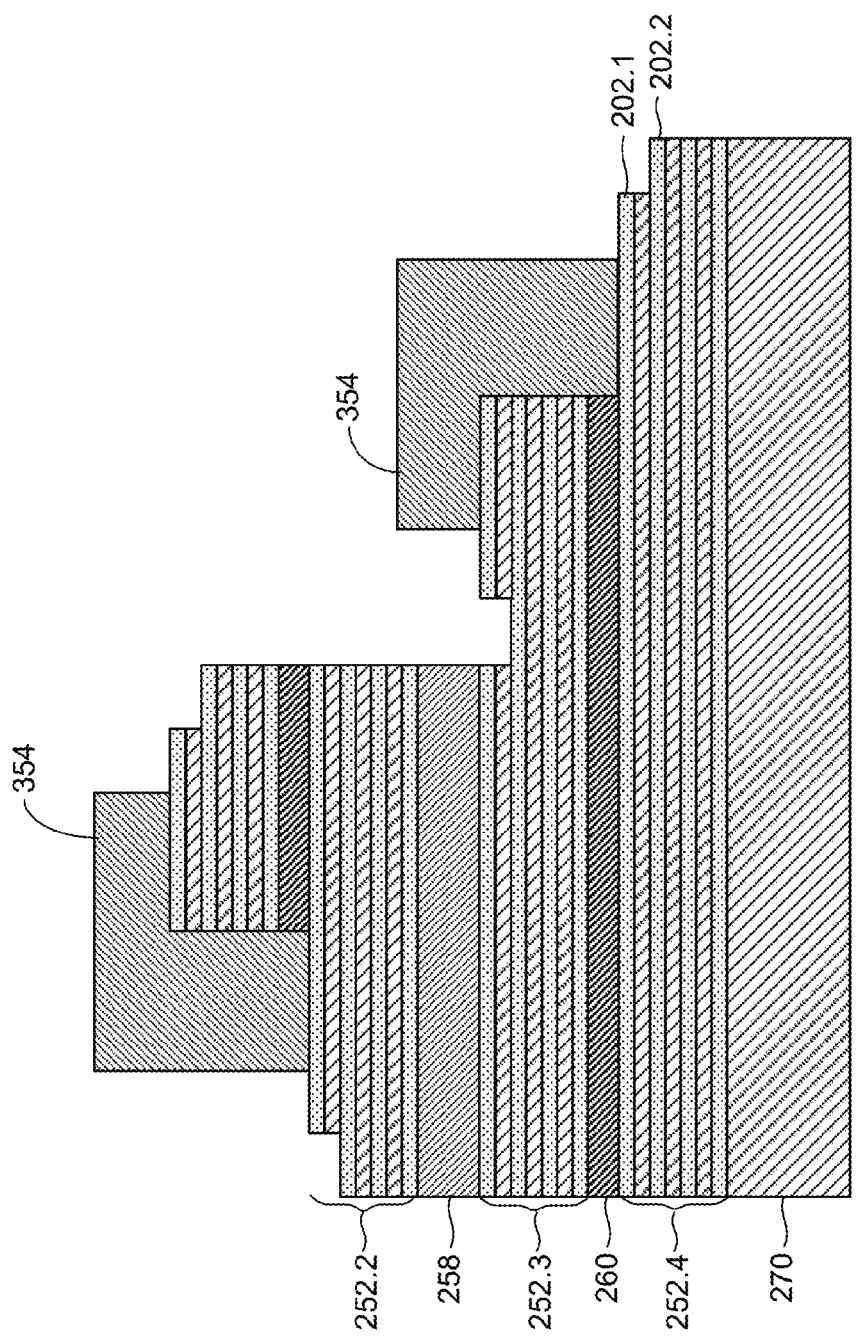
Figure 34:
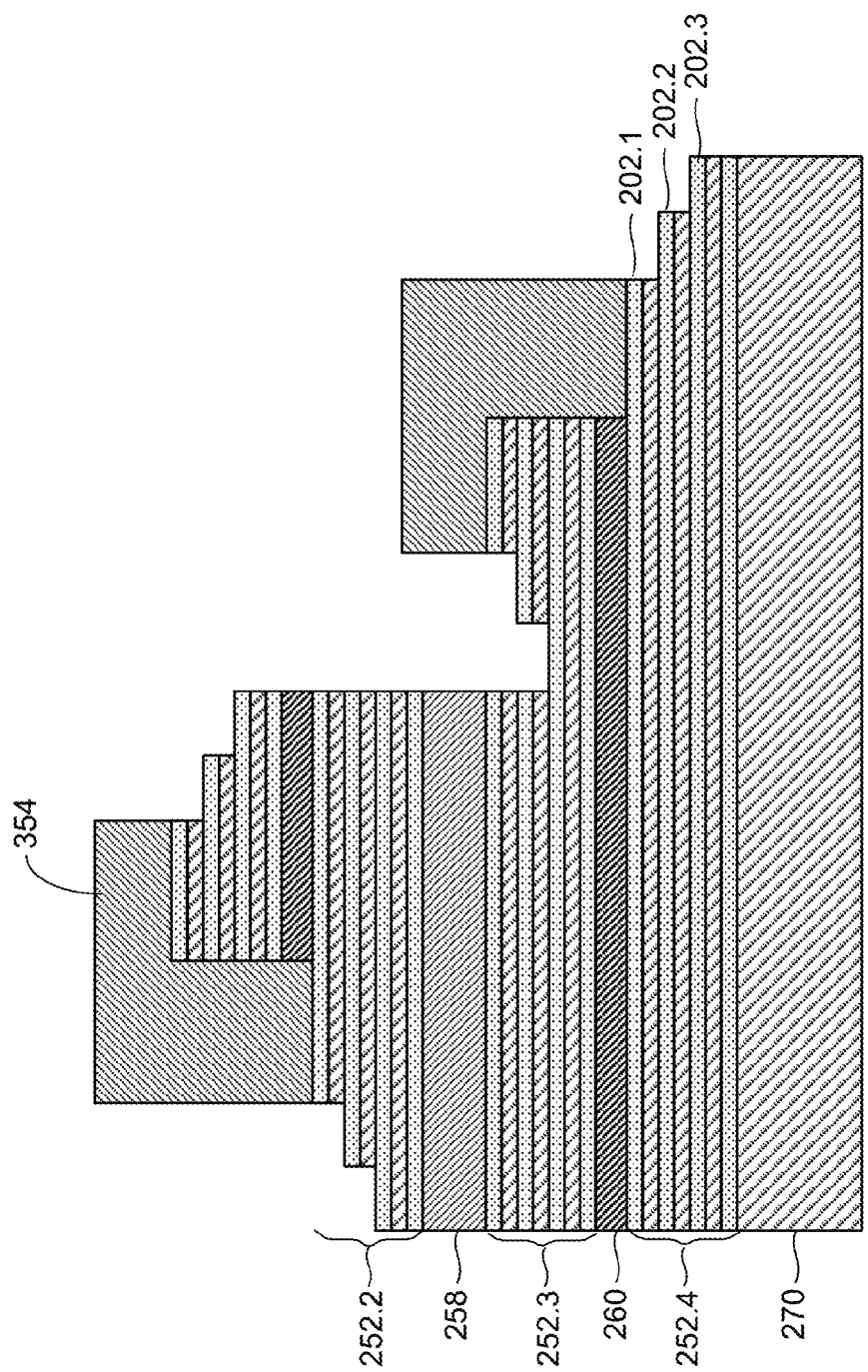
Figure 35:
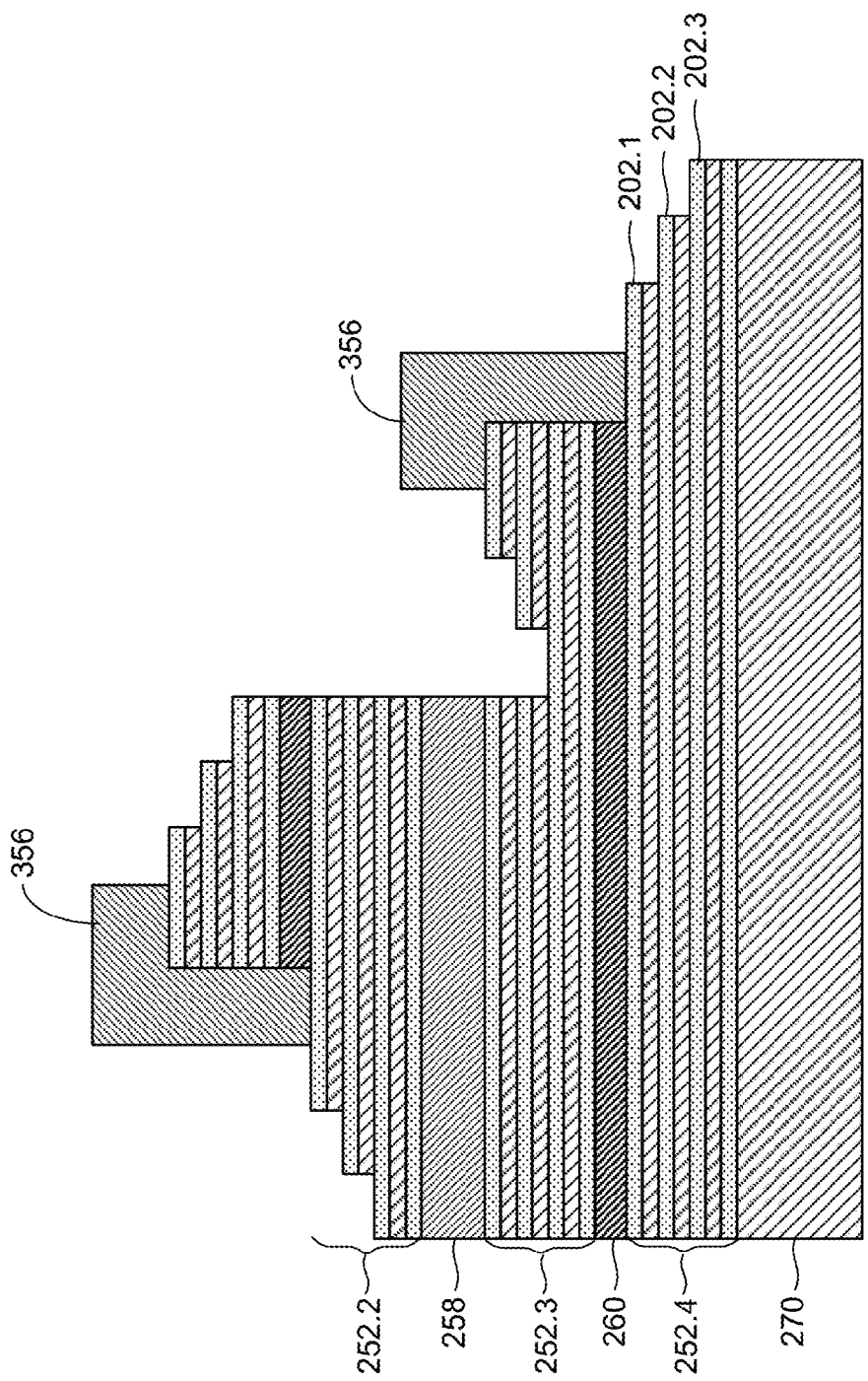

FIG. 31 shows a third etch mask 346 formed over surfaces 338-344 exposing a portion of each of those surfaces. Those exposed portions of surfaces 338-344 are etched through one active layer 202 and one insulating layer 204 to create the structure of FIG. 32 with exposed surface areas 348-351. Thereafter, as shown in FIG. 33, a third etch mask 352 is trimmed to create trimmed etch mask 354 which exposes the additional portions of upper boundary active layers 202.1 for each of sub stacks 252.1-252.4. This is followed by another etching step through one active layer 202 and the underlying insulating layer 204, the result of which is shown in FIG. 34. FIG. 35 shows the result of trimming trimmed etch mask 354 to create trimmed etch mask 356, again exposing additional portions of upper boundary active layers 202.1 for each of sub stacks 252.1-252.4. Again, this is followed by another etching step through one active layer 202 and the underlying insulating 204, the result of which is shown in FIG. 36.

Figure 36:
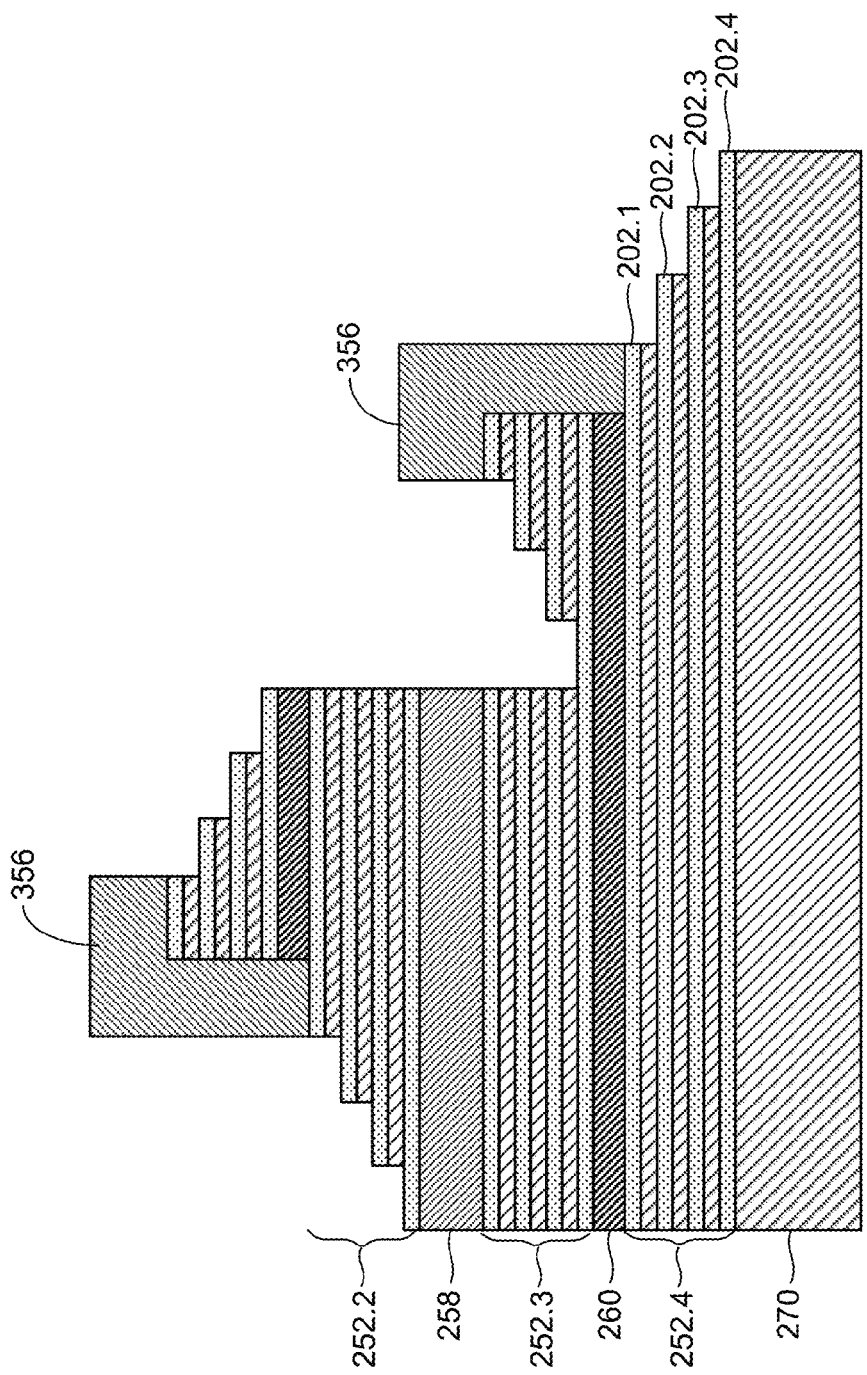
Figure 37:
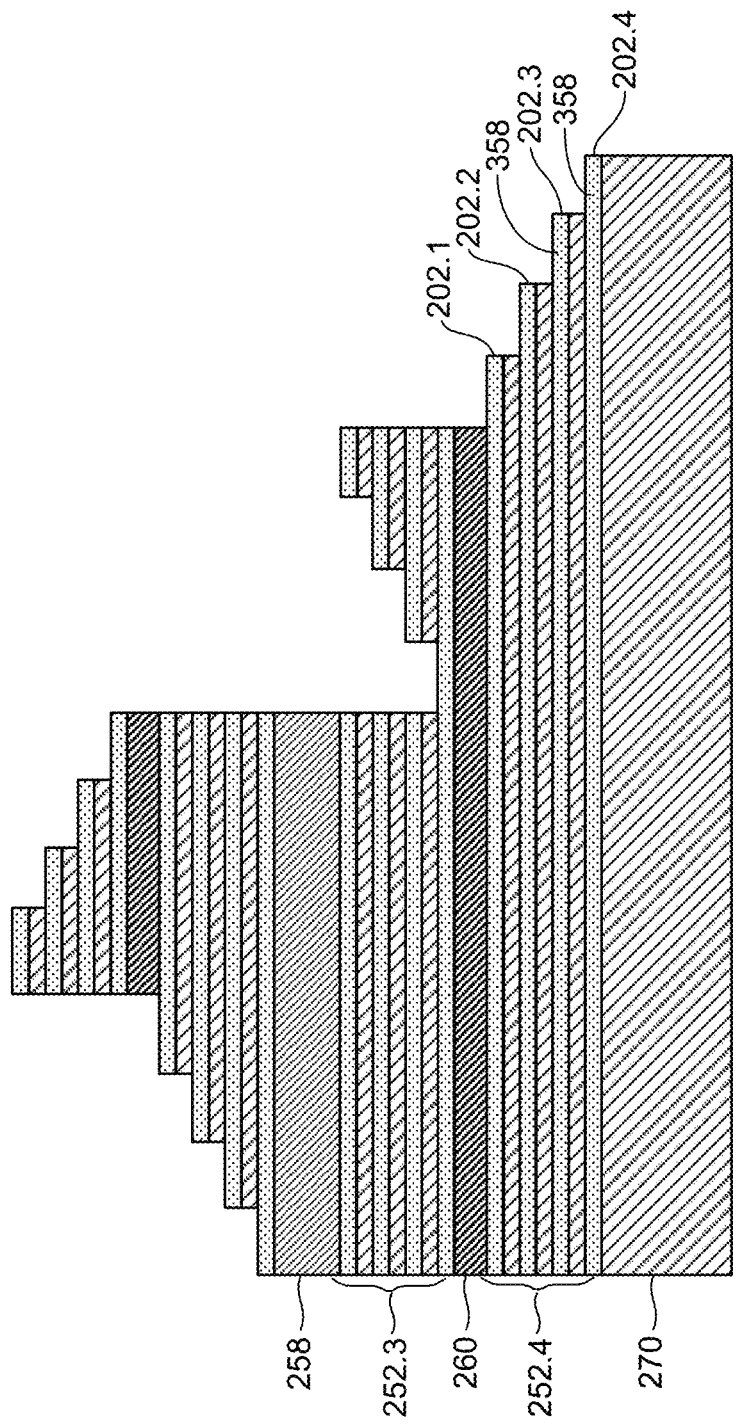
Figure 38:
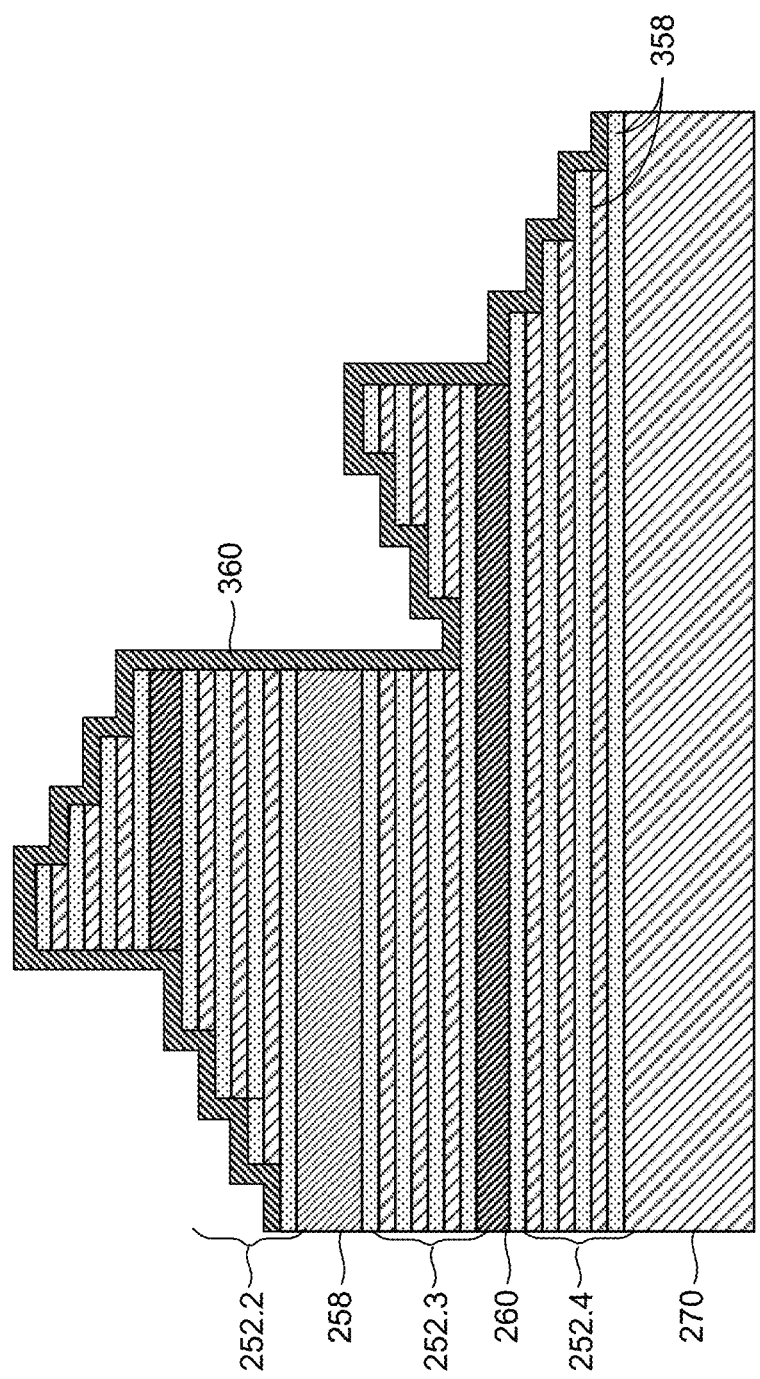
Figure 39:
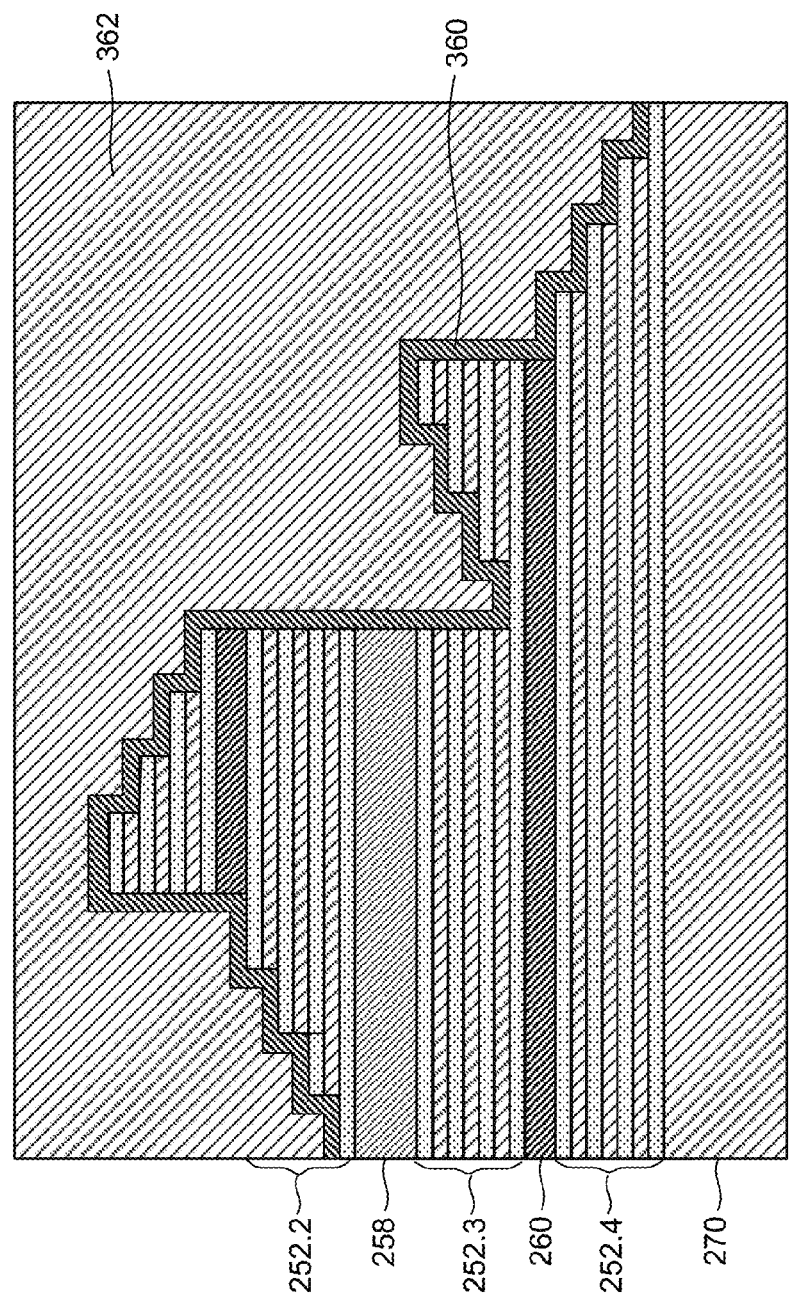
Figure 40:
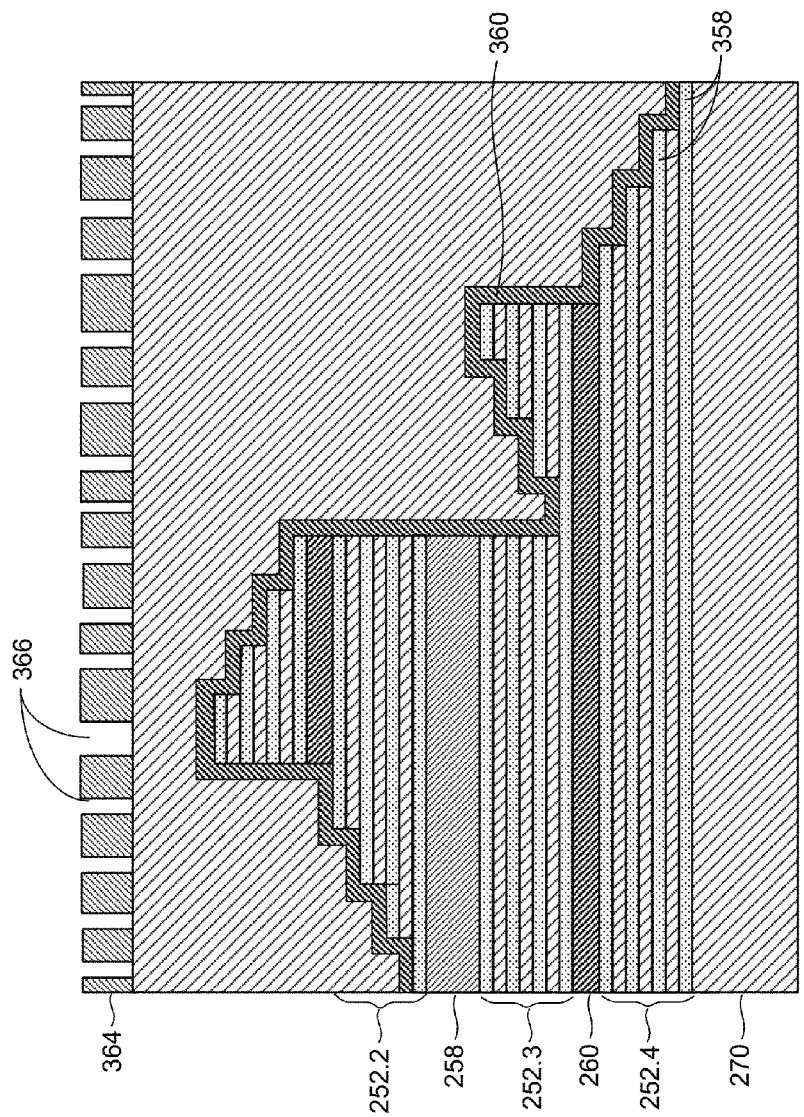
Figure 41:
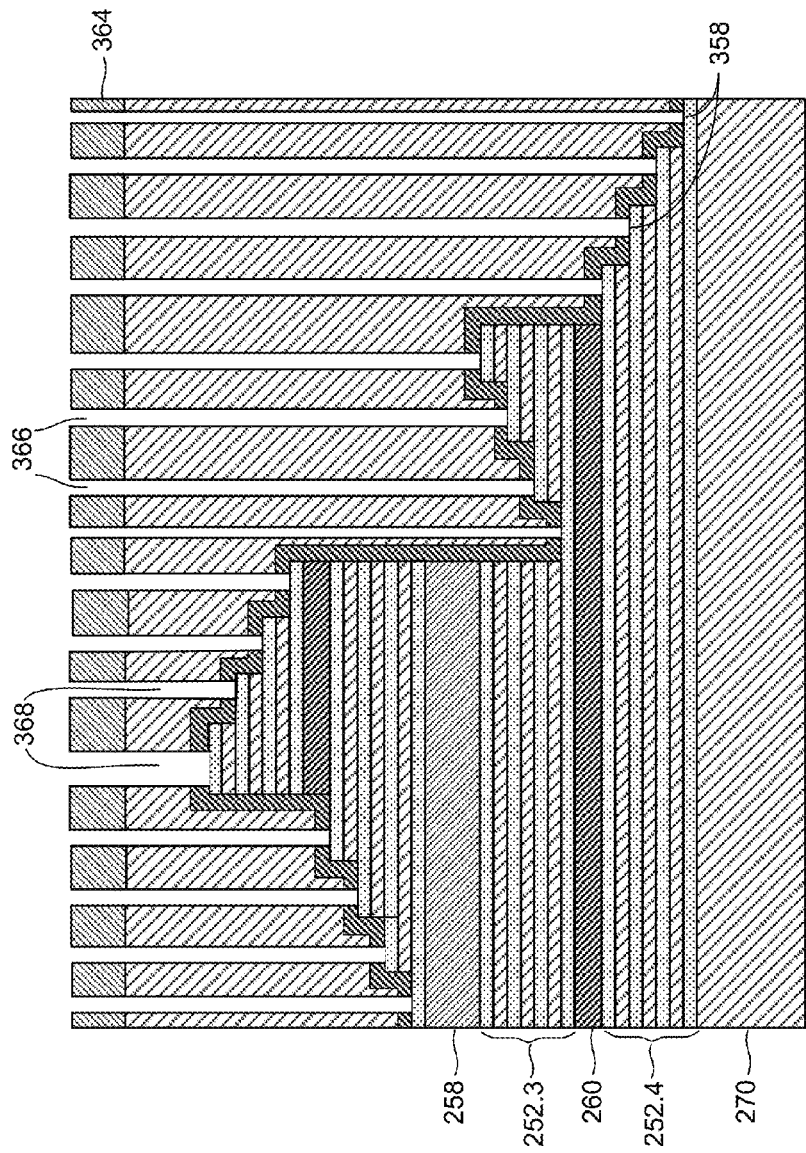
Figure 42:
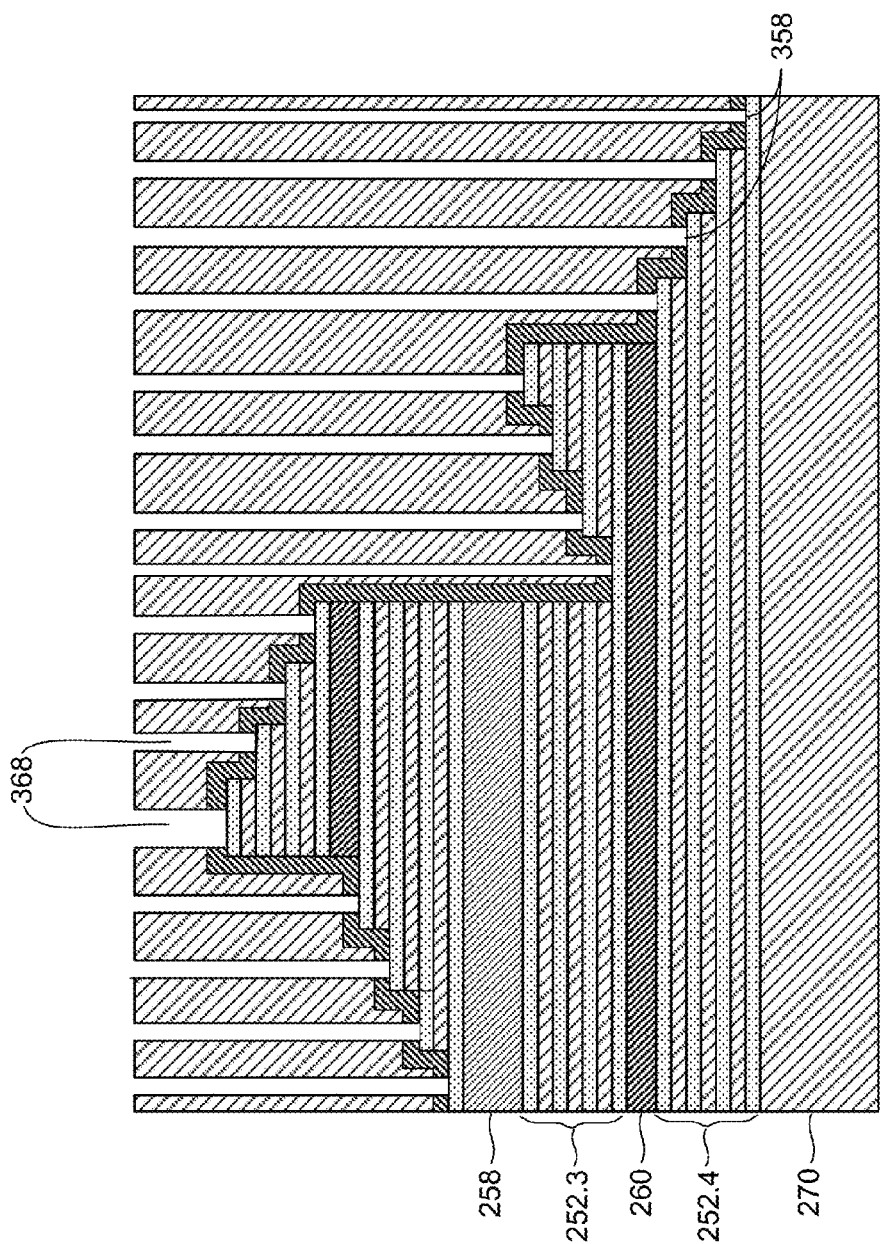
Figure 43:
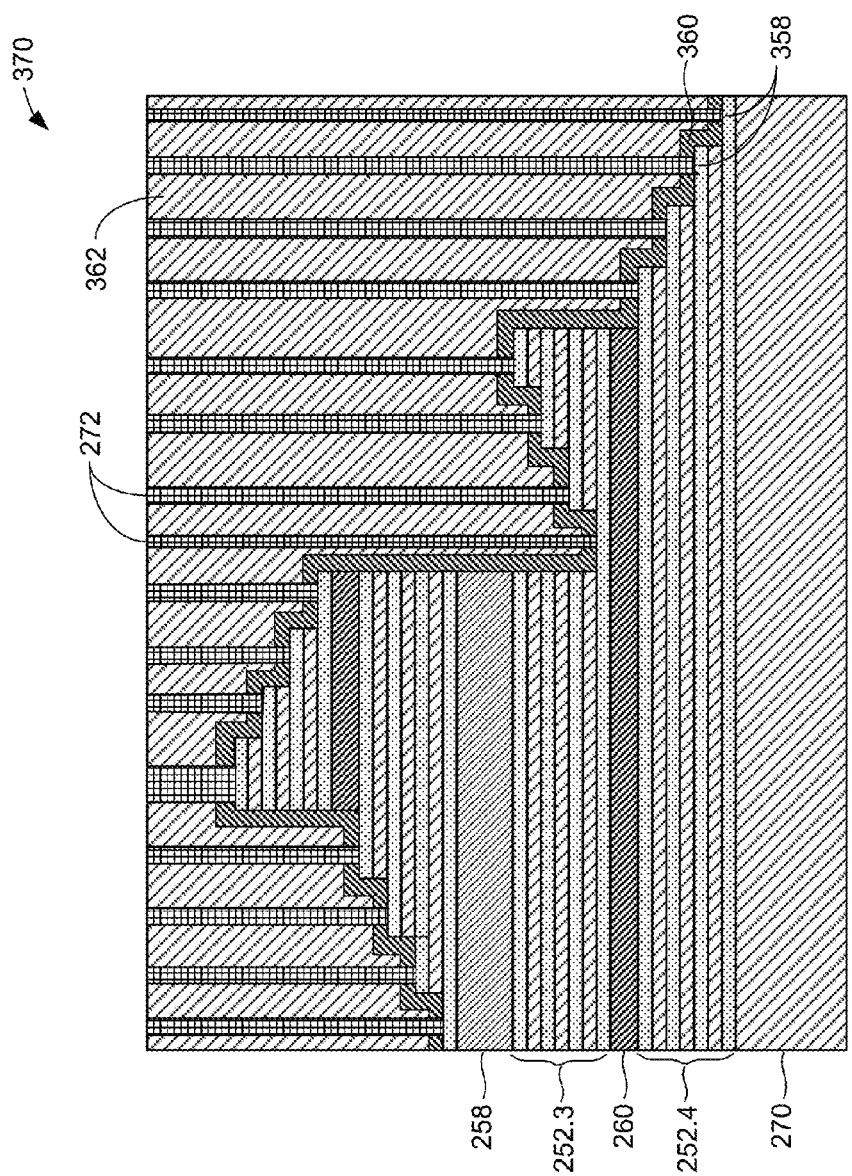

FIG. 37 shows the structure of FIG. 36 after removal of trimmed etch mask 356 resulting in a stairstep arrangement of landing areas 358. As shown in FIG. 38, this is followed by deposition of an insulating layer 360, sometimes referred to as stopping layer 360, which can be, for example, SiN. Next, as shown in FIG. 39, the structure of FIG. 38 is covered by an insulating material 362 made of, for example, SiO2. Next, a fourth etch mask 364 having openings 366 aligned with landing areas 358 is formed on insulating material 362. Vias 368 are formed through insulating material 362 and insulating layer 360 down to landing areas 358. This is shown in FIG. 41. FIG. 42 shows the structure of FIG. 41 after removal of fourth etch mask 364. FIG. 43 shows interlayer conductors 272, which can be made of tungsten W, formed within vias 368 to create contact structure 370.

Figure 44:
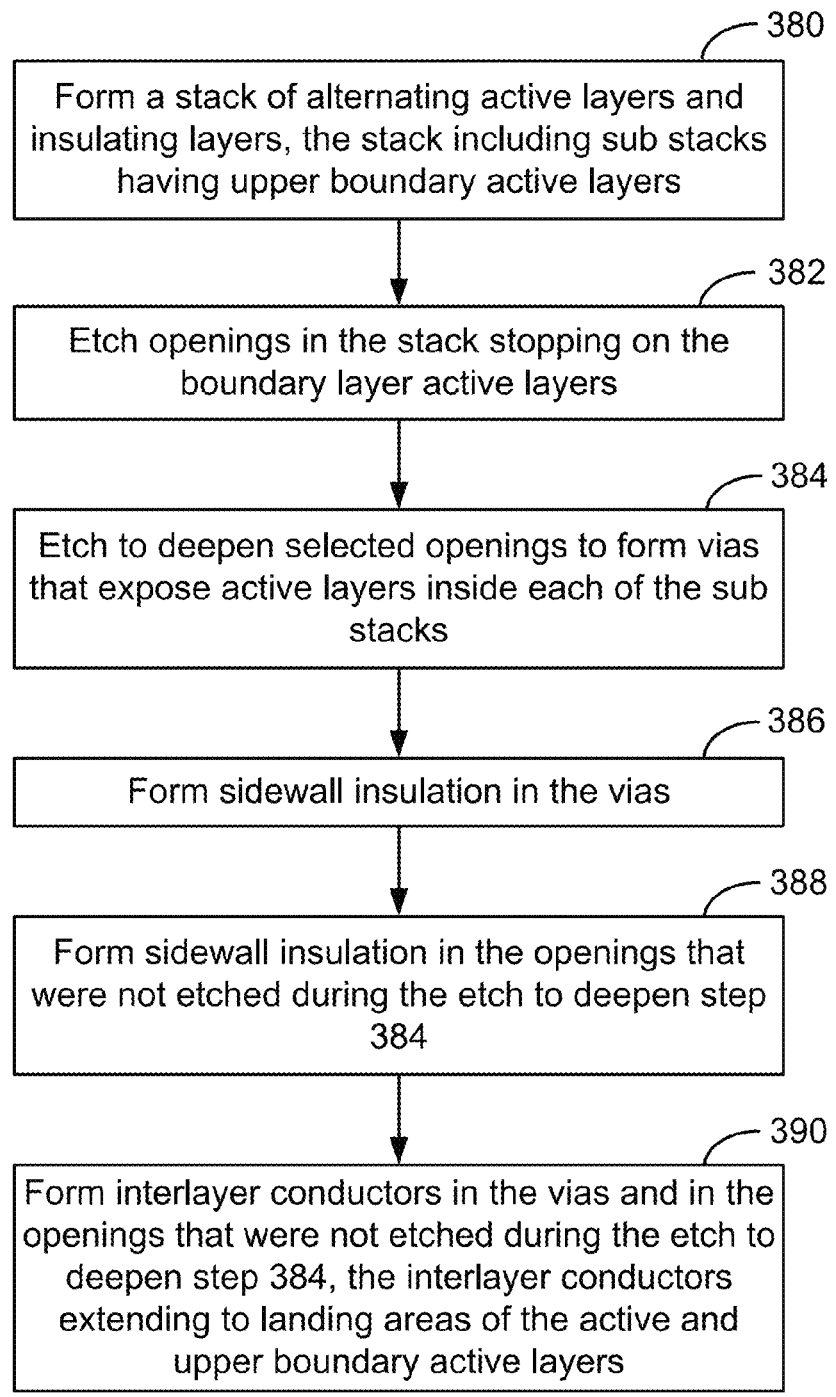
FIG. 44 is a simplified flowchart outlining the steps carrying out the method for forming a contact structure described below with regard to FIGS. 7-25.

FIG. 44 is a simplified flowchart outlining the basic steps for carrying out a method for forming a contact structure as described above with regard to FIGS. 7-25. At step 380 a stack 200 of alternating active and insulating layers 202 and 204 is formed. A plurality of openings 294, 288 and 296 are etched in the stack at step 382, the openings stopping on the boundary layer active layers 202.1. Selected ones of the openings 294, 288 and 296 are etched to deepen them at step 384 to create vias 308. At steps 386 and 388, insulation 314 is formed in the vias 308 and in the openings 294, 288 and 296 that were not etched. This is followed by the formation of interlayer conductors 272 therein at step 390. Interlayer conductors 272 connect to landing areas 310 of the active areas 202.

Figure 45:
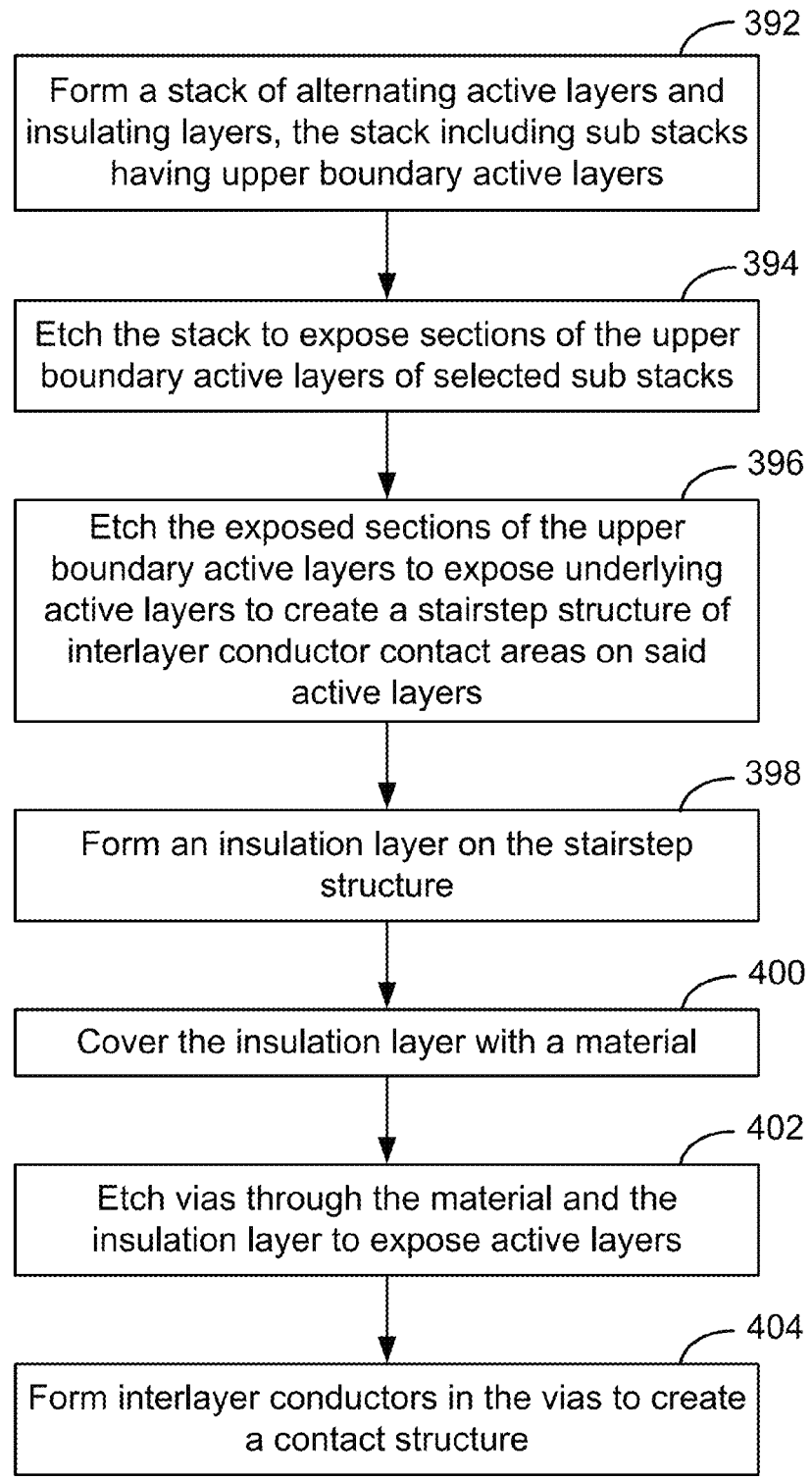
FIG. 45 is a simplified flowchart outlining the steps carrying out the method for forming a contact structure described below with regard to FIGS. 26-43.

FIG. 45 is a simplified flowchart outlining the basic steps for carrying out a method for forming a contact structure as described above with regard to FIGS. 26-43. At step 392 a stack 330 of alternating active and insulating layers 202 and 204 is formed. Stack 330 is then etched at step 394 to expose sections 338, 342 and 344 of the upper boundary active layers 202.1 of sub stacks 252. Sections 338, 342 and 344 are also referred to as surface areas 338, 342 344. At step 396 these exposed sections are etched to expose active layers 202.2, 202.3 and 202.4 below the upper boundary active layers 202.1 and to create a stairstep structure. An insulation layer 360 is formed on the stairstep structure at step 398. The insulation layer 360 is covered with an insulating material 362 at step 400. At step 402 vias 368 are formed through the insulating material 362 and the insulating layer 360. Interlayer conductors 372 are formed within the vias 368 at step 404 to create contact structure 370.

Figure 46:
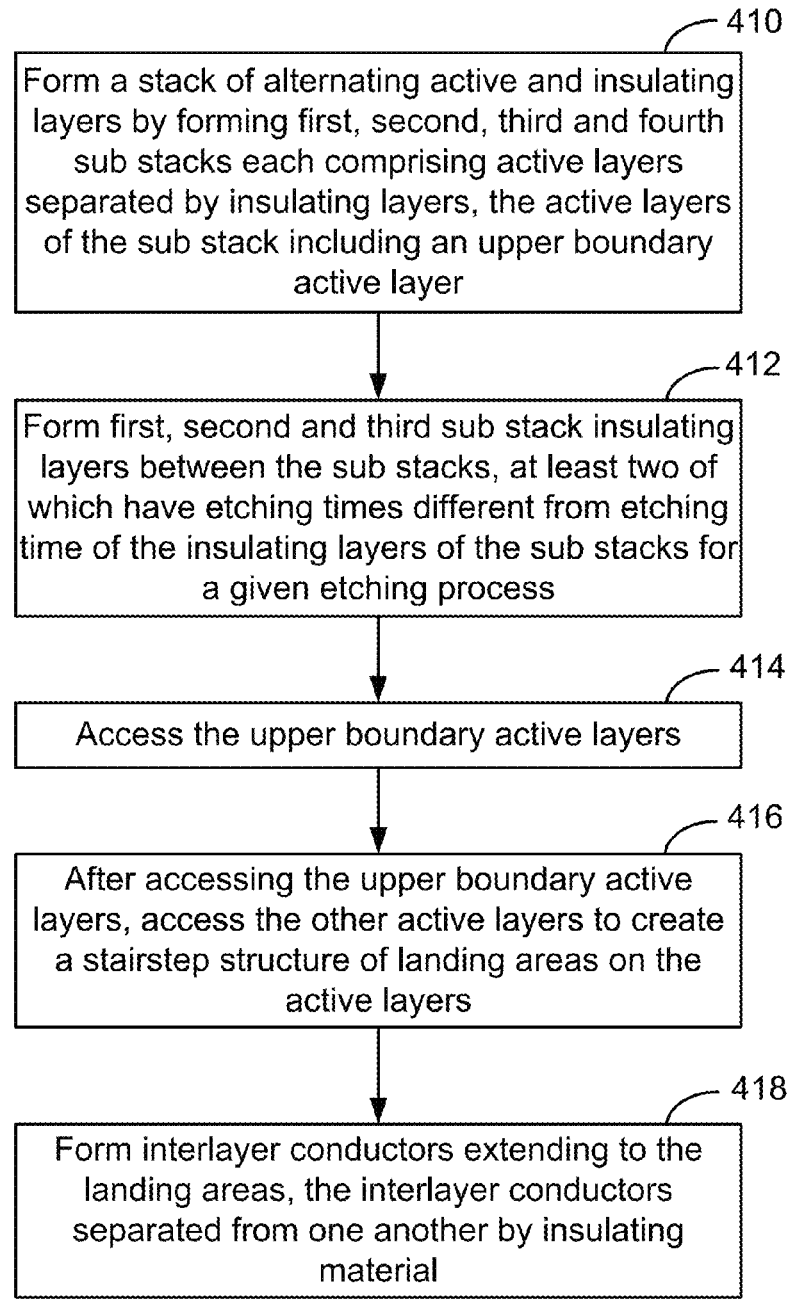
FIG. 46 is a simplified flowchart outlining the steps carrying out the method for forming a contact structure described below with regard to FIGS. 7-25 and FIGS. 26-43.

FIG. 46 is a simplified flowchart outlining the basic steps for carrying out a method for forming a contact structure as described above with regard to FIGS. 7-25 and FIGS. 26-43. In step 410, a stack 200, 380 of alternating active and insulating layers 202 and 204 is formed by forming first, second, third and fourth sub stacks 252 each comprising active layers 202 separated by insulating layers 204. The active layers 202 of each sub stack include an upper boundary active layer 202.1. At step 412, first, second and third sub stack insulating layers 256, 258 and 260 are formed between the sub stacks 252, at least two of which have etching times different from the etching time of the insulating layers 204 of the sub stacks for a given etching process. The upper boundary active layers 202.1 are accessed at step 414. After accessing the upper boundary active layers 202.1, the other active layers 202.2-202.4 are accessed at step 416 to create a stairstep structure such as shown in FIGS. 22 and 42. At step 418, interlayer conductors 272 are formed to extend to the landing areas 310, 358, the interlayer conductors separated from one another by insulating material.

Figure 47:
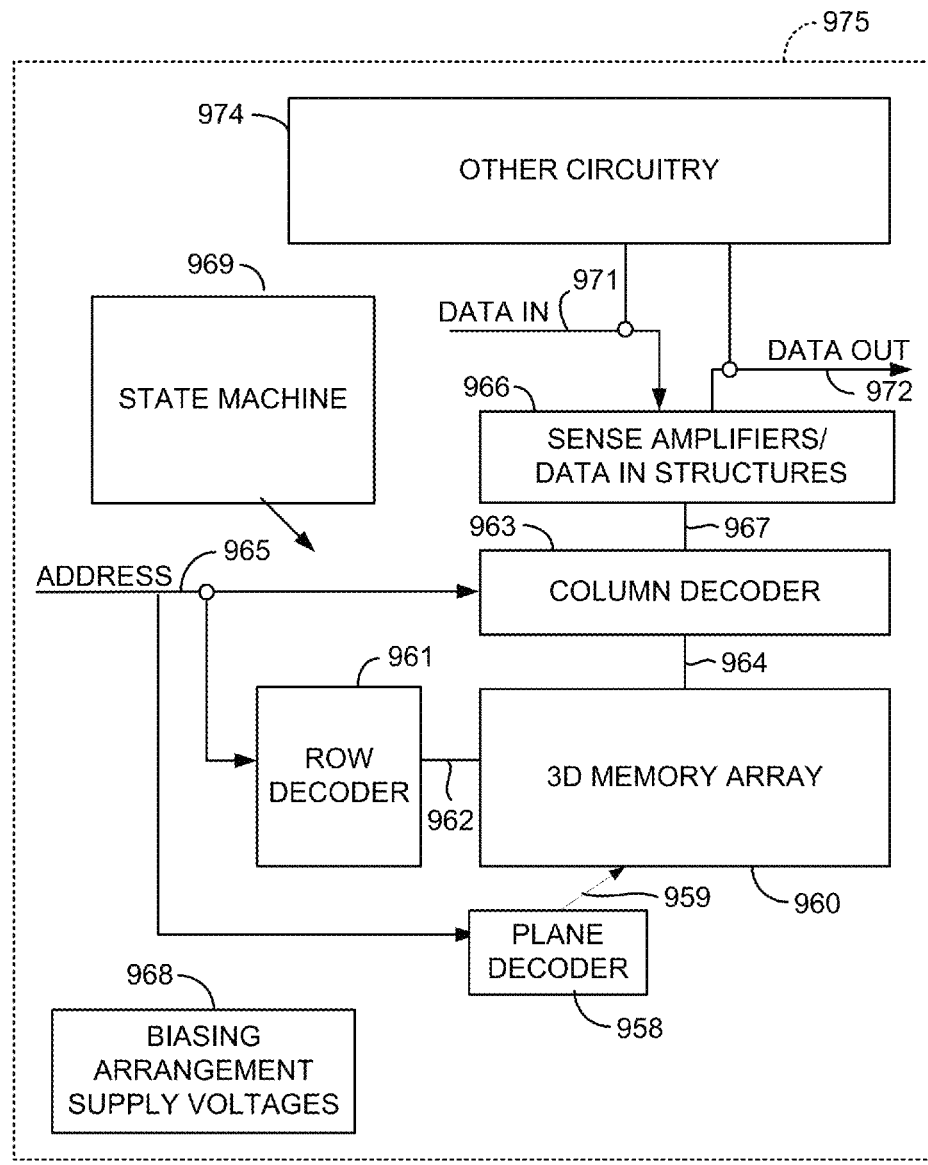
FIG. 47 is a simplified block diagram of an integrated circuit.

FIG. 47 is a simplified block diagram of an integrated circuit. The integrated circuit 975 includes a 3D NAND flash memory array 960, having a structure like that of FIG. 1, for example, on a semiconductor substrate with high density and narrow pitch global bit lines. A row decoder 961 is coupled to a plurality of word lines 962, and arranged along rows in the memory array 960. A column decoder 963 is coupled to a plurality of SSL lines 964 arranged along columns corresponding to stacks in the memory array 960 for reading and programming data from the memory cells in the array 960. A plane decoder 958 is coupled to a plurality of planes in the memory array 960 via bit lines 959. Addresses are supplied on bus 965 to column figures decoder 963, row decoder 961 and plane decoder 958. Sense amplifiers and data-in structures in block 966 are coupled to the column decoder 963, in this example, via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented, in this example, using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

FIGS. 48-63 show a further example of how to form a contact structure, such as one having a stairstep structure of landing areas.

FIGS. 48-51 are provided in to illustrate a common problem with etching through multiple layers due to a lack of uniformity in the layers, or in the etching processes, or both. The lack of uniformity in the layers can be, for example, due to at least one of variations in the thicknesses and in the material composition of the layers.

Figure 48:
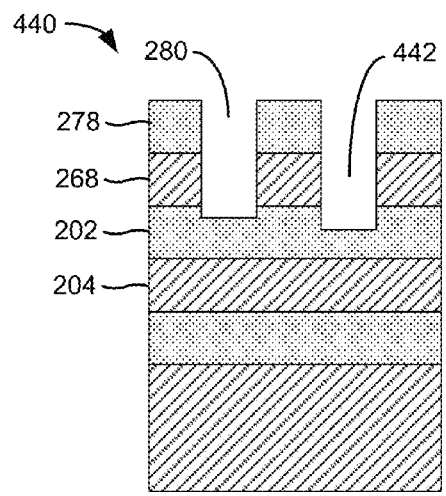
FIGS. 48-63 show a further example of forming a contact structure.

FIG. 48 illustrates a simple example of a stacked device 440 having an upper insulating layer 268 and alternating active and insulating layers 202, 204. An etch mask 278 over the upper insulating layer 268 has etch mask openings 280 through which are formed etched openings 442. FIG. 48 shows how etching through etch mask openings 280 in etch mask 278 can result in etched openings 442 having different depths due to lack of uniformity issues.

Figure 49:
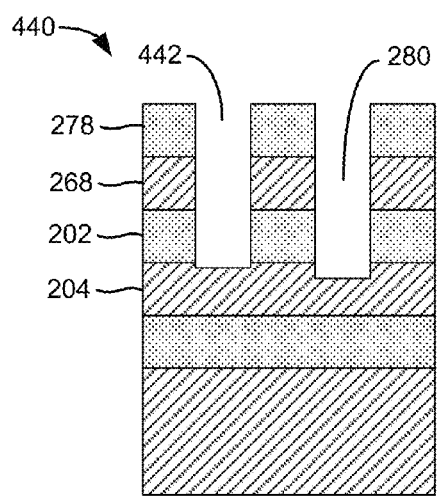

FIG. 49 shows the result of an over etch process on the structure of FIG. 48 so that etched openings 442 pass completely through the active layer 202 but also part way at different depths into the underlying insulating layer 204. When the thicknesses of layers 202, 204 are relatively large, the lack of uniformity in the etching processes and layer thicknesses may have little effect. However, as the thicknesses of the layers is reduced, the processing window is also reduced so that the lack of uniformity in both etching processes and the layers 202, 204 can build up to the point that etched openings 442 do not extend to the proper layer.

Figure 50:
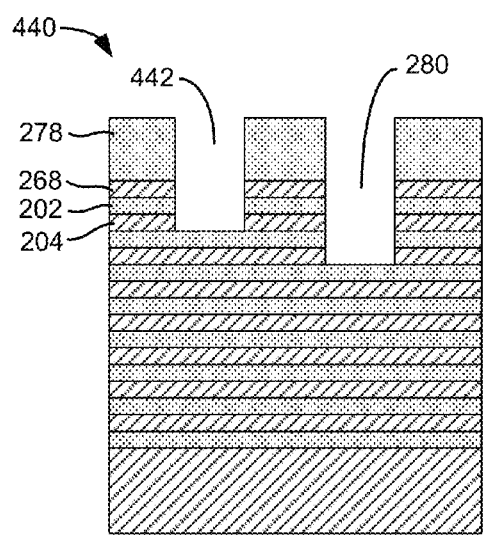

FIG. 50 illustrates an example of a stacked device 440 in which layers 202, 204 are relatively thin. Reducing the thickness of layers 202, 204 is ongoing to increase device density. As the result of a lack of uniformity of one or both of layers 202, 204 and etching processes, etched openings 442 extend to different active layers 202 instead of the same active layer 202 as was desired in this example. That is, while the use of fewer or thicker layers can sometimes accommodate larger tolerances in the etching depth of etched openings 442, the use of many thinner layers often cannot.

Figure 51:
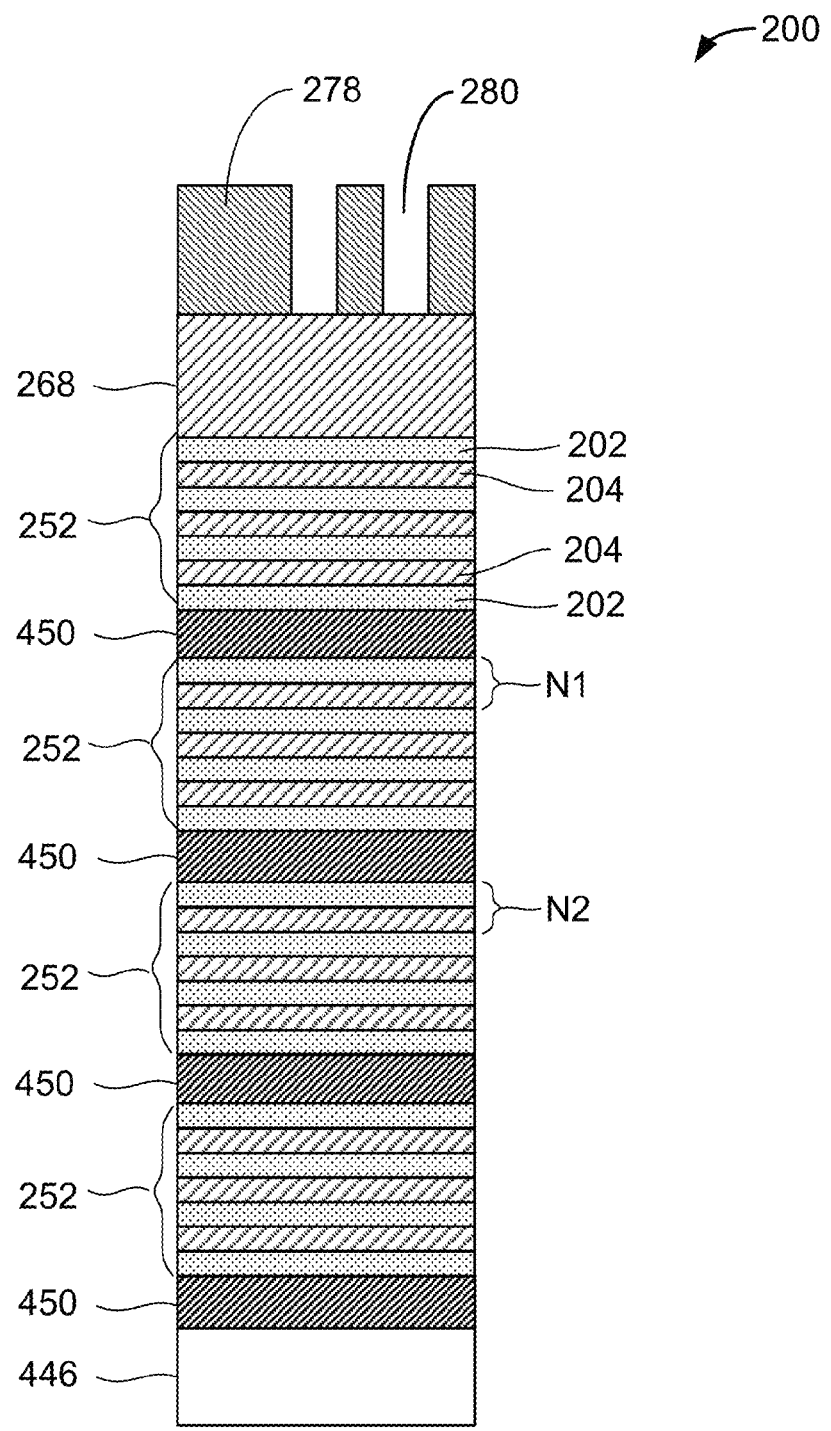

FIG. 51 shows structure similar to that of FIG. 8. Stack 200 is shown extending over a substrate 446 and includes sub stacks 252, 4 in this example, each sub stack having active layers 202 and insulating layers 204 with an etch mask 278 over the upper insulating layer 268 similar to the structure shown in FIG. 8. The uppermost layer of each sub stack 252 is sometimes referred to as the upper boundary layer of the sub stack. Active layers 202 can be made of, for example, conductors or semiconductors. In the example discussed below with regard to FIGS. 51-60, sub stacks 252 begin and end with an active layers 202 separated by insulating layers 204. Sub stacks 252 are separated by buffer layers 450 which, like insulating layers 204, are made of electrically insulating material. In some examples, sub stacks 252 can begin and end with layers of insulating material separated by layers of conductor or semiconductor materials; in such examples, the upper boundary layer would be an insulating layer.

Figure 52:
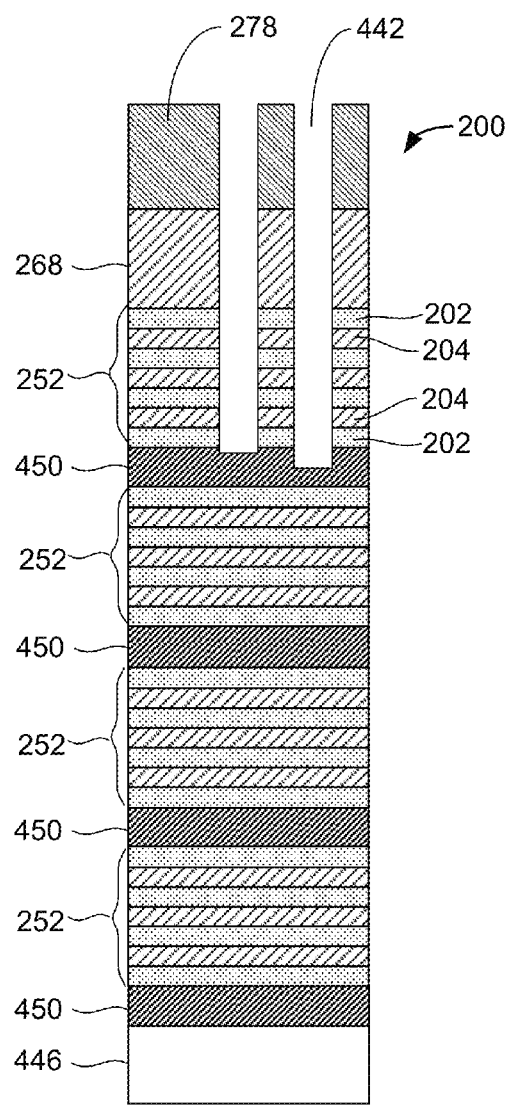

FIG. 52 shows the structure of FIG. 51 after etching through the uppermost sub stack and partially into the uppermost buffer layer 450. The etched openings 442 extend to different depths within buffer layer 450 due to uniformity limitations of the etching process as well as the composition and thickness of buffer layer 450. The structure of FIG. 52 is shown in FIG. 53 after etching through the uppermost buffer layer 450 to create uniform etched surfaces 452 at upper boundary layer 202.

Figure 53:
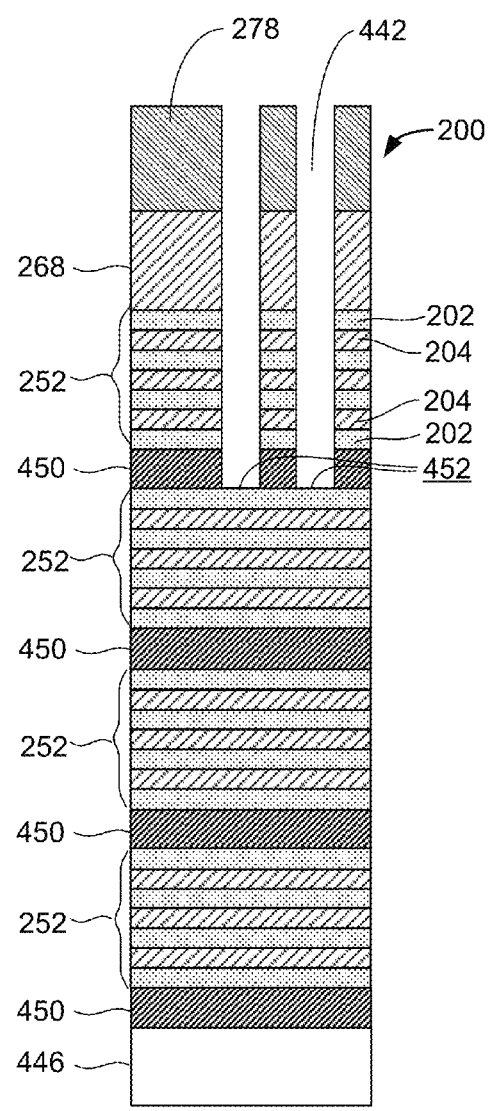
Figure 54:
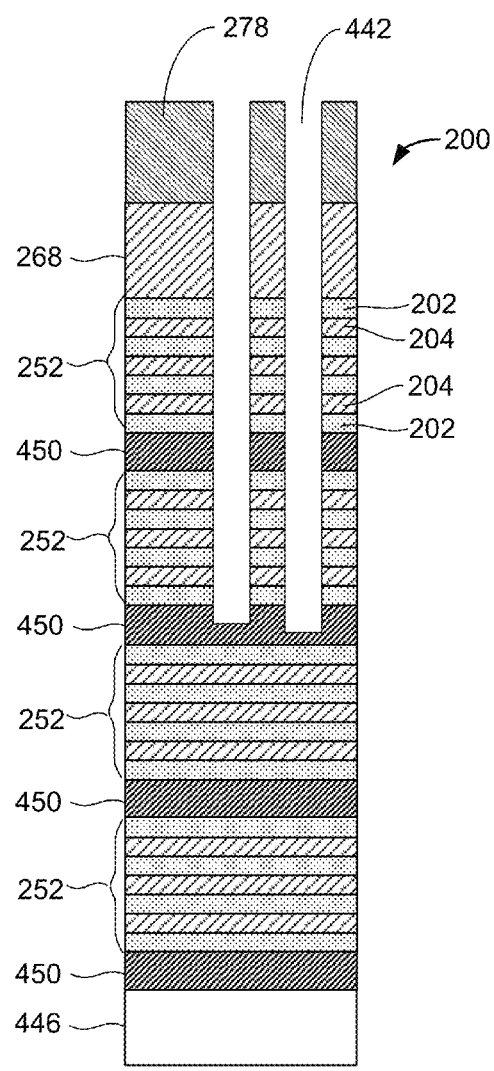
Figure 55:
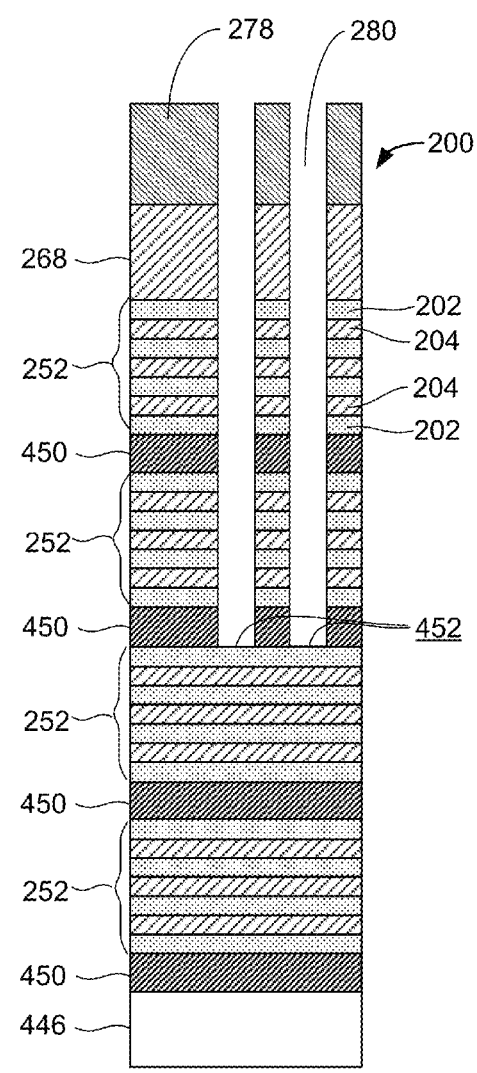
Figures 56, 57:
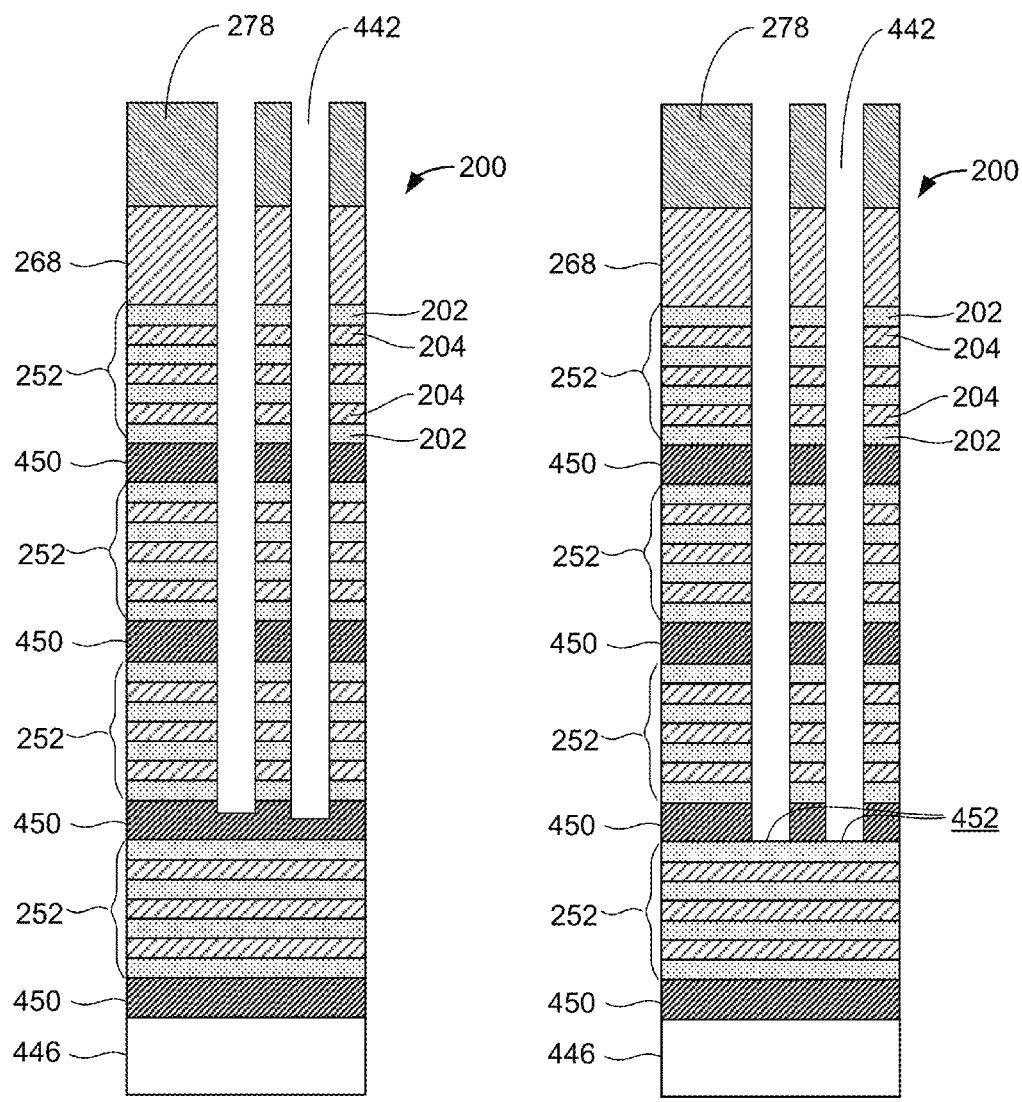
Figure 58:
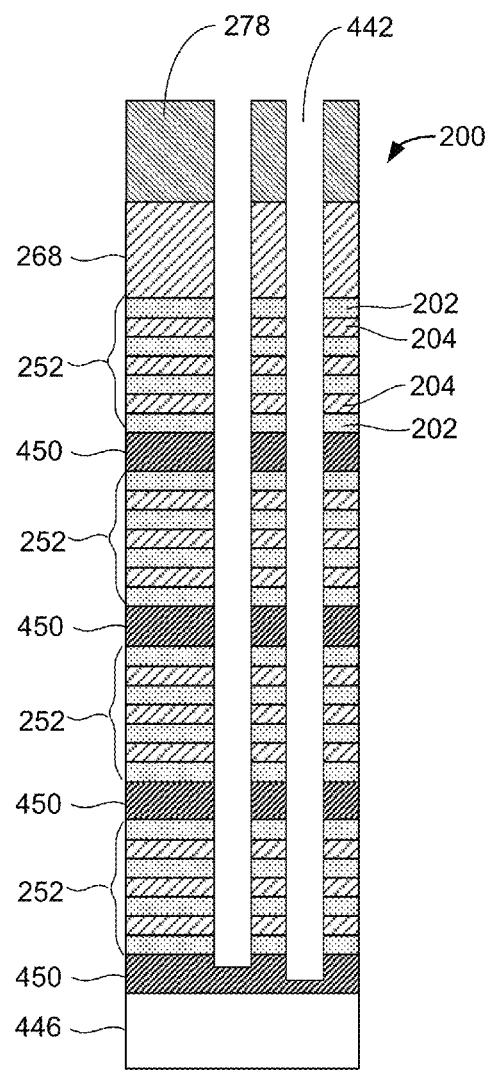
Figure 59:
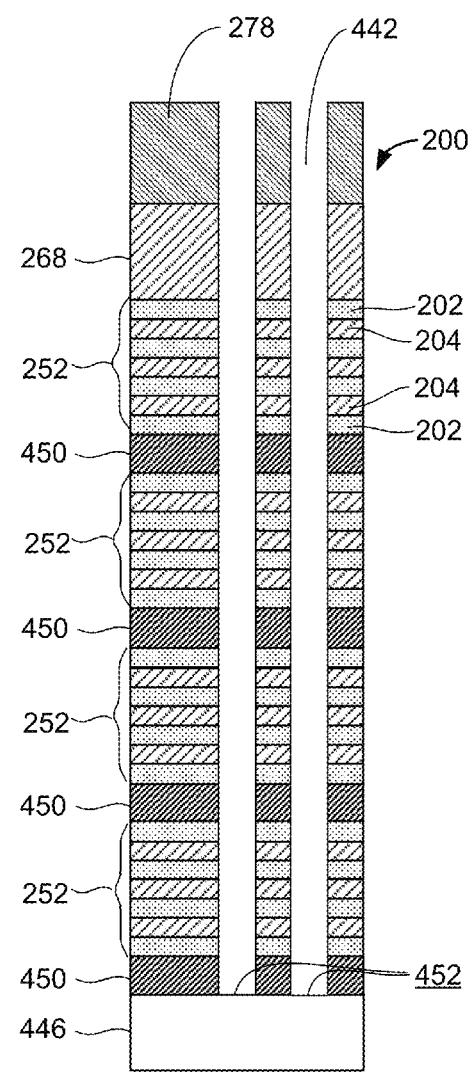

FIG. 54 shows the structure of FIG. 53 after etching through the next sub stack 252 and partially into the next buffer layer 450, similar to the process of FIG. 52. FIG. 55 shows the structure of FIG. 54 after etching through the next buffer layer 450, similar to the process of FIG. 53, creating uniform etched surfaces 452 at upper boundary layer 202. Etching steps similar to those of FIGS. 52 and 53 are followed for FIGS. 56 and 57 and also for FIGS. 58 and 59. As shown in FIG. 59, etched openings 442 extend to substrate 446. By creating uniform etched surfaces 452 at the upper boundary layer 202 for each sub stack 252, the etching depth problems discussed above with regard to FIG. 50 are addressed. That is, differences in the depths of the etched openings 442 created during etching of overlying sub stacks 252 are eliminated while etching through buffer layer 450 to create uniform etched surfaces 452 at upper boundary layer 202.

Figure 60:
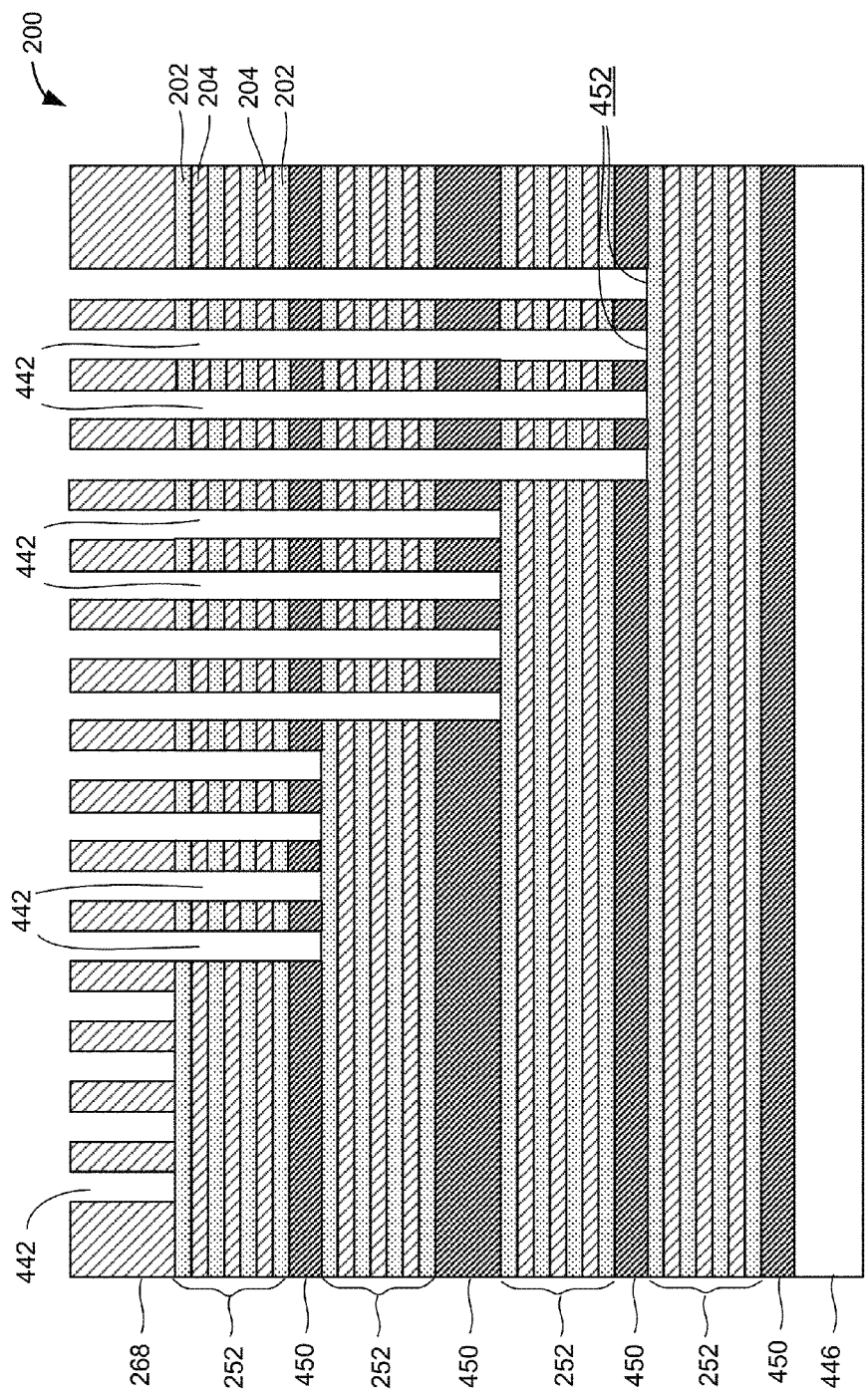

FIG. 60 illustrates a stack 200 similar to that of FIG. 16 in which etched openings 442 have been formed through the stack to the active, upper boundary layer 202 of each sub stack 252, one for each active layer in the sub stack. The active layers 202 of each of the sub stacks 252 are accessed through the etched openings 442 of FIG. 60 to create, for example, a stairstep structure of landing areas on the active layers 202 of the sub stacks 252 such as described in FIGS. 17-25.

Figure 61:
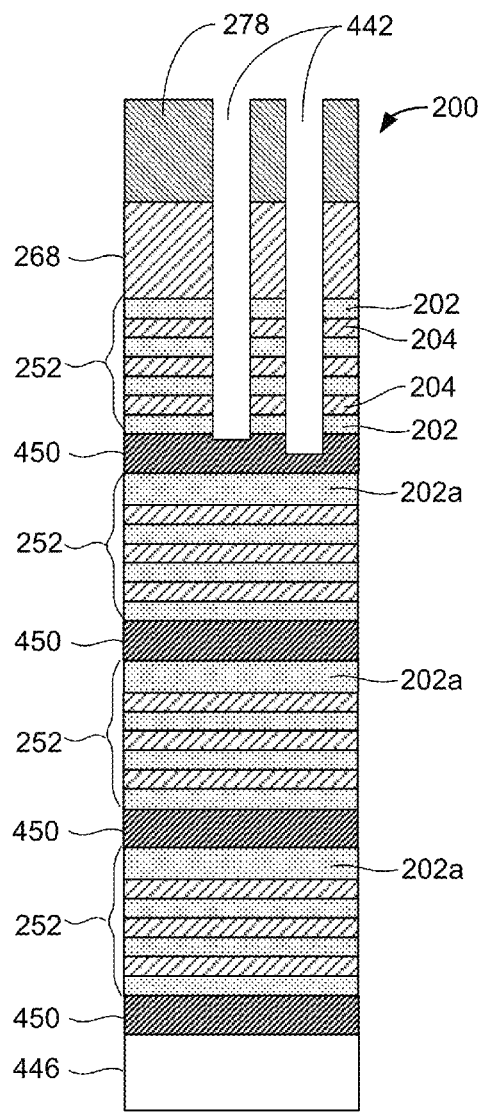

FIG. 61 is a view similar to that of FIG. 52 but in which the upper boundary layer 202a adjacent to the overlying buffer layer 450 is made thicker than in the example of FIG. 52. Doing so enlarges the processing window associated. The etched openings 442 pass through sub stack 252 and part way through buffer layer 450.

Figure 62:
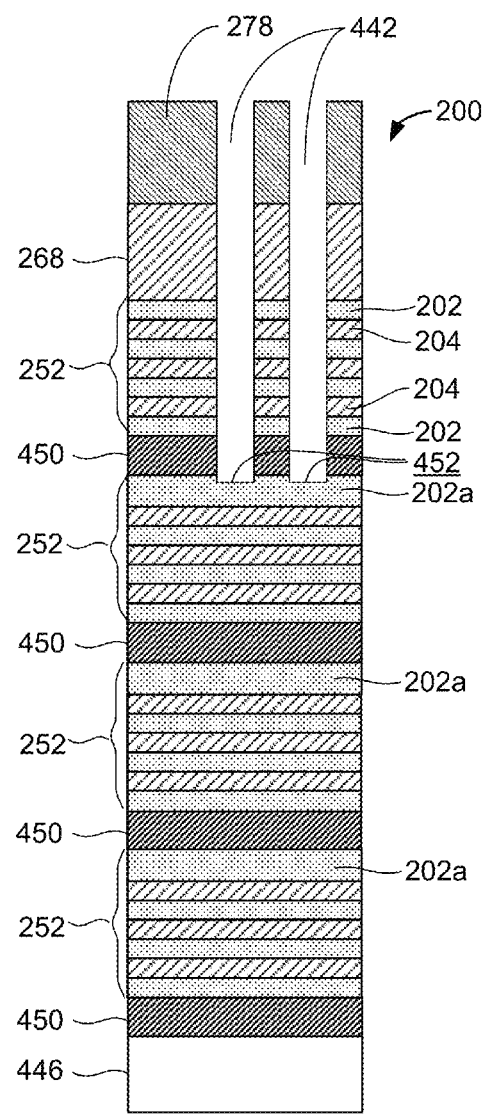

FIG. 62 shows the structure of FIG. 61 after etching through the buffer layer 450 with the etched openings 442 passing completely through the buffer layer 450 and into the increased thickness upper boundary layer 202a. Increasing the thickness of the upper boundary layer 202a is based on the recognition that etching completely through buffer layer 450 will cause, in some situations, the underlying upper boundary layer 202 to be etched even when the etching process chosen is designed to be a selective etch of the material of the buffer layer 450 and to only minimally etch the material of the upper boundary layer 202. In one example of the thickness of upper boundary layer 202a can be about 1.5 times as thick as the thickness of the other active layers 202 of the stack 252. The extra thickness of the upper boundary layer 202 accommodates such over etching thus enlarging the processing window.

Figure 63:
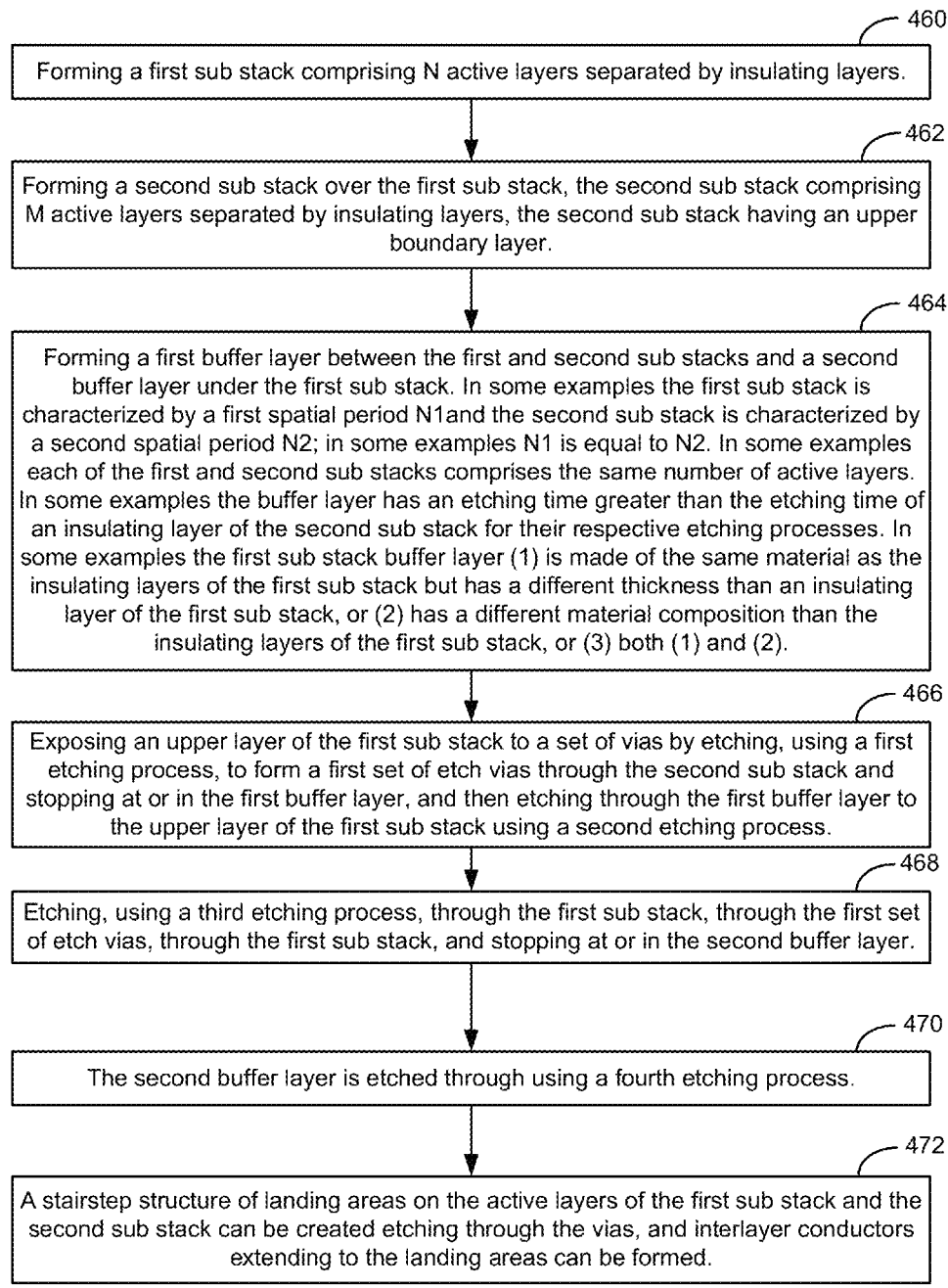

An example of a method for forming a stairstep contact structure can be carried out as follows. A flowchart illustrating both the basic steps and the steps of some other examples are shown in FIG. 63. A stack 200 of alternating active layers 202 and insulating layers 204 can be formed by the following steps.

Step 460: A first sub stack 252 comprising N active layers 202 separated by insulating layers 204 is formed.

Step 462: A second sub stack 252 is formed over the first sub stack, the second sub stack comprising M active layers separated by insulating layers, the second sub stack having an upper boundary layer, the upper boundary layer also being an active layer 202 in the example of FIG. 51.

Step 464: A first buffer layer 450 is formed between the first and second sub stacks and a second buffer layer is formed under the first sub stack. In some examples, the first sub stack is characterized by a first spatial period N1 and the second sub stack is characterized by a second spatial period N2, see FIG. 51; in some examples, N1 is equal to N2. In some examples, each of the first and second sub stacks comprises the same number of active layers. In some examples, the buffer layer has an etching time greater than the etching time of an insulating layer of the second sub stack for their respective etching processes. In some examples, the first sub stack buffer layer (1) is made of the same material as the insulating layers of the first sub stack but has a different thickness than an insulating layer of the first sub stack, or (2) has a different material composition than the insulating layers of the first sub stack, or (3) both (1) and (2). In some examples, the buffer layer has a thickness that is greater, such as at least 1.5 times greater, than the thickness of an active layer in the first sub stack. In some examples, the first and second sub stack forming steps can be carried out so that the upper layer of each is thicker than at least one of the active and insulating layers of the corresponding sub stack.

Step 466: An upper layer of the first sub stack is exposed to a set of vias by etching, using a first etching process, to form a first set of etch vias through the second sub stack and stopping at or in the first buffer layer, see FIG. 52, and then etching through the first buffer layer to the upper layer of the first sub stack using a second etching process; see FIG. 53. In some examples, an etch mask 278 is created over the second sub stack, the etch mask having etch mask openings 280 with the first etching process being carried out through the etch mask openings.

Step 468: The first sub stack is etched through by etching, using a third etching process, through the first set of etch vias, through the first sub stack, and stopping at or in the second buffer layer; see FIG. 54.

Step 470: Then, the second buffer layer is etched through using a fourth etching process as shown in FIG. 55.

Step 472: A stairstep structure of landing areas 310 on the active layers of the first sub stack and the second sub stack can be created etching through the vias, see FIG. 22, and interlayer conductors extending to the landing areas can be formed; see FIG. 25. In some examples, the etching to create a stairstep structure comprises using a single etching process to create landing areas on an integer multiple of N layers, the integer multiple being at least 2.

In various embodiments, a 3D array of devices, for example, memory devices, is provided. The 3D array of devices includes a plurality of patterned layers of semiconductor material. Each patterned layer includes parallel strips of semiconductor material with one of their ends connected to a first side of a semiconductor pad. The semiconductor pads connected to the plurality of patterned layers are disposed in a stack. Each of the semiconductor pads includes a landing area for an interlayer conductor connected to an overlying interconnect conductor aligned along the parallel strips of semiconductor material. The interlayer conductors are arranged in rows in a top view and disposed in a via structure surrounded by an insulating material. Each of the rows is aligned along an X direction, parallel to the first side. In various embodiments, the interlayer conductors can be partially offset in a Y direction, perpendicular to the X direction. In various embodiments, the landing areas can be formed in various types of stair step arrangements, such as illustrated in FIG. 6 and FIG. 43.

The following descriptions are for the structure shown in FIGS. 64-71, which illustrate further examples of stacks of alternating active layers and insulating layers separated by boundary layers forming vertical channel and vertical gate NAND structures.

Figure 64:
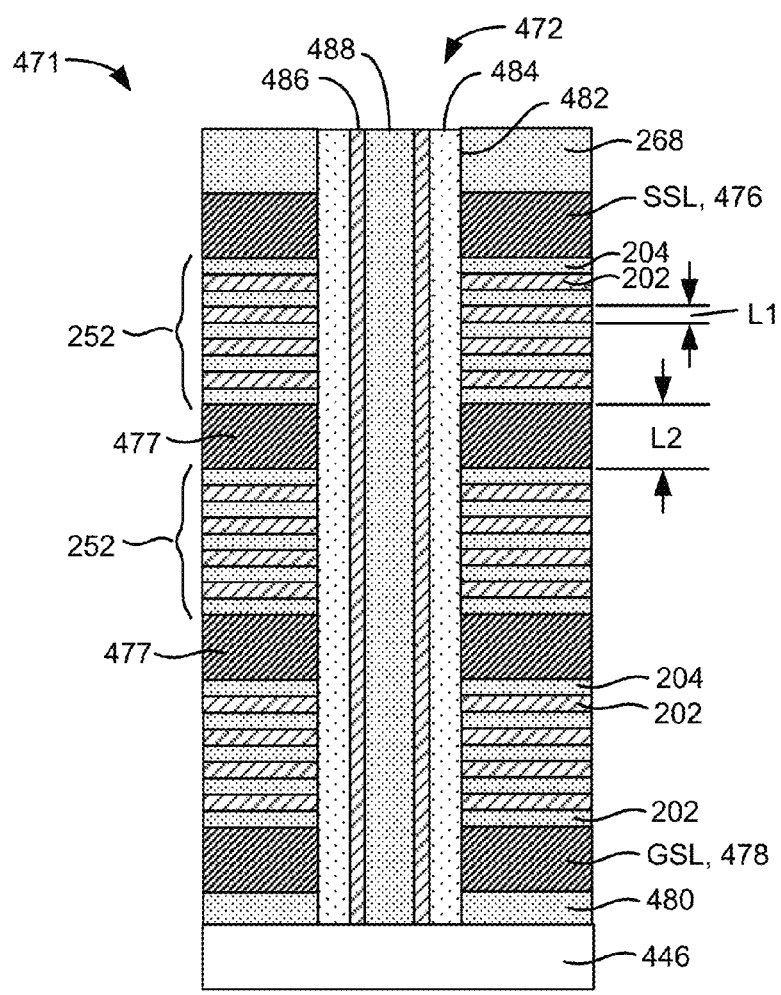
FIG. 64 is a cross-sectional view of a 3-D nonvolatile memory array including a string of vertical channel NAND-connected transistors.
Figure 65:
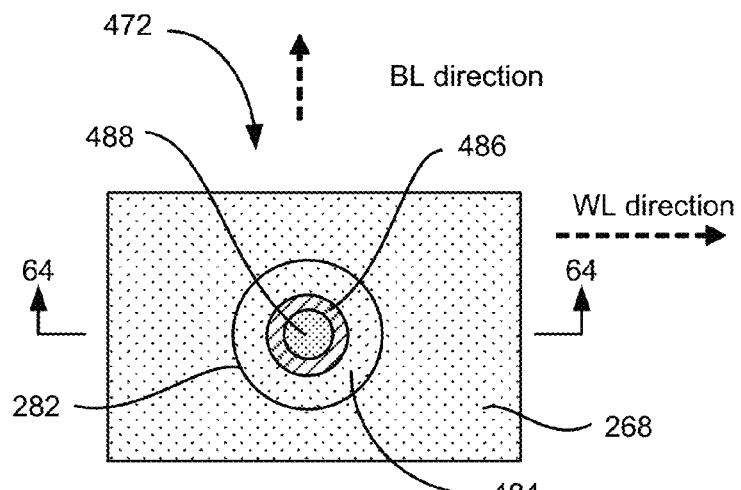
FIG. 65 is a top plan view of the structure of FIG. 64.
Figure 66:
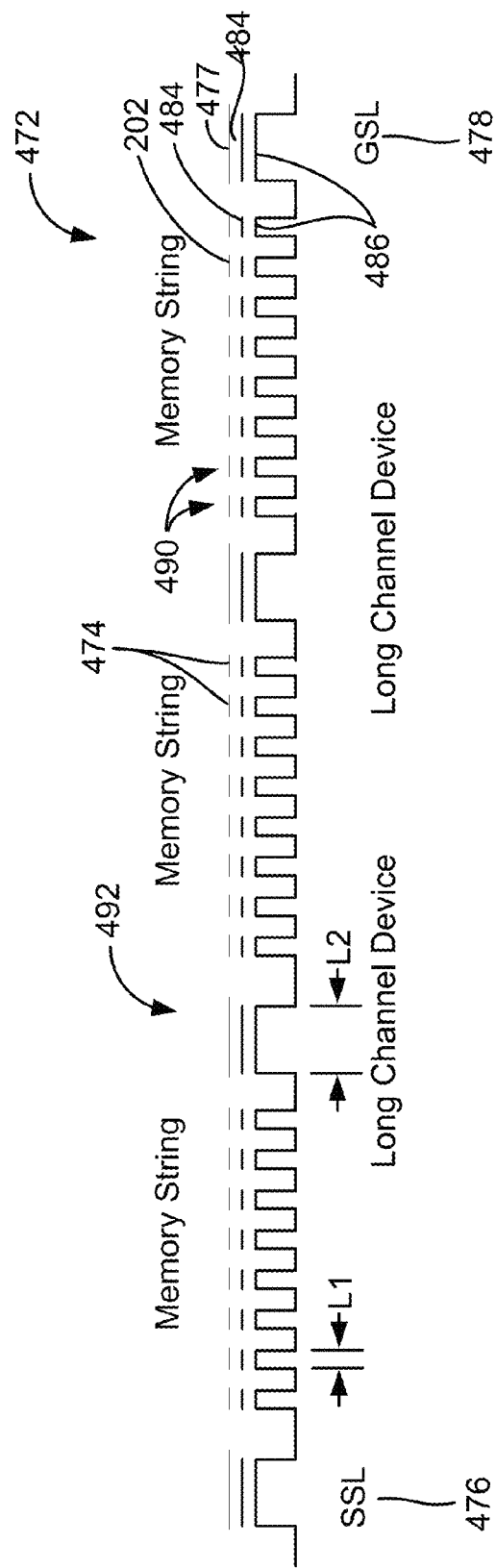
FIG. 66 is a schematic representation of the NAND string shown in FIG. 64.
Figure 67:
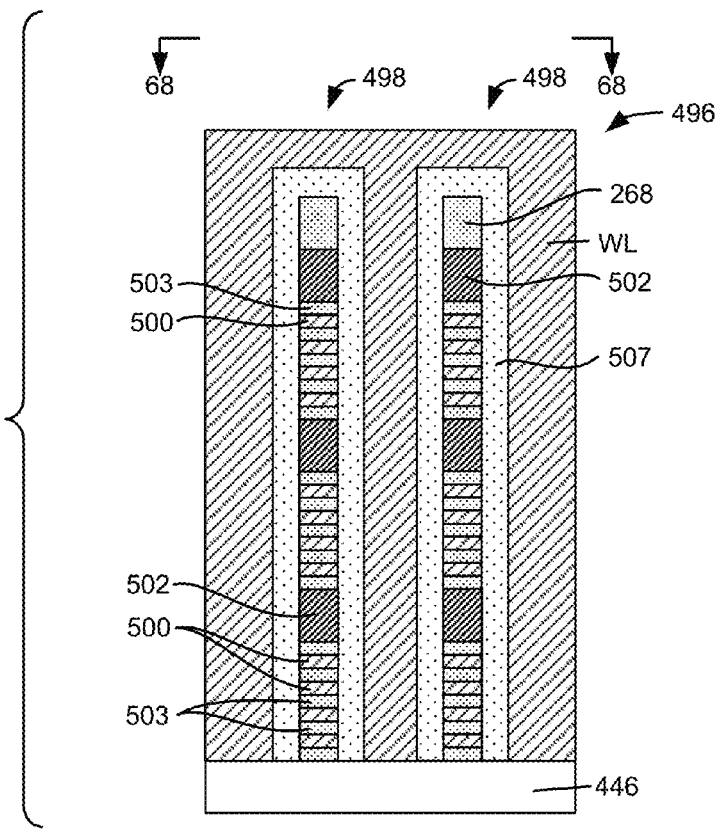
FIG. 67 is a cross-sectional view of a 3-D nonvolatile memory array taken along line 67-67 of FIG. 68, including stacks of alternating semiconductor strips and insulating strips on a substrate with a 3-D array of NAND memory elements established at cross points between surfaces of the stacks and word lines.

FIGS. 64-66 disclose a 3D nonvolatile memory array 471 including a string 472 of vertical channel (VC) NAND-connected transistors 474. The 3D nonvolatile memory array 471 includes an upper insulating layer 268 overlying a string select line (SSL) 476 which overlies three sub stacks 252. In each sub stack 252 of this example, the alternating active layers 202 and insulating layers 204 start and end with an insulating layer 204. Between sub stacks 252 are active buffer layers 477 of an active material, such as a doped semiconductor material, for example, P+Si. Active layers 202, string select lines 476 and buffer layers 477 can be made of the same material. Active buffer layers 477 correspond generally to buffer layers 450 in the earlier examples. Thickness L2 of layer 450 can be more than 1.5 times the thickness L1 of active layers 202. The thickness L2 of layer 450 creates a gate, discussed below, having a length more than 1.5 times the lengths of the gates created by active layers 202 having thickness L1. Between the lowermost sub stack 252 and substrate 446 is a ground select line (GSL) 478 and a lower insulating layer 480.

An opening 482 is formed in the stacked structure shown in FIG. 64, similar to etched openings 442 shown in FIGS. 59-62, and extends to substrate 446. Opening 482 can be made in the manner discussed above with regard to the examples of FIGS. 48-63. Opening 482 is lined with a trapping structure 484, typically including oxide-nitride-oxide layers (ONO) or oxide-nitride-oxide-nitride-oxide layers (ONONO). Trapping structure 484 contacts the edges of each of the upper insulating layer 268, string select line, active and insulating layers 202, 204 of each of the sub stacks 252, active buffer layers 477, ground select line 478 and lower insulating layer 480. Lining trapping structure 484 is a channel layer 486, channel layer 486 being a conductive layer and can be made of a doped semiconductor material such as silicon or polysilicon. Channel layer 486 surrounds an insulating core 488 which can be made of, for example, silicon oxide. Devices 490, see FIG. 66, such as transistors 474 which can act as nonvolatile memory cells, are formed by active layers 202 in contact with trapping structure 484 in contact with channel layer 486. In such examples, active layers 202 act as gates. Devices 490 have a first, shorter gate length L1. Devices 492, sometimes referred to as long channel device 492, are formed at the active buffer layers 477, in contact with trapping structure 484, in contact with channel layer 486. Devices 492 have a second, longer gate length L2. Thickness L1 of active layers 202 can create transistors with a gate length of less than 1 μm and the thickness L2 of buffer layers 450 can create transistors with a gate length greater than 1 μm. The second gate length L2 can be at least 1.5 times the first gate length L1. Circuitry 974, see FIG. 47, controls the NAND-connected string 972, the circuitry applying different pass voltages to the plurality of nonvolatile memory cells 490 and the plurality of transistors 474 with the different gate lengths L1 and L2.

Figure 68:
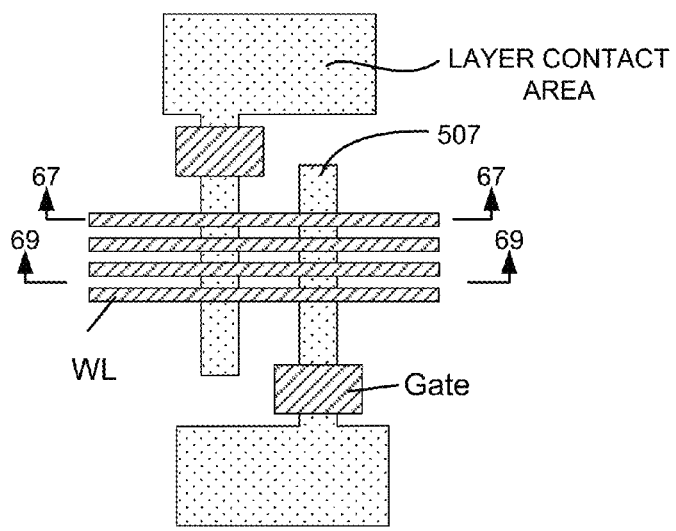
FIG. 68 is a top view of the structure of FIG. 67 illustrating the orientation of the word lines relative to the stacks of alternating semiconductor and insulating strips.
Figure 69:
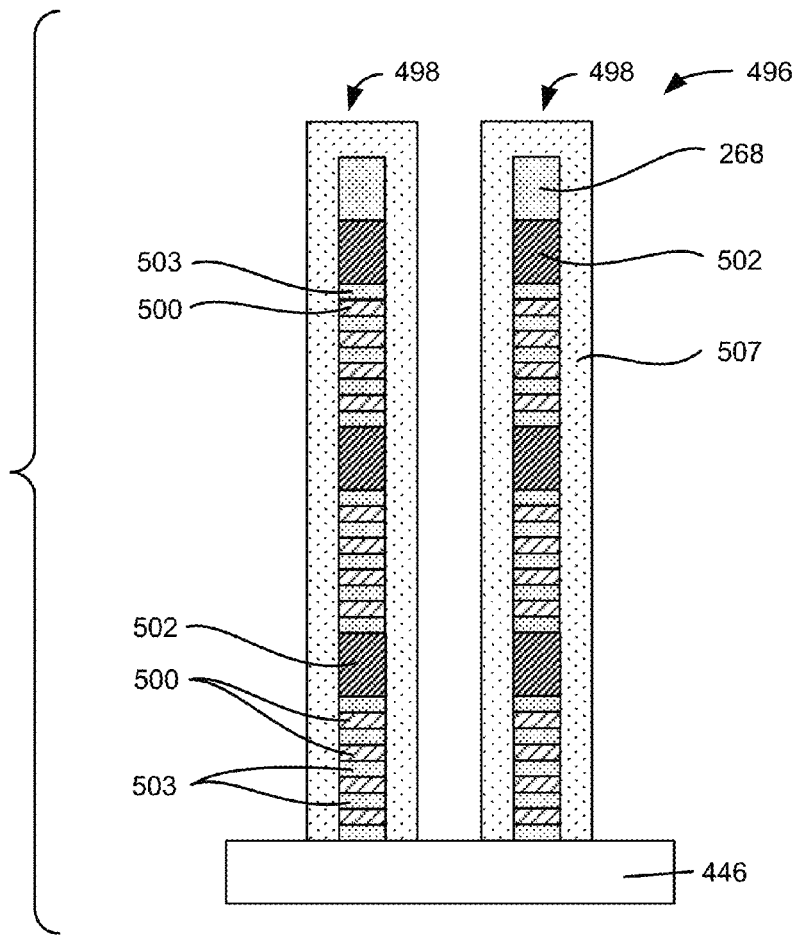
FIG. 69 is a cross-sectional view similar to that of FIG. 67 taken along line 69-69 of FIG. 68.
Figure 70:
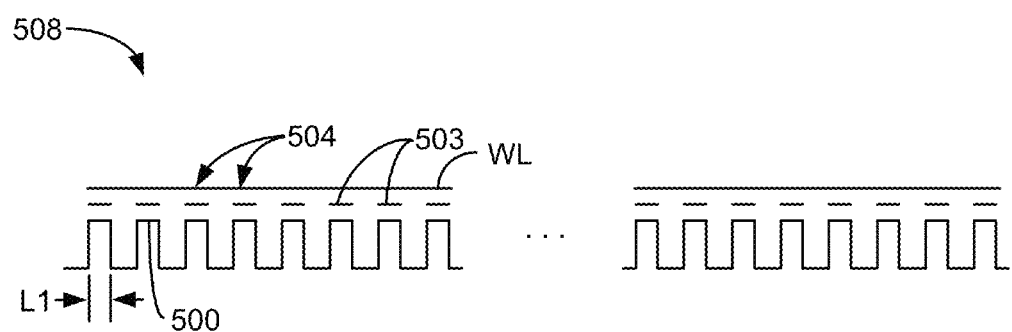
FIG. 70 is a schematic representation of a NAND-connected string of nonvolatile memory cells, taken perpendicular to the plane of FIG. 69, having a first, lesser height created by the structure of FIGS. 67-69.
Figure 71:
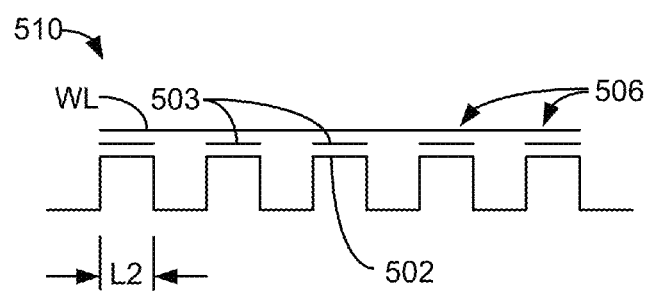
FIG. 71 is a schematic representation of a NAND-connected string of nonvolatile memory cells, taken perpendicular to the plane of FIG. 69, having a second, greater height created by the structure of FIGS. 67-69.

FIGS. 67-71 disclose a 3D nonvolatile memory array 496 including a substrate 446 and a plurality of stacks 498 of semiconductor strips on the substrate 446, the semiconductor strips including first semiconductor strips 500 having a first, lower height L1, and second semiconductor strips 502 having a second, higher height L2. Semiconductor strips 500, 502 are separated by insulating strips 503. The stacks 498 also include an outer trapping structure 503, typically including oxide-nitride-oxide layers (ONO) or oxide-nitride-oxide-nitride-oxide layers (ONONO). The first height and the second height are different; the second height L2 can be at least 1.5 times the first height L1. A plurality of word lines WL, four of which are shown in FIG. 68, are arranged orthogonally over, and have surfaces conformal with, the trapping structure 503 of each of the plurality of stacks 498. FIGS. 70 and 71, taken perpendicular to the plane of FIG. 69, illustrate that a 3D array of NAND memory elements 504, 506 is established at crosspoints between surfaces of the plurality of stacks 498 and the plurality of word lines. This creates a plurality of NAND-connected strings of transistors 504, 506 formed along the semiconductor strips 500, 502 in the plurality of stacks 498. This creates a first NAND-connected string 508 of nonvolatile memory cells 504 having the first height L1, see FIG. 70, and a second NAND-connected string 510 of nonvolatile memory cells 506 having the second height L2, see FIG. 71. In this vertical gate structure, the thicker semiconductor strips 502 can, for example, provide enlarged process window so that devices 504 can be used as memory cells while devices 506 can be used as error correction code memory.

The different first height L1 and the second height L2 results in a first set of electrical characteristics for the first NAND-connected strings 508 in the first semiconductor strips 500 having the first height, and a second set of electrical characteristics for the second NAND-connected strings 510 in the second semiconductor strips 502 having the second height L2. The different electrical characteristics can include: threshold voltage (Vt) and drain to source current (Ids). These different first and second sets of electrical characteristics result from the different heights of the semiconductor strips, which changes the volume of the active strip of each transistor. FIG. 47 shows an integrated circuit 975 including first and second sense amplifiers 966. Circuitry 974 is used to control the first sense amplifier to take electrical measurements of transistors in the first NAND-connected strings 508 in the first semiconductor strips 500 according to the first set of electrical characteristics and the second sense amplifier to take electrical measurements of transistors in the second NAND-connected strings 510 in the second semiconductor strips 502 according to the second set of electrical characteristics. In some examples, circuitry 974 can perform memory operations on the plurality of first NAND-connected strings of transistors 508 to store data on the first NAND-connected string 508, and use the second NAND-connected string 510 to correct errors in the data stored on the first NAND-connected string 508.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A circuit, comprising:
   a substrate; and
   a NAND-connected string of transistors on the substrate, including:
   a plurality of first nonvolatile memory cells having a first gate length; and
   a plurality of second nonvolatile memory cells having a second gate length greater than the first gate length,
   wherein the NAND-connected string has an electrical channel through the transistors of the NAND-connected string, the electrical channel having a direction perpendicular to a surface of the substrate.

2. The circuit of claim 1, further comprising:
   circuitry controlling the NAND-connected string, the circuitry configured to apply different pass voltages to the plurality of first nonvolatile memory cells and the plurality of second nonvolatile memory cells.

3. The circuit of claim 1, further comprising:
   circuitry controlling the NAND-connected string, wherein the first gate length is less than 1 micron and the second gate length is greater than 1 micron.

4. The circuit of claim 1, wherein the NAND-connected string comprises a GSL transistor and an SSL transistor.

5. The circuit of claim 1, wherein the NAND-connected string of transistors comprises stacks of the transistors, one of said stacks including a plurality of substrings, each of the substrings including multiple ones of the first plurality of nonvolatile memory cells connected in series, different ones of the substrings connected in series by at least one second nonvolatile memory cell of said plurality of second nonvolatile memory cells.

6. The circuit of claim 5, wherein each stack has the same number of first nonvolatile memory cells.

7. The circuit of claim 5, wherein the NAND-connected string of transistors comprises a GSL transistor and an SSL transistor.

8. The circuit of claim 1, wherein the second nonvolatile memory cells comprise an active buffer layer surrounding a trapping structure layer, the trapping structure layer surrounding a channel layer, the channel layer surrounding an insulating core.

9. A circuit, comprising:
   a substrate; and
   a NAND-connected string of transistors on the substrate, including:
      a plurality of nonvolatile memory cells having a first gate length; and
      a plurality of transistors having a second gate length greater than the first gate length;
   wherein the NAND-connected string has an electrical channel through the transistors of the NAND-connected string, the electrical channel having a direction perpendicular to a surface of the substrate.

10. The circuit of claim 9, further comprising:
   circuitry controlling the NAND-connected string, the circuitry configured to apply different pass voltages to the plurality of nonvolatile memory cells and the plurality of transistors.

11. The circuit of claim 9, further comprising:
   circuitry controlling the NAND-connected string, wherein the first gate length is less than 1 micron and the second gate length is greater than 1 micron.

12. The circuit of claim 9, wherein the NAND-connected string comprises a GSL transistor and an SSL transistor.

13. The circuit of claim 12, wherein the GSL transistor and the SSL transistor each have a gate length greater than said first gate length.

14. The circuit of claim 12, wherein the GSL transistor and the SSL transistor each have a gate length equal to the second gate length.

15. The circuit of claim 9, wherein the NAND-connected string of transistors comprises stacks of the transistors, one of said stacks including a plurality of substrings, each of the substrings including multiple ones of the plurality of nonvolatile memory cells connected in series, different ones of the substrings connected in series by at least one of said plurality of transistors.

16. The circuit of claim 15, wherein each stack has the same number of nonvolatile memory cells.

17. The circuit of claim 15, wherein the NAND-connected string of transistors comprises a GSL transistor and an SSL transistor.

18. The circuit of claim 9, wherein the transistors comprise an active buffer layer surrounding a trapping structure layer, the trapping structure layer surrounding a channel layer, the channel layer surrounding an insulating core.

* * * * *